(12) United States Patent
Kurokawa et al.

(10) Patent No.: US 9,311,953 B2
(45) Date of Patent: Apr. 12, 2016

(54) RECORDING LAYER, INFORMATION RECORDING MEDIUM, AND TARGET

(71) Applicant: Sony Corporation, Tokyo (JP)

(72) Inventors: Kotaro Kurokawa, Kanagawa (JP); Yo Ota, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/403,060

(22) PCT Filed: Jun. 3, 2013

(86) PCT No.: PCT/JP2013/003487
§ 371 (c)(1),
(2) Date: Nov. 21, 2014

(87) PCT Pub. No.: WO2013/183277
PCT Pub. Date: Dec. 12, 2013

(65) Prior Publication Data
US 2015/0132606 A1    May 14, 2015

(30) Foreign Application Priority Data

Jun. 4, 2012    (JP) .................................. 2012-126716
Jan. 9, 2013    (JP) .................................. 2013-001964

(51) Int. Cl.
*G11B 7/24*    (2013.01)
*G11B 7/24038*    (2013.01)
(Continued)

(52) U.S. Cl.
CPC ............ *G11B 7/24038* (2013.01); *C01G 19/00* (2013.01); *C01G 25/00* (2013.01); *C01G 25/02* (2013.01); *C01G 41/00* (2013.01); *C01G 45/006* (2013.01); *C01G 45/02* (2013.01); *C01G 55/002* (2013.01); *C23C 14/08* (2013.01); *C23C 14/3407* (2013.01); *C23C 14/3414* (2013.01); *C23C 14/3464* (2013.01); *C23C 14/3492* (2013.01); *G11B 7/243* (2013.01); *G11B 7/254* (2013.01); *G11B 7/257* (2013.01); *G11B 7/266* (2013.01); *C01P 2006/60* (2013.01); *G11B 2007/2432* (2013.01); *G11B 2007/24304* (2013.01); *G11B 2007/24306* (2013.01);
(Continued)

(58) Field of Classification Search
CPC ...... Y10T 428/21; G11B 7/243; G11B 7/266; G11B 2007/2432; G11B 2007/24304
See application file for complete search history.

(56) References Cited

U.S. PATENT DOCUMENTS 6,700,852 B1    3/2004    Yamamoto et al.
2004/0265532 A1    12/2004    Sasa et al.
(Continued)

FOREIGN PATENT DOCUMENTS

JP    2000-343820    12/2000
JP    2005-056545    3/2005
(Continued)

OTHER PUBLICATIONS

International Search report issued in connection with International Patent Application No. PCT/JP2013/003487, dated Jul. 30, 2013. (4 pages).

*Primary Examiner* — Elizabeth Mulvaney
(74) *Attorney, Agent, or Firm* — Hazuki International, LLC

(57) ABSTRACT

The present invention relates to an information recording medium that has good enough recording characteristics even without containing Pd. The information recording medium has a recording layer including an oxide of Mn in which Mn atoms are partially or fully present as Mn with a valence of +4.

27 Claims, 36 Drawing Sheets

(51) Int. Cl.

| | |
|---|---|
| *G11B 7/243* | (2013.01) |
| *G11B 7/257* | (2013.01) |
| *C23C 14/08* | (2006.01) |
| *C23C 14/34* | (2006.01) |
| *C01G 45/02* | (2006.01) |
| *G11B 7/254* | (2013.01) |
| *G11B 7/26* | (2006.01) |
| *C01G 19/00* | (2006.01) |
| *C01G 25/00* | (2006.01) |
| *C01G 25/02* | (2006.01) |
| *C01G 41/00* | (2006.01) |
| *C01G 45/00* | (2006.01) |
| *C01G 55/00* | (2006.01) |

(52) U.S. Cl.
CPC ............... *G11B2007/24326* (2013.01); *G11B 2007/25705* (2013.01)

(56) References Cited

U.S. PATENT DOCUMENTS

| | | |
|---|---|---|
| 2005/0014097 A1 | 1/2005 | Tailhades et al. |
| 2005/0019695 A1 | 1/2005 | Kojima et al. |
| 2009/0042046 A1* | 2/2009 | Sakaue et al. ................. 428/469 |

FOREIGN PATENT DOCUMENTS

| | | |
|---|---|---|
| JP | 2005-108396 | 4/2005 |
| JP | 2005-509540 | 4/2005 |
| JP | 2007-073154 | 3/2007 |
| JP | 2009-217862 | 9/2009 |
| JP | 2011-062981 | 3/2011 |
| JP | 2012-139876 | 7/2012 |
| JP | 2012-250372 | 12/2012 |
| WO | 2009/066698 | 5/2009 |

* cited by examiner

FIG. 1
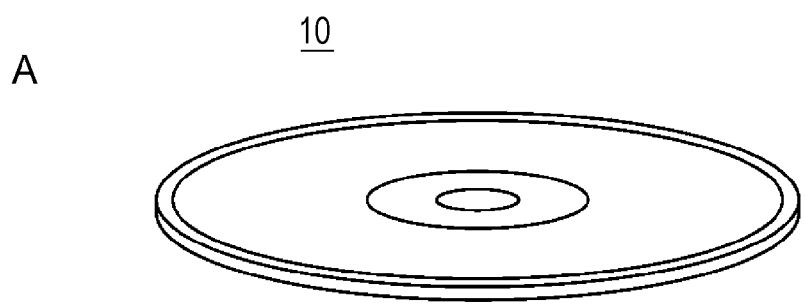
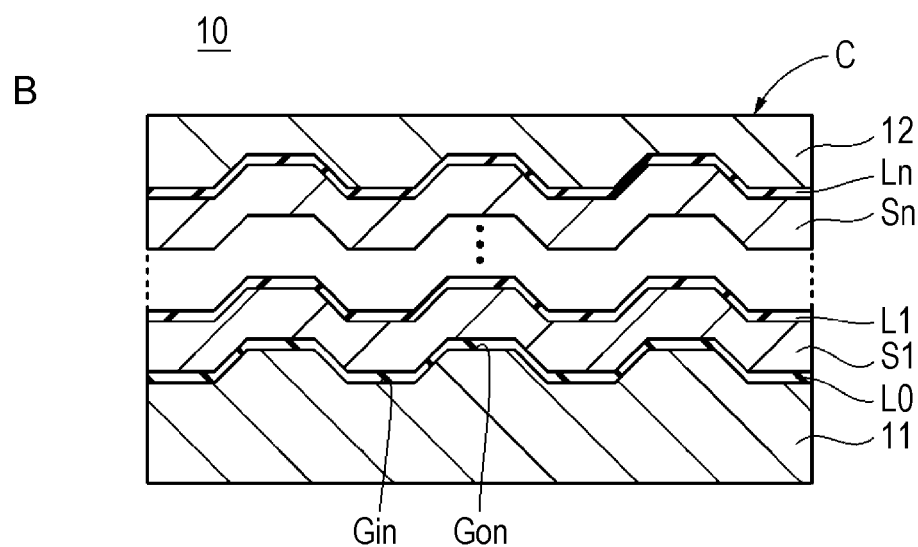

FIG. 2
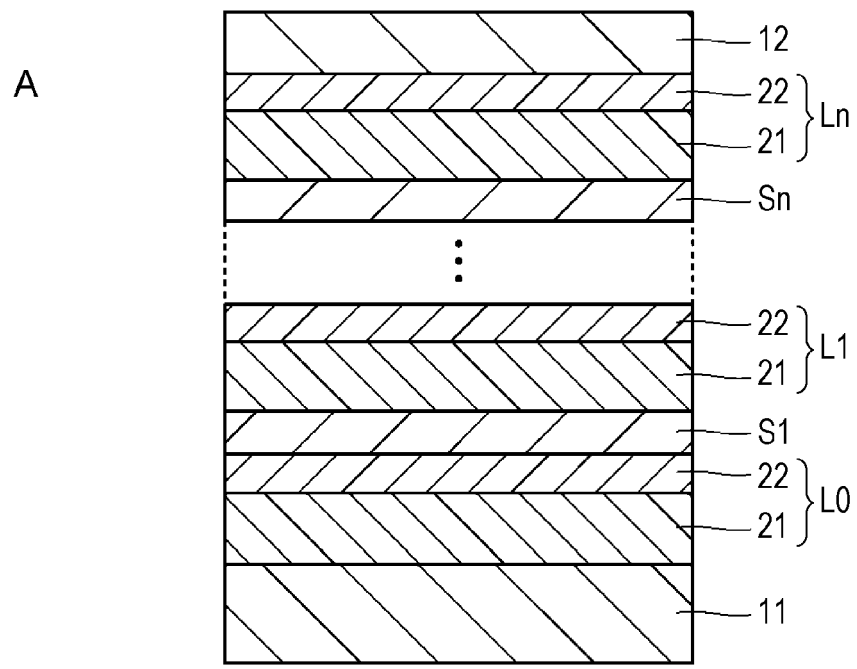
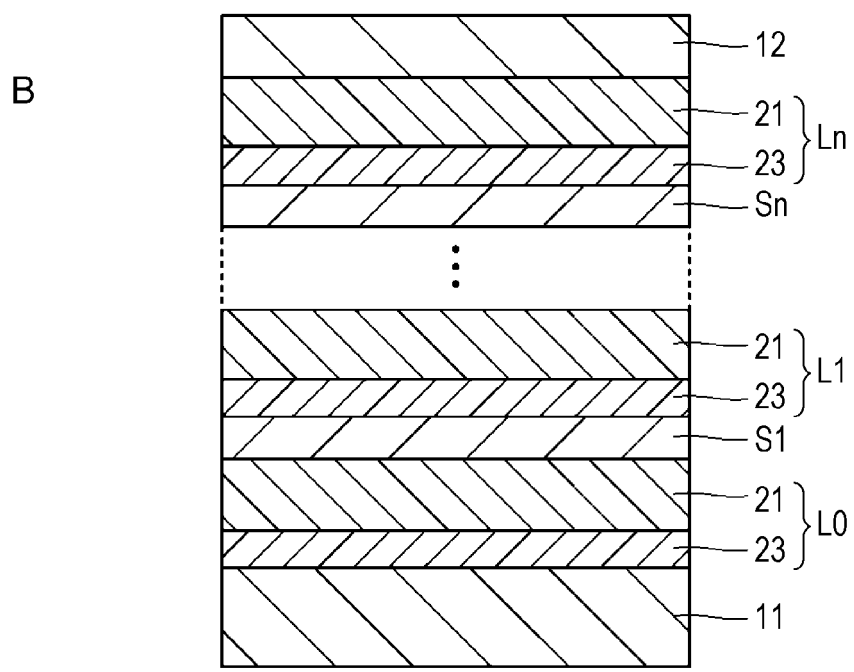

FIG. 3
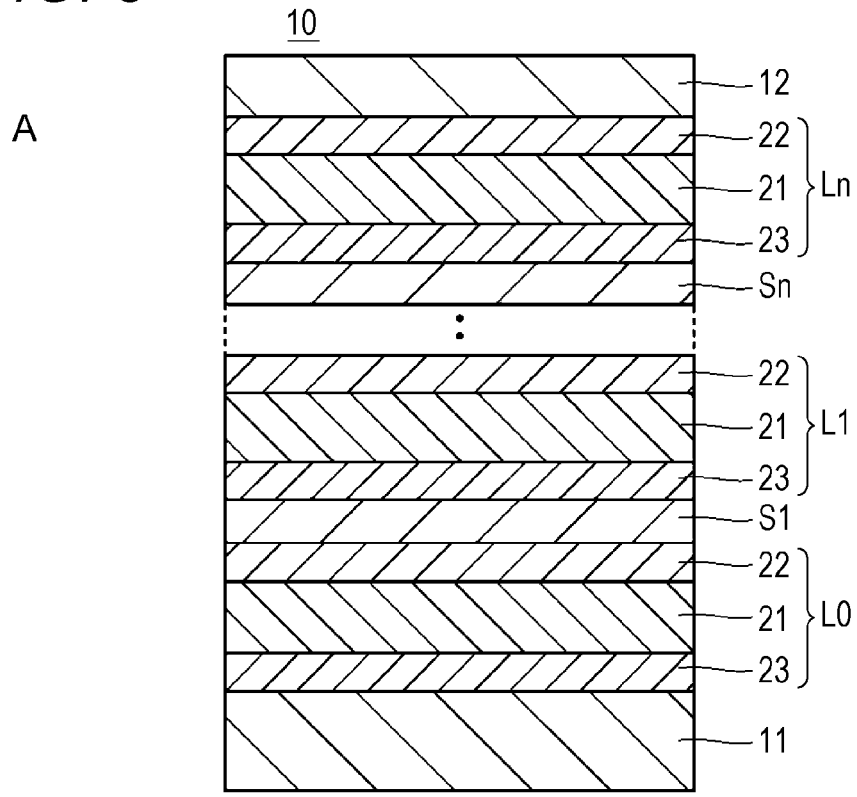
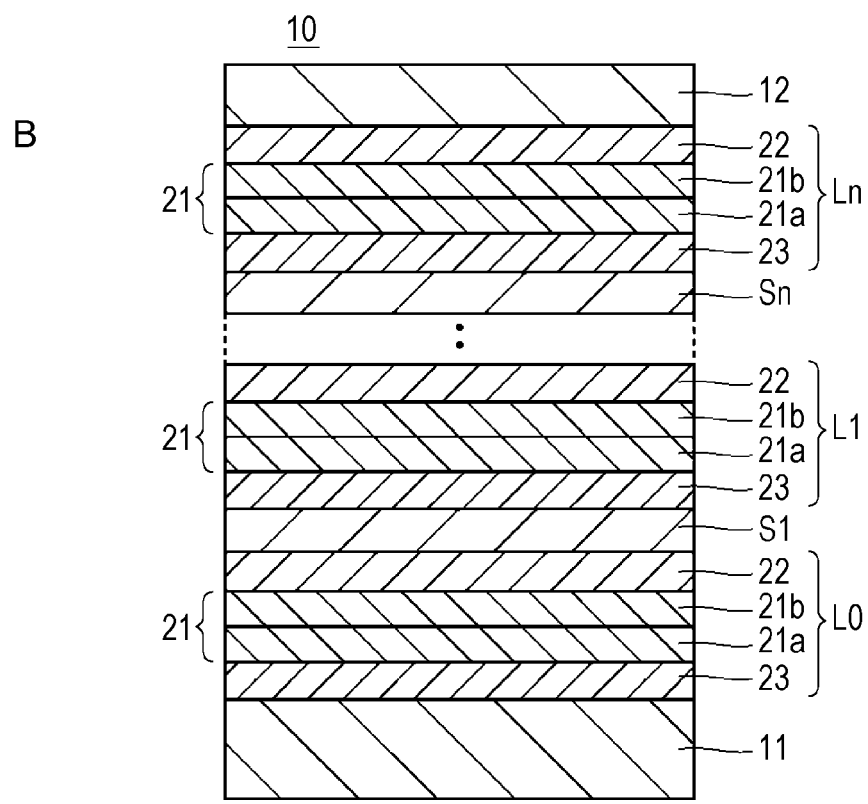

FIG. 6
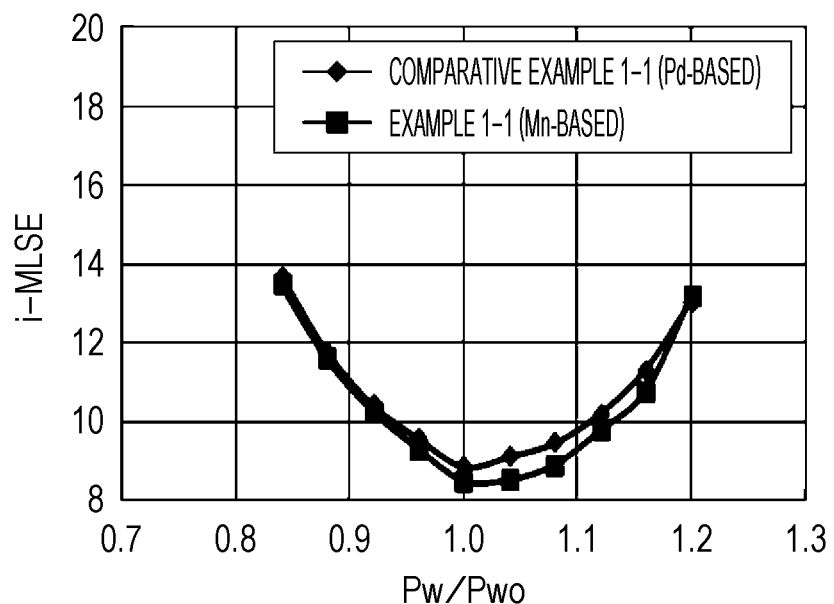
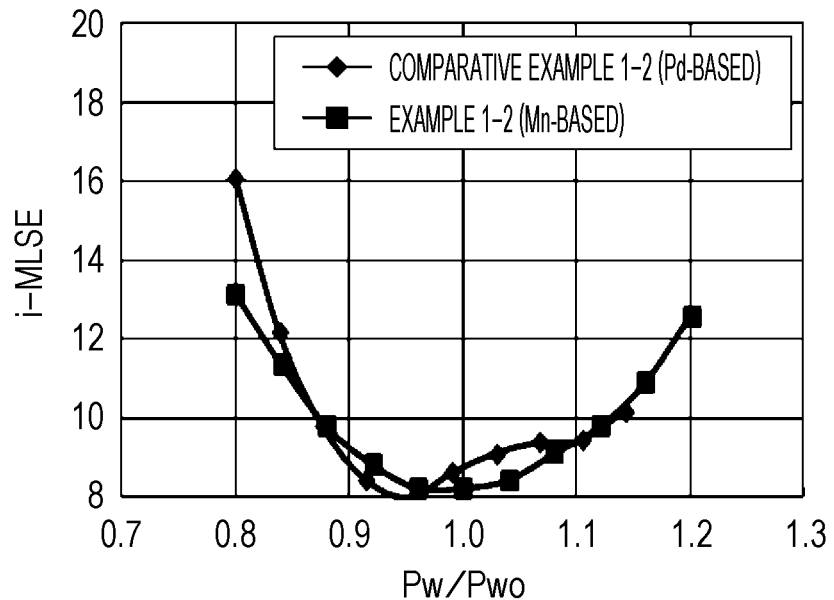

FIG. 7
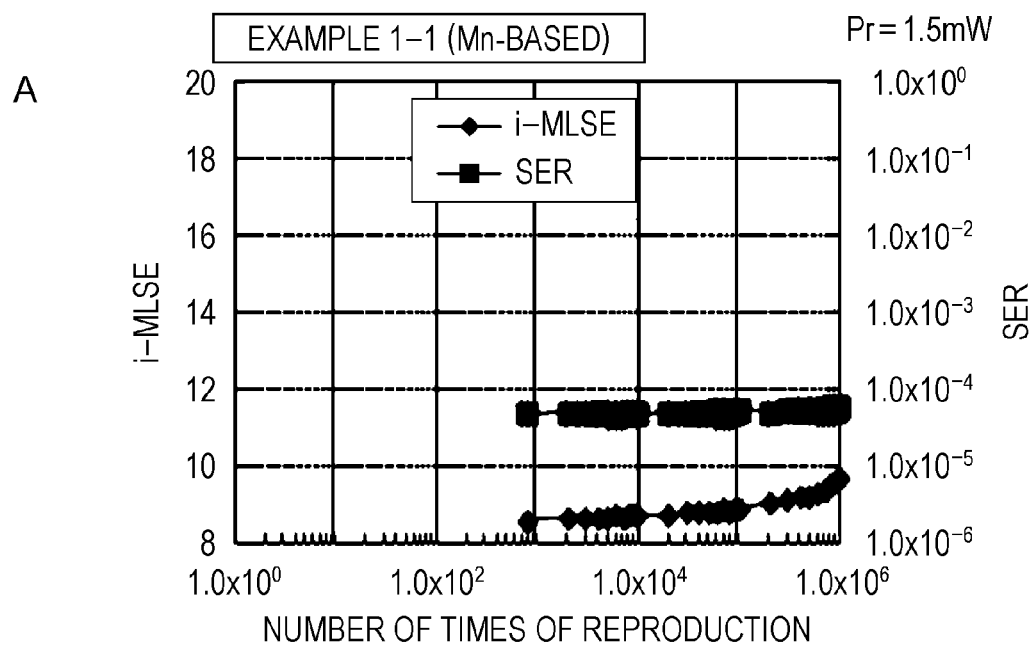
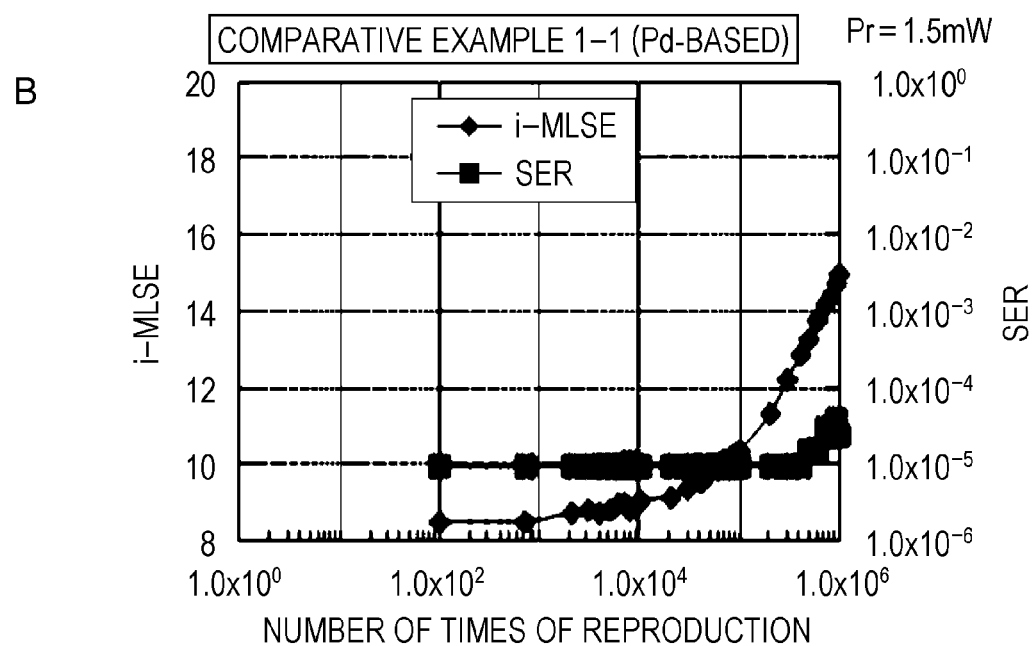

FIG. 8
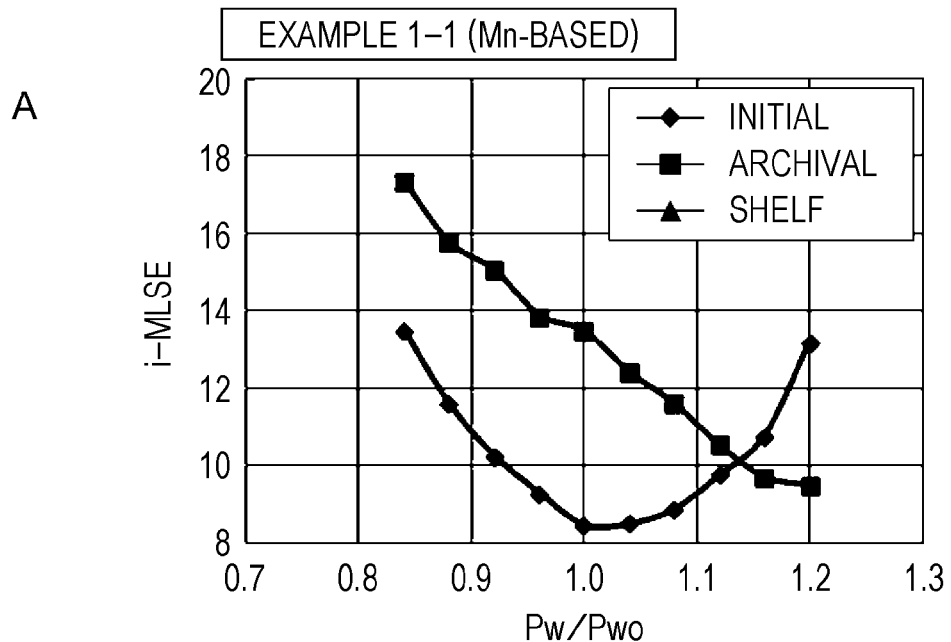
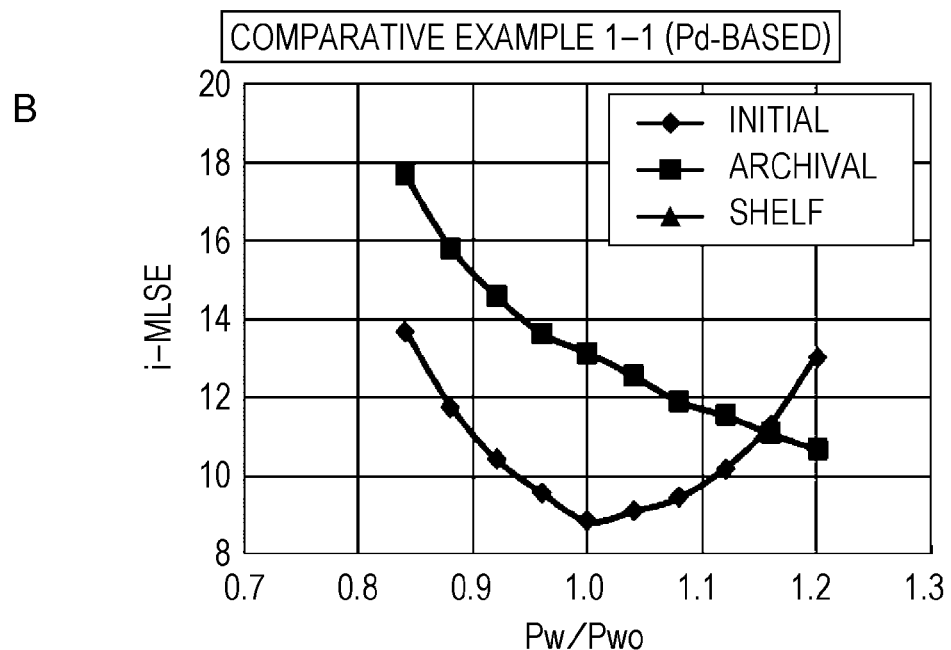

FIG. 9
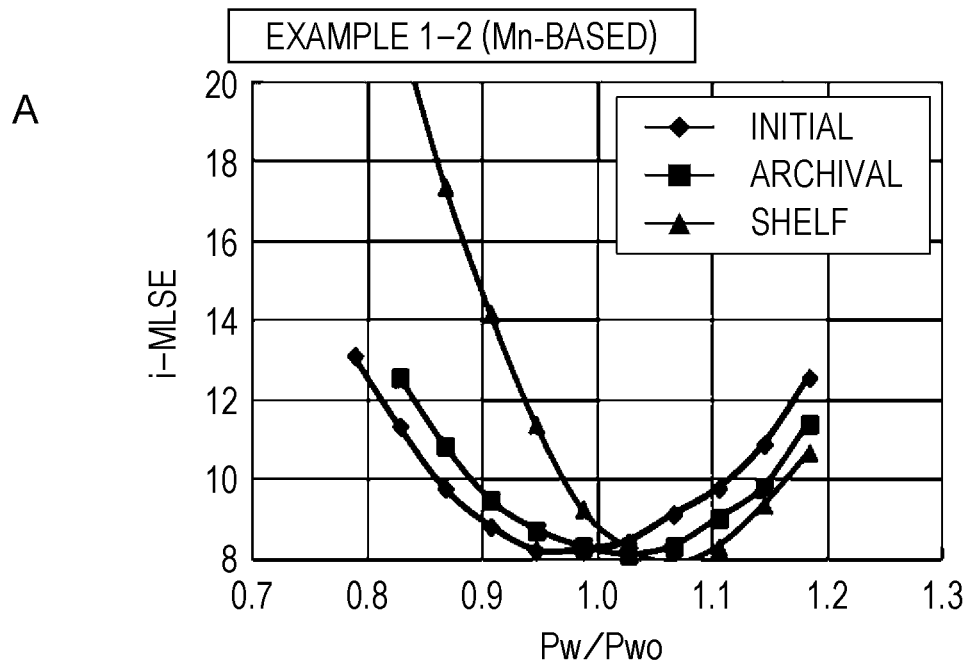
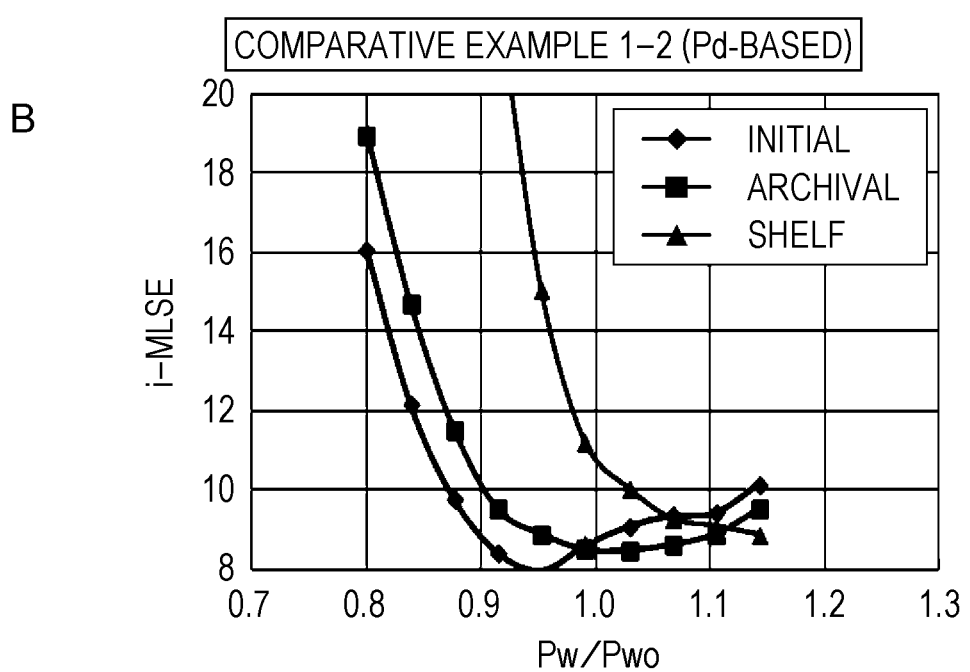

FIG. 10
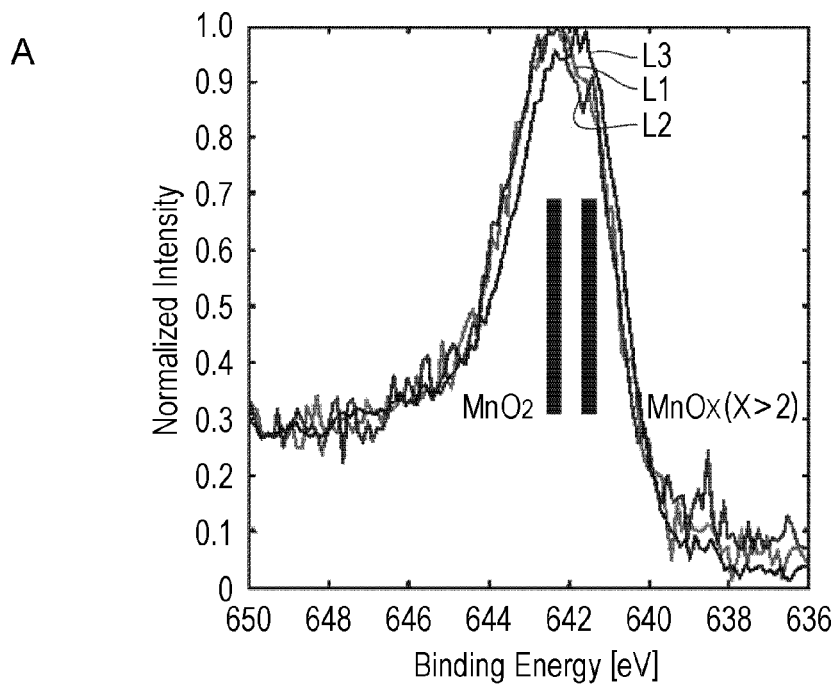
L1: LAYER DEPOSITED WITH PROPER AMOUNT OF OXYGEN
L2: SAMPLE OF EXAMPLE 2-1 ANALYZED AFTER HEATING AT 80°C FOR 24 h
L3: LAYER DEPOSITED WITH INSUFFICIENT AMOUNT OF OXYGEN
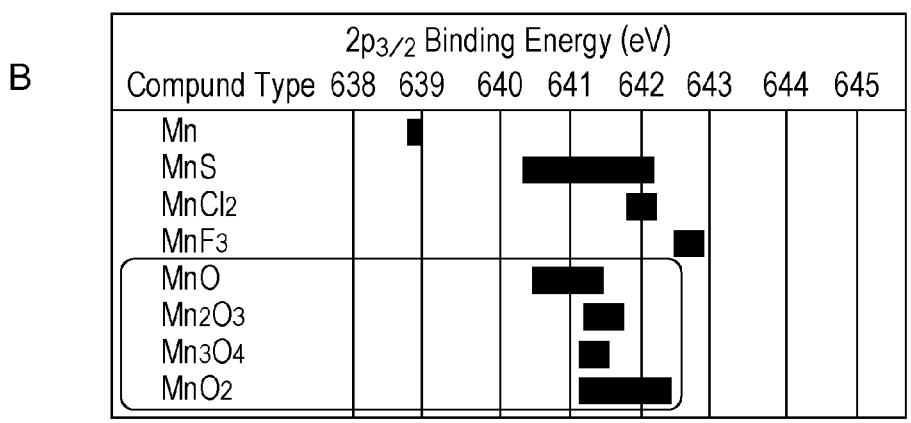

*FIG. 38*
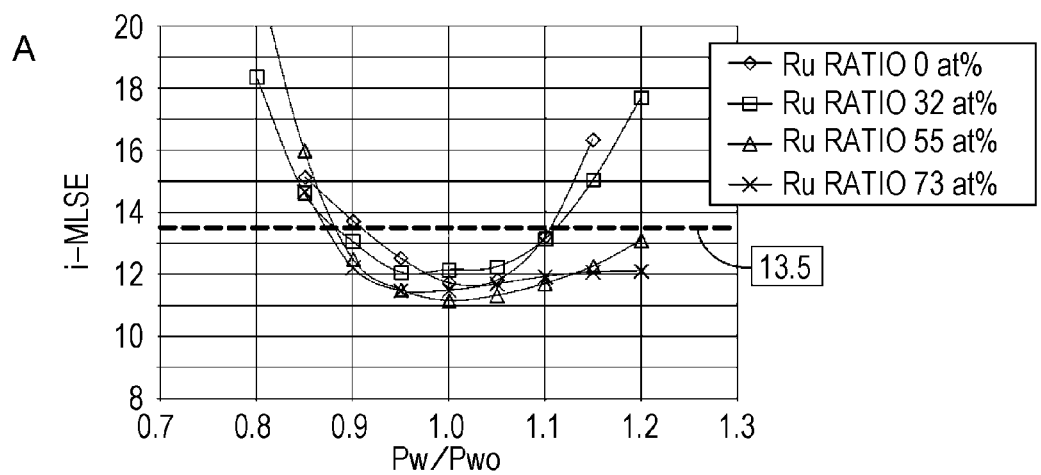
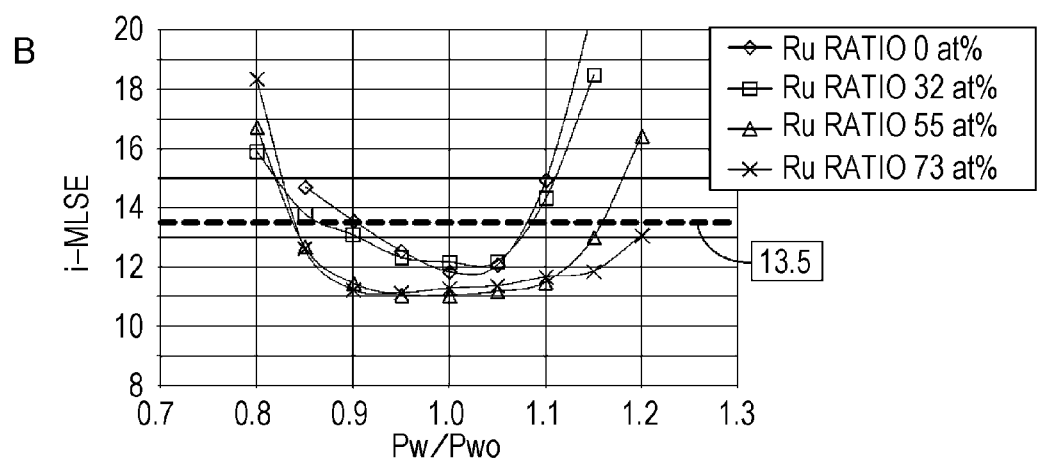
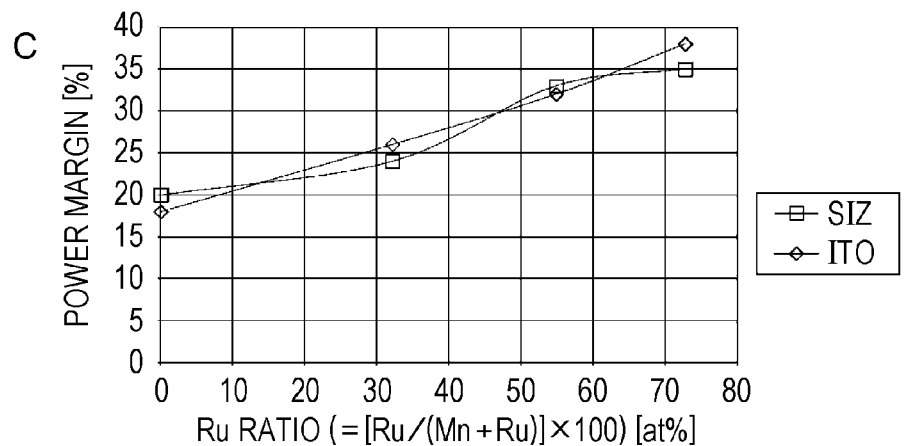

FIG. 39
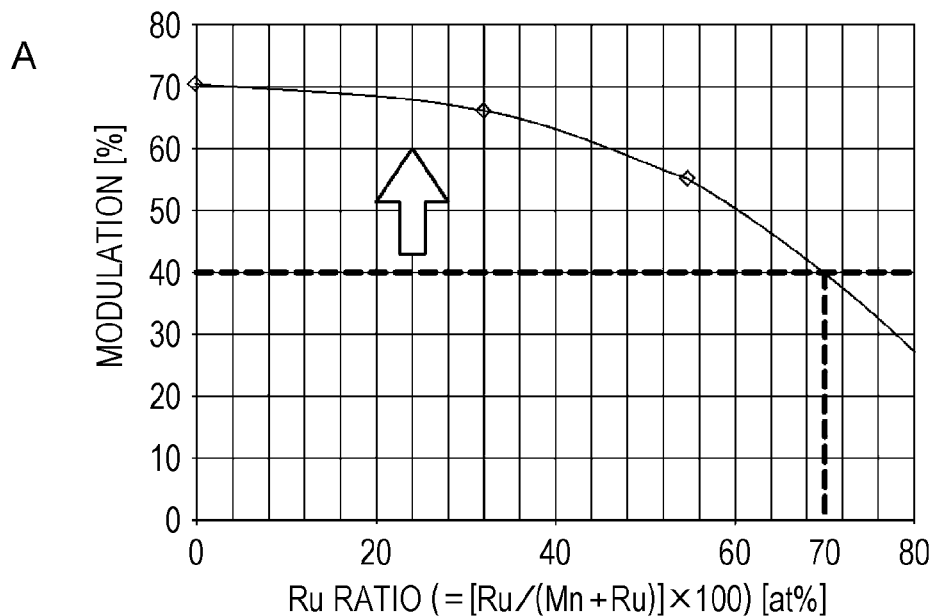
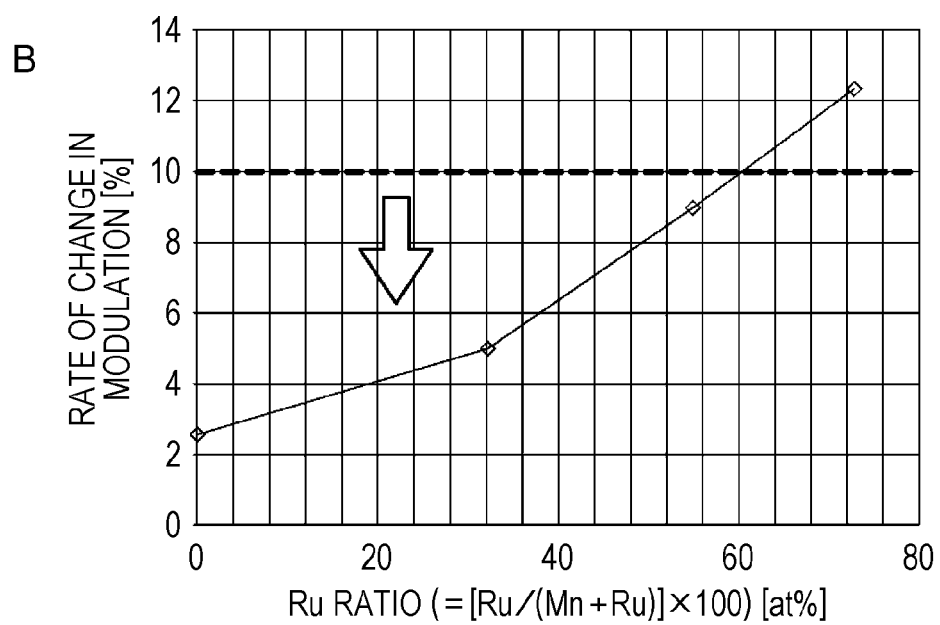

RECORDING LAYER, INFORMATION RECORDING MEDIUM, AND TARGET

CROSS REFERENCES TO RELATED APPLICATIONS

The present application is a national stage of International Application No. PCT/JP2013/003487 filed on Jun. 3, 2013 and claims priority to Japanese Patent Application No. JP2012-126716 filed on Jun. 4, 2012, and JP2013-001964 filed on Jan. 9, 2013, the disclosure of which is incorporated herein by reference.

BACKGROUND

The present technique relates to a recording layer including an inorganic material, an information recording media having such a recording layer, and a target for use in the manufacture thereof.

In recent years, large-capacity optical disks have been available on the market under the name of Blu-ray Disc (BD, registered trademark). These large-capacity optical disks have a storage capacity of about 25 GB for recording/reproduction using light with a wavelength of about 405 nm and a collective lens with a numerical aperture NA of about 0.85 in the recording/reproducing optical system.

Regarding the large-capacity optical disks, various materials for write-once recordable layers have been studied. Reported materials for write-once recordable layers include inorganic recording materials that can provide an information storage capacity exceeding 100 GB per optical disk. Patent Document 1 discloses the use of Pd oxide as a main reactive material for recording information signals by laser beam irradiation.

CITATION LIST

Patent Document

Patent Document 1: Japanese Patent Application Laid-Open No. 2011-62981

SUMMARY

Problems to be Solved by the Invention

Write-once optical disks are advantageous in that their cost is lower than that of other optical disks. However, Pd, which is a very expensive material, is a factor for an increase in the material cost of optical disks and a decrease in product appeal. Thus, there has been a demand for the development of a Pd-less recording layer that can be produced at low material cost. There has also been a demand for the development of a recording layer that can be produced with a reduced Pd content at low material cost.

It is therefore an object of the present technique to provide a recording layer that has good enough recording characteristics even without containing Pd, to provide an information recording medium having such a recording layer, and to provide a target for use in the manufacture thereof.

It is another object of the present technique to provide a recording layer that has good enough recording characteristics with a lower Pd content, to provide an information recording medium having such a recording layer, and to provide a target for use in the manufacture thereof.

Solutions to Problems

To solve the problems, a first aspect of the present technique is directed to an information recording medium including: a recording layer including an oxide of Mn, wherein Mn atoms in the oxide of Mn are partially or fully present as Mn with a valence of +4.

A second aspect of the present technique is directed to an information recording medium including: a plurality of recording layers, wherein at least one of the plurality of recording layers includes an oxide of Mn, and Mn atoms in the oxide of Mn are partially or fully present as Mn with a valence of +4.

A third aspect of the present technique is directed to a recording layer including: an oxide of Mn, wherein Mn atoms in the oxide of Mn are partially or fully present as Mn with a valence of +4.

A fourth aspect of the present technique is directed to a target for use in manufacturing an information recording medium, the target including: an oxide of Mn, wherein the oxide of Mn is partially or fully present as an oxide of Mn with a valence of less than +4.

In a preferred mode of the present technique, one or more information signal layers are provided on a substrate, and a cover layer is provided on the information signal layer. The cover layer may have any level of thickness. Examples of the cover layer include a substrate, a sheet, a coating layer, and the like. A high-NA objective lens is used for a high-density information recording media. Therefore, the cover layer is preferably an optically transparent thin layer such as a sheet or a coating layer, and the medium is preferably configured in such a way that light can be applied from the optically transparent layer side to record and reproduce information signals. In this case, a non-transparent material may be used as the substrate. At least one of the cover layer-side surface and the substrate-side surface may be appropriately selected as the light-receiving surface for the recording or reproduction of information signals, depending on the format of the information recording medium.

According to the present technique, the use of Mn as a recording material alternative to Pd makes it possible to reduce material cost, while keeping information recording/reproduction signal quality and long-term storage reliability good, and thus to provide inexpensive information recording media.

Effects of the Invention

As described above, the present technique makes it possible to obtain good enough recording characteristics even without Pd. The present technique also makes it possible to obtain good enough recording characteristics even with a lower Pd content.

Additional features and advantages are described herein, and will be apparent from the following Detailed Description and the figures.

BRIEF DESCRIPTION OF THE FIGURES

FIG. 1A is a perspective view showing an example of the appearance of an optical information recording medium according to a first embodiment of the present technique.

FIG. 1B is a schematic cross-sectional view showing an example of the structure of an optical information recording medium according to a first embodiment of the present technique.

FIG. 2A is a schematic diagram showing a first structural example of each information signal layer.

FIG. 2B is a schematic diagram showing a second structural example of each information signal layer.

FIG. 3A is a schematic diagram showing a third structural example of each information signal layer.

FIG. 3B is a schematic diagram showing a fourth structural example of each information signal layer.

FIG. 6A is a graph showing the results of evaluation of the initial characteristics of optical disks of Example 1-1 and Comparative Example 1-1.

FIG. 6B is a graph showing the results of evaluation of the initial characteristics of optical disks of Example 1-2 and Comparative Example 1-2.

FIG. 7A is a graph showing the results of evaluation of the reproduction durability of optical disks of Example 1-1 and Comparative Example 1-1.

FIG. 7B is a graph showing the results of evaluation of the reproduction durability of optical disks of Example 1-2 and Comparative Example 1-2.

FIG. 8A is a graph showing the results of evaluation of the initial, archival, and shelf characteristics of the optical disk of Example 1-1.

FIG. 8B is a graph showing the results of evaluation of the initial, archival, and shelf characteristics of the optical disk of Comparative Example 1-1.

FIG. 9A is a graph showing the results of evaluation of the initial, archival, and shelf characteristics of the optical disk of Example 1-2.

FIG. 9B is a graph showing the results of evaluation of the initial, archival, and shelf characteristics of the optical disk of Comparative Example 1-2.

FIG. 10A is a chart showing the results of X-ray photoelectron spectroscopic analysis.

FIG. 10B is a diagram showing $2P_{3/2}$ binding energy.

FIG. 38A is a graph showing the results of evaluation of the initial characteristics of optical disks of Examples 13-1 to 13-4.

FIG. 38B is a graph showing the results of evaluation of the initial characteristics of optical disks of Examples 14-1 to 14-4. FIG. 38C is a graph showing the results of evaluation of the power margin Δ (Pw/Pwo) for optical disks of Examples 13-1 to 13-4 and 14-1 to 14-4.

FIG. 39A is a graph showing the results of evaluation of the modulation of optical disks of Examples 14-1 to 14-3.

FIG. 39B is a graph showing the results of evaluation of the rate of change in the modulation of optical disks of Examples 14-1 to 14-4.

DETAILED DESCRIPTION

Figure 4:
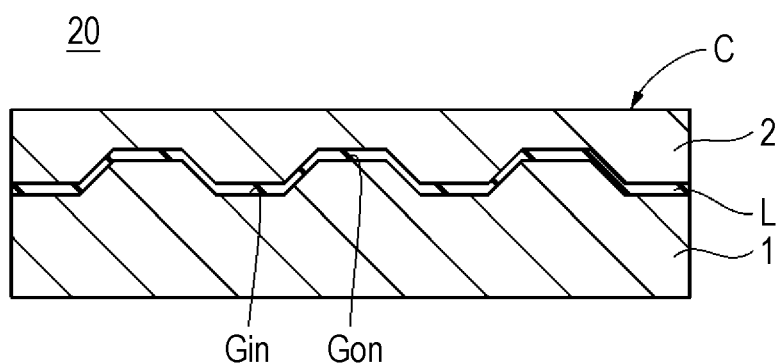
FIG. 4 is a schematic cross-sectional view showing an example of the structure of an optical information recording medium according to a fifth embodiment of the present technique.

1. First embodiment (examples of multilayer optical information recording medium)
   1-1. Structure of optical information recording media
   1-2. Mechanism for recording on optical information recoding medium
   1-3. Target for use in manufacturing optical information recording medium
   1-4. Method for manufacturing optical information recording medium
2. Second embodiment (examples of multilayer optical information recording medium)
3. Third embodiment (examples of multilayer optical information recording medium)
4. Fourth embodiment (examples of multilayer optical information recording medium)
5. Fifth embodiment (examples of single-layer-type optical information recording medium)

1. First Embodiment

[1-1. Structure of Optical Information Recording Medium]

FIG. 1A is a perspective view showing an example of the appearance of an optical information recording medium according to a first embodiment of the present technique. The optical information recording medium 10 has a disk shape with an opening (hereinafter referred to as a "center hole") formed at its center. The optical information recording medium 10 may have any other shape such as a card shape.

FIG. 1B is a schematic cross-sectional view showing an example of the structure of the optical information recording medium according to the first embodiment of the present technique. The optical information recording medium 10 is what is called a write-once multilayer optical information recording medium. As shown in FIG. 1B, the medium 10 includes a substrate 11, and an information signal layer L0, an intermediate layer S1, an information signal layer L1, . . . , an intermediate layer Sn, an information signal layer Ln, and an optically transparent layer 12 as a cover layer, which are stacked in this order on a principal surface of the substrate 11. Hereinafter, the information signal layers L0 to Ln are also called the information signal layers L when they are not distinguished from one another.

In the optical information recording medium 10 according to the first embodiment, a laser beam incident on the surface C of the optically transparent layer 12 is applied to each of the information signal layers L0 to Ln when information signals are recorded or reproduced. For example, a laser beam with a wavelength in the range of 400 nm to 410 nm is collected by an objective lens with a numerical aperture in the range of 0.84 to 0.86 and then applied to each of the information signal layers L0 to Ln from the optically transparent layer 12 side when information signals are recorded or reproduced. The optical information recording medium 10 with such a structure may be, for example, a multilayer BD-R. The laser beam for recording or reproducing information signals on or from the information signal layers L0 to Ln is applied to the surface C. Hereinafter, the surface C will be referred to as the light-receiving surface C.

Hereinafter, the components of the optical information recording medium 10, specifically, the substrate 11, the information signal layers L0 to Ln, the intermediate layers S1 to Sn, and the optically transparent layer 12 will be described, respectively.

(Substrate)

The substrate 11 has, for example, a disc shape with a center hole formed at its center. One principal surface of the substrate 11 is, for example, a concave-convex surface, and the information signal layer L0 is formed on the concave-convex surface. Hereinafter, a concave part of the concave-convex surface is referred to as an in-groove Gin, and a convex part of the concave-convex surface is referred to as an on-groove Gon.

The in-groove Gin and the on-groove Gon may have any of various shapes, such as a spiral shape and a concentric circular shape. The in-groove Gin and/or the on-groove Gon may also be, for example, wobbled for stabilization of linear velocity, addition of address information, or other purposes.

The size (diameter) of the substrate 11 is selected, for example, to be 120 mm. The thickness of the substrate 11 is selected in view of rigidity, preferably to be 0.3 mm to 1.3 mm, more preferably 0.6 mm to 1.3 mm, typically 1.1 mm. The size (diameter) of the center hole is selected, for example, to be 15 mm.

The substrate 11 is made of, for example, a plastic material or glass, preferably a plastic material in view of cost. Examples of such a plastic material include polycarbonate resin, polyolefin resin, acrylic resin, etc.

(Information Signal Layers)

The information signal layers L0 to Ln each include at least a recording layer capable of storing information signals when a laser beam is applied. The information signal layers L0 to Ln each have, for example, a storage capacity of 25 GB or more for a wavelength of 405 nm and a condenser numerical aperture NA of 0.85. In order to improve storage reliability, the information signal layers L0 to Ln preferably further include a dielectric layer provided on at least one surface of the recording layer, more preferably dielectric layers provided on both surfaces of the recording layer. All the information signal layers L0 to Ln may have the same structure, or the information signal layers L0 to Ln may have different structures from one another depending on the required characteristics (such as optical characteristics or durability). In view of productivity, all the layers preferably have the same structure. The information signal layers L0 to Ln may each consist of a recording layer. Such a simple structure makes it possible to reduce the cost of the optical information recording medium 10 and to improve its productivity. Such advantageous effects become significant as the number of the information signal layers L0 to Ln in the medium increases.

Hereinafter, first to fourth structural examples will be described as specific examples of the information signal layers L0 to Ln.

(First Structural Example)

FIG. 2A is a schematic diagram showing a first example of the structure of each information signal layer. Referring to 2A, the information signal layers L0 to Ln each include a recording layer 21 having a lower surface (first principal surface) and an upper surface (second principal surface) and a dielectric layer 22 provided adjacent to the upper surface of the recording layer 21. This structure can improve the durability of the recording layer 21.

(Second Structural Example)

FIG. 2B is a schematic diagram showing a second example of the structure of each information signal layer. Referring to FIG. 2B, the information signal layers L0 to Ln each include a recording layer 21 having a lower surface (first principal surface) and an upper surface (second principal surface) and a dielectric layer 23 provided adjacent to the lower surface of the recording layer 21. This structure can improve the durability of the recording layer 21.

(Third Structural Example)

FIG. 3A is a schematic diagram showing a third example of the structure of each information signal layer. Referring to FIG. 3A, the information signal layers L0 to Ln each include a recording layer 21 having a lower surface (first principal surface) and an upper surface (second principal surface), a dielectric layer 23 provided adjacent to the lower surface of the recording layer 21, and a dielectric layer 22 provided adjacent to the upper surface of the recording layer 21. This structure can improve the durability of the recording layer 21 more than the first and second structural examples can.

(Fourth Structural Example)

FIG. 3B is a schematic diagram showing a fourth example of the structure of each information signal layer. Referring to FIG. 3B, the information signal layers L0 to Ln each include, for example, a two-layer structure including recording layers 21a and 21b stacked on each other. The recording layers 21a and 21b have, for example, different material compositions.

(Recording Layer)

The recording layer 21 includes an oxide of manganese (Mn). In the recording layer, the manganese atoms in the oxide of Mn are partially or fully in the +4 valence state. Specifically, the oxide of Mn in the recording layer is fully present as $MnO_2$ (namely, an oxide of Mn with a valence of +4) or is present as a mixture including $MnO_2$ and a Mn oxide other than $MnO_2$ (such as $Mn_2O_3$ or $Mn_3O_4$), namely, a mixture including oxides of a plurality of Mn species with different valences, including Mn with a valence of +4. The recording layer 21 may also contain a Mn oxide other than $MnO_2$. The recording layer 21 preferably further contains an oxide of a metal (M) other than Mn. In this case, the recording layer 21 includes a complex oxide of manganese (Mn) and a metal (M) other than Mn. Such a metal (M) is preferably at least one selected from the group consisting of tin (Sn), zinc (Zn), bismuth (Bi), germanium (Ge), cobalt (Co), tungsten (W), copper (Cu), and aluminum (Al). Alternatively, the metal (M) may be at least one selected from the group consisting of tin (Sn), zinc (Zn), bismuth (Bi), germanium (Ge), cobalt (Co), tungsten (W), copper (Cu), aluminum (Al), indium (In), silver (Ag), palladium (Pd), gallium (Ga), tellurium (Te), vanadium (V), silicon (Si), tantalum (Ta), germanium (Ge), chromium (Cr), and terbium (Tb). Examples of the metal (M)-containing Mn oxide include Mn—W—Zn—O, Mn—W—Pd—Cu—O, Mn—Ag—O, and M-Pd-M1-O (wherein M1 is Al, Zn, In, or Sn). As used herein, manganese (Mn) oxide and metal (M) oxide may also include oxygen-deficient oxides. The present technique is not restricted to structures in which all of a plurality of recording layers 21 includes an oxide of manganese (Mn). The present technique may also use structures in which at least one of the plurality of recording layers 21 includes an oxide of Mn. Hereinafter, a recording material including an oxide of Mn is also referred to as a Mn-based recording material, and a recording layer including this recording material is also referred to as a Mn-based recording layer.

The recording layer 21 preferably includes $MnO_2$ as a main component. This is because it provides good recording characteristics. The recording layer 21 may include, as main components, $MnO_2$ and an oxide of at least one metal element selected from the group consisting of Sn, Zn, Bi, Ge, Co, W, Cu, and Al. When this composition is used, the resulting signal characteristics can be substantially the same as those obtained when the recording layer 21 includes $MnO_2$ as a main component. The recording layer 21 may contain a small amount of an expensive precious metal such as Pd or an oxide thereof as an accessory component. In order to reduce the cost of the optical information recording medium 10, however, the recording layer 21 is preferably free of an expensive precious metal such as Pd or an oxide thereof. The present technique is not restricted to structures in which all of a plurality of recording layers 21 includes $MnO_2$ as a main component. The present technique may also use structures in which at least one of the plurality of recording layers 21 includes $MnO_2$ as a main component. The present technique is not restricted to structures in which all the plurality of recording layers 21 includes, as main components, $MnO_2$ and an oxide of at least one metal element selected from the group consisting of Sn, Zn, Bi, Ge, Co, W, Cu, and Al. The present technique may also use structures in which at least one of the plurality of recording layers 21 includes, as main components, $MnO_2$ and an oxide of at least one metal element selected from the group consisting of Sn, Zn, Bi, Ge, Co, W, Cu, and Al.

The recording layer 21 has, for example, a single-layer structure or a two-layer structure. When the recording layer 21 has a single-layer structure, the recording layer 21 includes, for example, a Mn-containing complex oxide as a main component. When the recording layer 21 has a two-layer structure, the recording layer 21 includes first and second recording layers including different complex oxides with different material compositions as main components. At least one of the first and second recording layers includes a Mn-containing complex oxide as a main component.

(Dielectric Layer)

The dielectric layer 22 or 23 or a transparent conductive layer can function as a gas barrier layer to improve the durability of the recording layer 21. The dielectric layer 22 or 23 or a transparent conductive layer can also prevent oxygen from escaping from the recording layer 21 or prevent $H_2O$ from infiltrating into the recording layer 21, which makes it possible to prevent changes (generally detected as a reduction in reflectance) in the quality of the recording layer 21 and to ensure the quality necessary for the recording layer 21.

The dielectric layers 22 and 23 are each made of, for example, a material including at least one selected from the group consisting of an oxide, a nitride, a sulfide, a carbide, and a fluoride. The dielectric layers 22 and 23 may be made of the same material or different materials. The oxide may be, for example, an oxide of at least one or more elements selected from the group consisting of In, Zn, Sn, Al, Si, Ge, Ti, Ga, Ta, Nb, Hf, Zr, Cr, Bi, and Mg. The nitride may be, for example, a nitride of one or more elements selected from the group consisting of In, Sn, Ge, Cr, Si, Al, Nb, Mo, Ti, Nb, Mo, Ti, W, Ta, and Zn, preferably a nitride of one or more elements selected from the group consisting of Si, Ge, and Ti. The sulfide may be, for example, Zn sulfide. The carbide may be, for example, a carbide of one or more elements selected from the group consisting of In, Sn, Ge, Cr, Si, Al, Ti, Zr, Ta, and W, preferably a carbide of one or more elements selected from the group consisting of Si, Ti, and W. The fluoride may be, for example, a fluoride of one or more elements selected from the group consisting of Si, Al, Mg, Ca, and La. Examples of a mixture thereof include $ZnS$—$SiO_2$, $SiO_2$—$In_2O_3$—$ZrO_2$ (SIZ), $SiO_2$—$Cr_2O_3$—$ZrO_2$ (SCZ), $In_2O_3$—$SnO_2$ (ITO), $In_2O_3$—$CeO_2$ (ICO), $In_2O_3$—$Ga_2O_3$ (IGO), $In_2O_3$—$Ga_2O_3$—$ZnO$ (IGZO), $Sn_2O_3$—$Ta_2O_5$ (TTO), $TiO_2$—$SiO_2$, $Al_2O_3$—$ZnO$, and $Al_2O_3$—$BaO$.

(Intermediate Layers)

The intermediate layers S1 to Sn serve to separate the information signal layers L0 to Ln from one another with a distance long enough physically and optically, and the intermediate layers S1 to Sn each have a concave-convex surface. The concave-convex surface has concentric circular grooves or a spiral groove (an in-groove Gin and an on-groove Gon). The thickness of the intermediate layers S1 to Sn is preferably selected to be 9 μm to 50 μm. The intermediate layers S1 to Sn are preferably, but not necessarily, made from an ultraviolet-curable acrylic resin. The intermediate layers S1 to Sn preferably have sufficiently high optical transparency because they form an optical path for a laser beam used to record or reproduce information signals on or from deeper layers.

(Optically Transparent Layer)

The optically transparent layer 12 is, for example, a resin layer formed by curing a photosensitive resin such as an ultraviolet-curable resin. The resin layer may be made from, for example, an ultraviolet-curable acrylic resin. Alternatively, the optically transparent layer 12 may include a circular ring-shaped optically transparent sheet and an adhesive layer for bonding the optically transparent sheet to the substrate 11. The optically transparent sheet is preferably made of a material with low ability to absorb a laser beam used for recording and reproduction. Specifically, the optically transparent sheet is preferably made of a material with a transmittance of 90% or more with respect to the laser beam. The optically transparent sheet may be made of, for example, a polycarbonate resin material, a polyolefin resin (such as ZEONEX (registered trademark)), or the like. The adhesive layer may be made using, for example, an ultraviolet-curable resin or a pressure sensitive adhesive (PSA).

The thickness of the optically transparent layer 12 is preferably selected in the range of 10 μm to 177 μm, typically to be 100 μm. High-density recording can be achieved using a combination of such a thin optically transparent layer 12 and an objective lens configured to have a high numerical aperture (NA) of, for example, about 0.85.

(Hard Coat Layer)

Although not shown, a hard coat layer may be further provided on the surface of the optically transparent layer 12 (laser-beam-receiving surface), for example, to protect the medium from mechanical shock or scratches or protect the quality of recording/reproduction of information signals from deposition of dust or fingerprints during handling by users. The hard coat layer may be made using a material containing a silica gel fine powder for improving mechanical strength or using a solvent-containing or solvent-free ultraviolet-curable resin. To have high mechanical strength and water- or oil-repellency, the hard coat layer preferably has a thickness of about 1 μm to several μm.

[1-2. Mechanism for Recording on Optical Information Recoding Medium]

In the optical information recording medium 10 with the structure described above, for example, light such as a laser beam with a central wavelength of around 405 nm is applied to the information signal layers L when recording on the optical information recording medium 10 is performed. In this recording operation, $MnO_2$ releases oxygen so that $O_2$ is produced, and Mn forms an oxide with a lower valence. The production of $O_2$ causes the irradiated area to expand structurally and to form a recording mark accompanied with changes in volume and optical constant.

This mechanism seems to be substantially similar to the mechanism for recording on information recording layers including Pd oxide. However, the decomposition temperature of $MnO_2$ is higher than that of $PdO_2$, which is important in recording on Pd oxide. Therefore, information recording layers including $MnO_2$ are more advantageous in terms of preservation of recording marks.

[1-3. Target for Use in Manufacturing Optical Information Recording Medium]

A sputtering target used to form the $MnO_2$-containing recording layer 21 (recording layer-forming target) includes $Mn_3O_4$. More specifically, the sputtering target includes an oxide of Mn, in which the oxide of Mn is partially or fully present as an oxide of Mn with a valence of less than +4, such as $Mn_2O_3$ or $Mn_3O_4$. $MnO_2$ can be decomposed by heat during the production of the target or by energy during sputtering. Therefore, it is difficult to allow $MnO_2$ to form the target. Thus, $Mn_3O_4$ resistant to thermal decomposition is preferably used as a material to form the target. When sputtering is performed using oxygen as assist gas, $Mn_3O_4$ can be converted to $MnO_2$ so that $MnO_2$ can be reliably formed in the sputtered thin film. The sputtering target may further include a metal (M) other than Mn or an oxide of the metal (M). As used herein, oxides of Mn and the metal (M) may also include oxygen-deficient oxides.

For example, a PdWZnO oxide recording material is a complex oxide material composed of $PdO_x$, $WO_3$, and ZnO. In this material, $PdO_x$ mainly plays a role in absorbing light, and other oxides are transparent to light with a wavelength of 405 nm. In the formula $PdO_x$, x means that the oxide is a mixture of oxides of Pd species with a plurality of different valences such as +2 and +4. Similarly, a MnWZnO oxide recording material is a complex oxide material composed of $MnO_x$, $WO_3$, and ZnO. In the formula $MnO_x$, x means that the oxide is a mixture of oxides of Mn species with a plurality of different valences such as +2, +3, and +4.

For reference, the prices of Pd and $Mn_3O_4$ are shown below.

Pd: 1,900 yen per g (futures price on the Tokyo Commodity Exchange)

$Mn_3O_4$: 500 yen per g (target price listed in a catalog published by Kojundo Chemical Laboratory Co., Ltd.)

Note that these material prices were those of March, 2012.

[1-4. Method for Manufacturing Optical Information Recording Medium]

Next, an example of a method for manufacturing the optical information recording medium according to the first embodiment of the present technique will be described.

(Step of Forming Substrate)

First, a substrate 11 having a concave-convex surface as a principal surface is formed. The method of forming the substrate 11 may be, for example, injection molding or photopolymer method (photo-polymerization (2P) technique).

(Step of Forming Information Signal Layer)

Next, an information signal layer L0 is formed on the substrate 11, for example, by sputtering. What specific steps should be used to form the information signal layer L0 depends on what structure the information signal layer L0 will have.

Hereinafter, steps for forming the information signal layer L0 will be specifically described for the case where the third structural example (see FIG. 3A) is used for the structure of the information signal layer L0.

(Step of Forming Dielectric Layer)

First, the substrate 11 is fed into a vacuum chamber equipped with a target for forming a dielectric layer, and the pressure in the vacuum chamber is reduced to a predetermined level. The target is then sputtered to deposit a dielectric layer 23 on the substrate 11 while process gases such as Ar and $O_2$ are introduced into the vacuum chamber. The sputtering may be, for example, radio frequency (RF) sputtering or direct current (DC) sputtering. Direct current sputtering is particularly preferred. As compared with RF sputtering, DC sputtering can be performed with an inexpensive system at a high deposition rate, which makes it possible to reduce the manufacturing cost and improve the productivity.

(Step of Forming Recording Layer)

Next, the substrate 11 is fed into a vacuum chamber equipped with the recording layer-forming target, and the pressure in the vacuum chamber is reduced to a predetermined level. The target is then sputtered to deposit a recording layer 21 on the dielectric layer 23 while process gases such as Ar and $O_2$ are introduced into the vacuum chamber.

Using oxygen as assist gas, a film of the Mn-based recording material is formed by the sputtering, in which the metal M forms a stable oxide, and Mn forms oxides such as $MnO_2$, $M_2O_3$, and $M_3O_4$ depending on the oxygen concentration. It is known that $MnO_2$ and $Mn_2O_3$ are decomposed by heat to release oxygen and have decomposition temperatures of 535° C. and 1,080° C., respectively. As is known, $MnO_2$ is black and has the ability to absorb light.

(Step of Forming Dielectric Layer)

Next, the substrate 11 is fed into a vacuum chamber equipped with a target for forming a dielectric layer, and the pressure in the vacuum chamber is reduced to a predetermined level. The target is then sputtered to deposit a dielectric layer 22 on the recording layer 21 while process gases such as Ar and $O_2$ are introduced into the vacuum chamber. The sputtering may be, for example, radio frequency (RF) sputtering or direct current (DC) sputtering. Direct current sputtering is particularly preferred. As compared with RF sputtering, DC sputtering can be performed at a high deposition rate, which makes it possible to improve the productivity.

Thus, an information signal layer L0 is formed on the substrate 11.

(Step of Forming Intermediate Layer)

Next, an ultraviolet-curable resin is uniformly applied to the information signal layer L0, for example, by spin coating. A stamper with a concave-convex pattern is then pressed against the ultraviolet-curable resin, which is uniformly applied to the information signal layer L0. After the ultraviolet-curable resin is cured by being irradiated with ultraviolet rays, the stamper is peeled off. In this way, the concave-convex pattern of the stamper is transferred to the ultraviolet-cured resin, and an intermediate layer S1, for example, having in-grooves Gin and on-grooves Gon is formed on the information signal layer L0.

(Steps of Forming Information Signal Layers and Intermediate Layers)

Next, an information signal layer L1, an intermediate layer S2, an information signal layer L2, . . . , an intermediate layer Sn, and an information signal layer Ln are stacked in this order on the intermediate layer S1 using the same steps as for the information signal layer L0 and the intermediate layer S1.

(Step of Forming Optically Transparent Layer)

Next, a photosensitive resin such as an ultraviolet-curable resin (UV resin) is applied to the information signal layer Ln, for example, by spin coating. The photosensitive resin is then cured by being irradiated with light such as ultraviolet rays. In this way, an optically transparent layer 12 is formed on the information signal layer Ln.

The desired optical information recording medium 10 is obtained by the steps described above.

Advantageous Effects

According to this embodiment, the information signal layers L include a recording layer 21 including a Mn-based recording material. The Mn-based recording material is superior in manufacturing cost and stability of signal quality to Pd-based recording materials. Therefore, the use of the Mn-based recording material makes it possible to provide inexpensive, highly-reliable, write-once, optical information recording media 10.

2. Second Embodiment

[Outline]

Since the development of Blu-ray discs, oxide-based recording materials with the ability to absorb light have been the predominant recording materials for write-once optical information recording media. These recording materials have the following problems. As a result of long-term storage, the properties of the recording materials can change, information signals recorded on the materials can degrade (what is called degradation in archival characteristics), or the physical properties of unrecorded regions can change so that it can be impossible to record information signals with the same quality under the same conditions as in the initial stage (what is called degradation in shelf characteristics).

A good balance between cost and long-term storage reliability can be an advantage of optical information recording media over other information recording media. Therefore, it is also desired to improve the archival characteristics and the shelf characteristics of optical information recording media produced using oxide-based recording materials. The first embodiment described above has shown a technique of changing oxide-based recording materials from Pd-based recording materials to Mn-based recording materials so that the cost of media can be reduced. The second embodiment will show a technique of adding an oxide of Mg to a Mn-based recording material to further improve the archival characteristics and the shelf characteristics in addition to the cost reduction and to achieve a good balance between cost and long-term storage reliability.

[Features of Optical Information Recording Medium]

An optical information recording medium 10 according to the second embodiment has the same features as those of the optical information recording medium 10 according to the first embodiment, except for the recording layer 21. Hereinafter, therefore, only the features of the recording layer 21 will be described.

(Recording Layer)

The recording layer 21 includes an oxide of Mn and an oxide of Mg. In the recording layer, the Mn atoms are partially or fully in the +4 valence state, or the Mn atoms are in a plurality of different valence states including the +4 valence state. Specifically, the oxide of Mn in the recording layer is fully present as $MnO_2$ or is present as a mixture including $MnO_2$ and a Mn oxide other than $MnO_2$ (such as $Mn_2O_3$ or $Mn_3O_4$). The oxide of Mn is a material to serve as a driving force in mark formation.

Taking into account the possible valence for Mg, the oxide of Mg should be present as MgO in the recording layer. MgO is a material transparent to visible light. The recording layer 21 may contain elemental Mg metal. Preferably, the recording layer 21 contains Mg in the form of an oxide. Hereinafter, a recording material including an oxide of Mn and an oxide of Mg is also referred to as a Mn—Mg-based recording material, and a recording layer including this material is also referred to as a Mn—Mg-based recording layer.

The content of the oxide of Mg in the recording layer is preferably in the range of 5 mol % to 50 mol %. When the content falls within the range, the storage reliability (e.g., the archival characteristics and the shelf characteristics) can be further improved.

The recording layer 21 preferably further contains an oxide of a metal (M) other than Mn and Mg. In this case, the recording layer 21 includes a complex oxide of Mn, Mg, and the metal (M) other than them. The metal (M) may be the same as in the first embodiment. As used herein, oxides of Mn, Mg, and the metal (M) may also include oxygen-deficient oxides. As a non-limiting example, the optical information recording medium 10 may have a structure in which all the plurality of recording layers 21 includes an oxide of Mn and an oxide of Mg, or a structure in which at least one of the plurality of recording layers 21 includes an oxide of Mn and an oxide of Mg.

In order to improve recording characteristics and storage reliability, the recording layer 21 preferably includes $MnO_2$ and MgO as main components. The recording layer 21 may include $MnO_2$, MgO, and a complex oxide of the metal (M) other than Mn and Mg as main components. When this feature is used, substantially the same level of signal characteristics and storage reliability can be obtained as in the case where the recording layer 21 includes $MnO_2$ and MgO as main components.

The recording layer 21 has, for example, a single-layer structure or a two-layer structure. When the recording layer 21 has a single-layer structure, the recording layer 21 includes, for example, a Mn and Mg-containing complex oxide as a main component. When the recording layer 21 has a two-layer structure, the recording layer 21 includes first and second recording layers including different complex oxides with different material compositions as main components. At least one of the first and second recording layers includes a Mn and Mg-containing complex oxide as a main component.

[Target for Use in Manufacturing Optical Information Recording Medium]

A sputtering target used to form the recording layer 21 (recording layer-forming target) includes an oxide of Mn and elemental Mg metal or an oxide of Mg. The sputtering target may further include a metal (M) other than Mn and Mg or an oxide of the metal (M). The metal (M) may be the same as in the first embodiment. As used herein, oxides of Mn, Mg, and the metal (M) may also include oxygen-deficient oxides.

The oxide of Mn is partially or fully present as an oxide of Mn with a valence of less than +4. The oxide of Mn in this oxidation state preferably includes at least $Mn_3O_4$. The oxide of Mn in this oxidation state may include two or more oxides of Mn, such as $Mn_2O_3$ and $Mn_3O_4$. $MnO_2$ can be decomposed by heat during the production of the target or by energy during sputtering. Therefore, it is difficult to allow $MnO_2$ to form the target. Thus, $Mn_3O_4$ resistant to thermal decomposition is preferably used as a material to form the target. When sputtering is performed using oxygen as assist gas, $Mn_3O_4$ can be converted to $MnO_2$ so that $MnO_2$ can be reliably formed in the sputtered thin film.

As mentioned above, Mg should be present as an oxide of Mg in the recording layer. In the process of forming the recording layer 21, oxygen is introduced to convert $Mn_3O_4$ to $MnO_2$ when sputtering is performed. In this process, Mg is also oxidized at the same time. Since Mg can have only a valence of +2, Mg will be present as MgO in the recording layer. Mg present as an oxide in the recording layer will be in a stable state without undergoing further changes.

[Method for Manufacturing Optical Information Recording Medium]

A method for manufacturing the optical information recording medium according to the second embodiment may be the same as that for manufacturing the optical information recording medium according to the first embodiment, except for the step of forming the recording layer. Hereinafter, therefore, only the step of forming the recording layer will be described.

(Step of Forming Recording Layer)

The substrate 11, on which the dielectric layer 23 is formed, is fed into a vacuum chamber equipped with the recording layer-forming target, and the pressure in the vacuum chamber is reduced to a predetermined level. The recording layer-forming target is then sputtered to deposit a recording layer 21 on the dielectric layer 23 while process gases such as Ar and $O_2$ are introduced into the vacuum chamber.

When the target is sputtered using oxygen as assist gas, the oxide of Mn from the target produces oxides such as $MnO_2$, $M_2O_3$, and $Mn_3O_4$, depending on the concentration of oxygen in the process gas, and such oxides form the recording layer 21. At the same time, Mg or an oxide thereof from the target reacts with $O_2$ in the process gas to form MgO, which forms part of the recording layer. When the target further contains the metal (M) or an oxide thereof, the metal (M) or the oxide thereof from the target reacts with $O_2$ in the process gas to form a stable oxide ($MO_x$), which forms part of the recording layer.

Advantageous Effects

According to this embodiment, the recording layer 21 includes not only an oxide of Mn to serve as a driving force in mark formation but also an oxide of Mg. This makes it possible to provide optical information recording media 10 having a high level of information recording/reproduction signal quality and long-term storage reliability while maintaining the low material cost. Therefore, a good balance between cost and long-term storage reliability can be achieved.

[Modifications]

Alternatively, the recording layer 21 may include an oxide of Mn and an oxide of a metal (Ma), wherein Ma is at least one metal element selected from the group consisting of Mg, Mo, Si, and Te. When this feature is used, it is also possible to provide optical information recording media 10 having a high level of information recording/reproduction signal quality and long-term storage reliability while maintaining the low material cost. In order to improve long-term storage reliability, however, the recording layer 21 preferably contains an oxide of Mg rather than an oxide of Mo, Si, or Te. The recording layer 21 preferably further contains an oxide of a metal (M) other than Mn and the metal (Ma). The metal (M) may be the same as in the first embodiment.

The content of an oxide of the metal (Ma) in the recording layer is preferably in the range of 5 mol % to 50 mol %. When the content falls within the range, the storage reliability (e.g., the archival characteristics and the shelf characteristics) can be further improved.

The sputtering target for forming the recording layer 21 (recording layer-forming target) includes an oxide of Mn and a metal (Ma) or an oxide of the metal (Ma). The sputtering target may further include a metal (M) other than Mn and the metal (Ma) or an oxide of the metal (M).

The oxide of Mn is present as an oxide of Mn with a valence of less than +4, such as $Mn_2O_3$ or $Mn_3O_4$. The metal Ma is preferably present as metal element Ma in the target. In this case, the resulting target can facilitate DC sputtering, which makes it possible to keep the sputtering system cost low and thus to keep the cost of the optical information recording medium 10 low.

As described above, the metal Ma is present as an oxide in the recording layer. In the process of forming the recording layer 21, oxygen is introduced to convert $Mn_3O_4$ to $MnO_2$ when sputtering is performed. In this process, the metal Ma is also oxidized at the same time. The metal Ma present as an oxide in the recording layer will be in a stable state without undergoing further changes.

In the process of forming the recording layer 21, the recording layer-forming target is sputtered using oxygen as assist gas, so that the oxide of Mn from the target produces oxides such as $MnO_2$, $M_2O_3$, and $Mn_3O_4$, depending on the concentration of oxygen in the process gas, and such oxides form the recording layer 21. At the same time, the metal Ma or an oxide thereof from the target reacts with $O_2$ in the process gas to form an oxide ($MaO_x$), which forms part of the recording layer. When the target further contains the metal (M) or an oxide thereof, the metal (M) or the oxide thereof from the target reacts with $O_2$ in the process gas to form a stable oxide ($MO_x$), which forms part of the recording layer.

3. Third Embodiment

[Outline]

The second embodiment described above has shown a technique of adding an oxide of Mg to the Mn-based recording material to achieve a good balance between cost and long-term storage reliability. The third embodiment, as illustrated in FIG. 3A, will show a technique for achieving a good balance between cost and long-term storage reliability by forming dielectric layers 22 and 23 on both surfaces of the recording layer 21 including the Mn-based recording material using materials selected for the dielectric layers 22 and 23.

[Features of Optical Information Recording Medium]

An optical information recording medium 10 according to the third embodiment has the same features as those of the optical information recording medium 10 according to the first or second embodiment, except for the dielectric layers 22 and 23. Hereinafter, therefore, only the features of the dielectric layers 22 and 23 will be described.

(Dielectric Layers)

The dielectric layer 22 provided on the light-receiving surface of the recording layer includes $ZrO_2$ and the dielectric layer 23 provided on the surface opposite to the light-receiving surface includes a complex oxide of $In_2O_3$ and $ZrO_2$, or both the dielectric layers 22 and 23 include a complex oxide of $In_2O_3$ and $ZrO_2$. The structure having the recording layer 21 sandwiched between the dielectric layers 22 and 23 allows the optical information recording medium 10 to have higher long-term storage reliability. In order to improve long-term storage reliability, it is particularly preferable that both the dielectric layers 22 and 23 include a complex oxide of $In_2O_3$ and $ZrO_2$ as a main component.

When the dielectric layers 22 and 23 having the above features are used in combination with the Mn-based recording layer according to the first embodiment or the Mn—Mg-based recording layer according to the second embodiment, a good balance between cost and long-term storage reliability can be achieved. In order to improve long-term storage reliability, it is particularly preferable to use the dielectric layers 22 and 23 having the above features in combination with the Mn—Mg-based recording layer according to the second embodiment.

The molar ratio of the amount B of $ZrO_2$ to the total amount A of $In_2O_3$ and $ZrO_2$ (($B/A$)×100 (mol %)) is preferably in the range of 52 mol % to 76 mol %. When the ratio falls within the range, a wide power margin can be reliably attained.

Advantageous Effects

According to this embodiment, the information signal layer L has a three-layer structure including dielectric protective layers 22 and 23 and a recording layer 21 that is sandwiched between them and includes the Mn-based recording material or the Mn—Mg-based recording material. The dielectric layer 22 on the optically transparent layer side includes $ZrO_2$ and the dielectric layer 23 on the substrate side includes a complex oxide of $In_2O_3$ and $ZrO_2$, or both the dielectric layer 22 on the optically transparent layer side and the dielectric layer 23 on the substrate side include a complex oxide of $In_2O_3$ and $ZrO_2$. This makes it possible to provide optical information recording media 10 having a high level of information recording/reproduction signal quality and long-term storage reliability while maintaining the low material cost. Therefore, a good balance between cost and long-term storage reliability can be achieved. When the information signal layer L has a three-layer structure including dielectric protective layers 22 and 23 and a recording layer 21 that is sandwiched between them and includes the Mn—Mg-based recording material, the resulting optical information recording medium 10 can have particularly high long-term storage reliability.

4. Fourth Embodiment

An optical information recording medium 10 according to the fourth embodiment has the same features as those of the optical information recording medium according to the first embodiment, except for the recording layer 21. Hereinafter, therefore, only the features of the recording layer 21 will be described.

(Recording Layer)

The recording layer 21 includes an oxide containing Mn and Ru (ruthenium). More specifically, the recording layer 21 includes an oxide of Mn and an oxide of Ru. The recording layer 21 containing Ru can improve the power margin. Hereinafter, a recording layer including an oxide of Mn and an oxide of Ru is also referred to as a Mn—Ru-based recording layer.

The ratio of the amount of Ru to the total amount of Mn and Ru ($=[Ru/(Mn+Ru)] \times 100$) is preferably more than 0 atomic % (at %) to 70 at %, more preferably more than 0 at % to 60 at %, even more preferably in the range of 32 at % to 60 at %. When the Ru ratio is 70 at % or less, good modulation can be obtained. When the Ru ratio is 60 at % or less, it is possible to suppress changes in the modulation of the optical information recording medium 10 in the unrecorded state during long-term storage.

The recording layer 21 preferably further includes an oxide of a metal (M) other than Mn and Ru. In this case, the recording layer 21 includes a complex oxide of Mn, Ru, and the metal (M) other than them. The metal (M) may be the same as in the first embodiment. As used herein, oxides of Mn, Mg, and the metal (M) may also include oxygen-deficient oxides. As a non-limiting example, the optical information recording medium 10 may have a structure in which all the recording layers 21 of the information signal layers L0 to Ln include an oxide of Mn and an oxide of Ru, or a structure in which at least one of the recording layers 21 of the information signal layers L0 to Ln includes an oxide of Mn and an oxide of Ru. It is particularly preferable to use a structure in which the recording layer 21 of each of the information signal layers L1 to Ln among the layers L0 to Ln includes an oxide of Mn and an oxide of Ru. The recording layer 21 containing Ru can suppress changes in the transmittance of the information signal layers L1 to Ln before and after information signal recording.

The recording layer 21 has, for example, a single-layer structure or a two-layer structure. When the recording layer 21 has a single-layer structure, the recording layer 21 includes, for example, a Mn and Ru-containing complex oxide as a main component. When the recording layer 21 has a two-layer structure, the recording layer 21 includes first and second recording layers, for example, including different complex oxides with different material compositions as main components. At least one of the first and second recording layers includes a Mn and Ru-containing complex oxide as a main component.

[Target for Use in Manufacturing Optical Information Recording Medium]

A sputtering target used to form the recording layer 21 (recording layer-forming target) includes an oxide of Mn and elemental Ru metal or an oxide of Ru. The sputtering target may further include a metal (M) other than Mn and Ru or an oxide of the metal (M). The metal (M) may be the same as in the first embodiment. As used herein, oxides of Mn, Ru, and the metal (M) may also include oxygen-deficient oxides.

As mentioned above, Ru is present as an oxide of Ru in the recording layer. In the process of forming the recording layer 21, oxygen is introduced to convert $Mn_3O_4$ to $MnO_2$ when sputtering is performed. In this process, Ru is also oxidized at the same time. Ru present as an oxide in the recording layer will be in a stable state without undergoing further changes.

[Method for Manufacturing Optical Information Recording Medium]

A method for manufacturing the optical information recording medium according to the fourth embodiment may be the same as that for manufacturing the optical information recording medium according to the first embodiment, except for the step of forming the recording layer. Hereinafter, therefore, only the step of forming the recording layer will be described.

(Step of Forming Recording Layer)

The substrate 11, on which the dielectric layer 23 is formed, is fed into a vacuum chamber equipped with the recording layer-forming target, and the pressure in the vacuum chamber is reduced to a predetermined level. The recording layer-forming target is then sputtered to deposit a recording layer 21 on the dielectric layer 23 while process gases such as Ar and $O_2$ are introduced into the vacuum chamber.

When the target is sputtered using oxygen as assist gas, the oxide of Mn from the target produces oxides such as $MnO_2$, $M_2O_3$, and $Mn_3O_4$, depending on the concentration of oxygen in the process gas, and such oxides form the recording layer 21. At the same time, Ru or an oxide thereof from the target reacts with $O_2$ in the process gas to form RuO, which forms part of the recording layer. When the target further contains the metal (M) or an oxide thereof, the metal (M) or the oxide thereof from the target reacts with $O_2$ in the process gas to form a stable oxide ($MO_x$), which forms part of the recording layer.

Advantageous Effects

In the optical information recording medium 10 according to the fourth embodiment, the recording layer 21 includes not only an oxide of Mn to serve as a driving force in mark formation but also an oxide of Ru. Therefore, the following advantageous effects can be obtained.

A wider power margin can be obtained.

Changes in the transmittance of the information signal layers L before and after recording can be reduced. For example, when information signals are recorded on the information signal layer Ln−1, changes in the transmittance of the information signal layer L before and after recording should preferably be small so that variations in the apparent sensitivity of the information signal layer Ln−1 can be suppressed.

When Mn in the recording layer 21 is partially replaced by Ru, the reflectance can be reduced. When the reflectance of the recording layer 21 is reduced in this manner, the thickness of the dielectric layer 22 provided adjacent to the upper surface of the recording layer 21 can be reduced. This makes it possible to reduce the material cost for the dielectric layer 22 and to reduce the time required to form the dielectric layer 22.

5. Fifth Embodiment

FIG. 4 is a schematic cross-sectional view showing an example of the structure of an optical information recording medium according to a fifth embodiment of the present technique. In the fifth embodiment, the same parts as those in the first embodiment are assigned with the same reference signs, and a detailed description thereof will be omitted. The optical information recording medium 10 is what is called a single-layer-type, write-once, optical information recording medium. Referring to FIG. 1, the optical information recording medium 10 includes a substrate 11, and an information signal layer L and an optically transparent layer 12 as a cover layer, which are stacked in this order on one principal surface of the substrate 11. As a non-limiting example, the information signal layer L may have a structure according to the first embodiment, or a structure according to the second, third, or fourth embodiment.

EXAMPLES

Hereinafter, the present technique will be described specifically with reference to examples, which however are not intended to limit the present technique.

(Evaluation System)

In the examples, optical disks were evaluated using a BD evaluation system. In the examples, the optical disks used have only one information recording layer (what are called single-layer disks) because the key is to examine the characteristics of recording materials.

Figure 5:
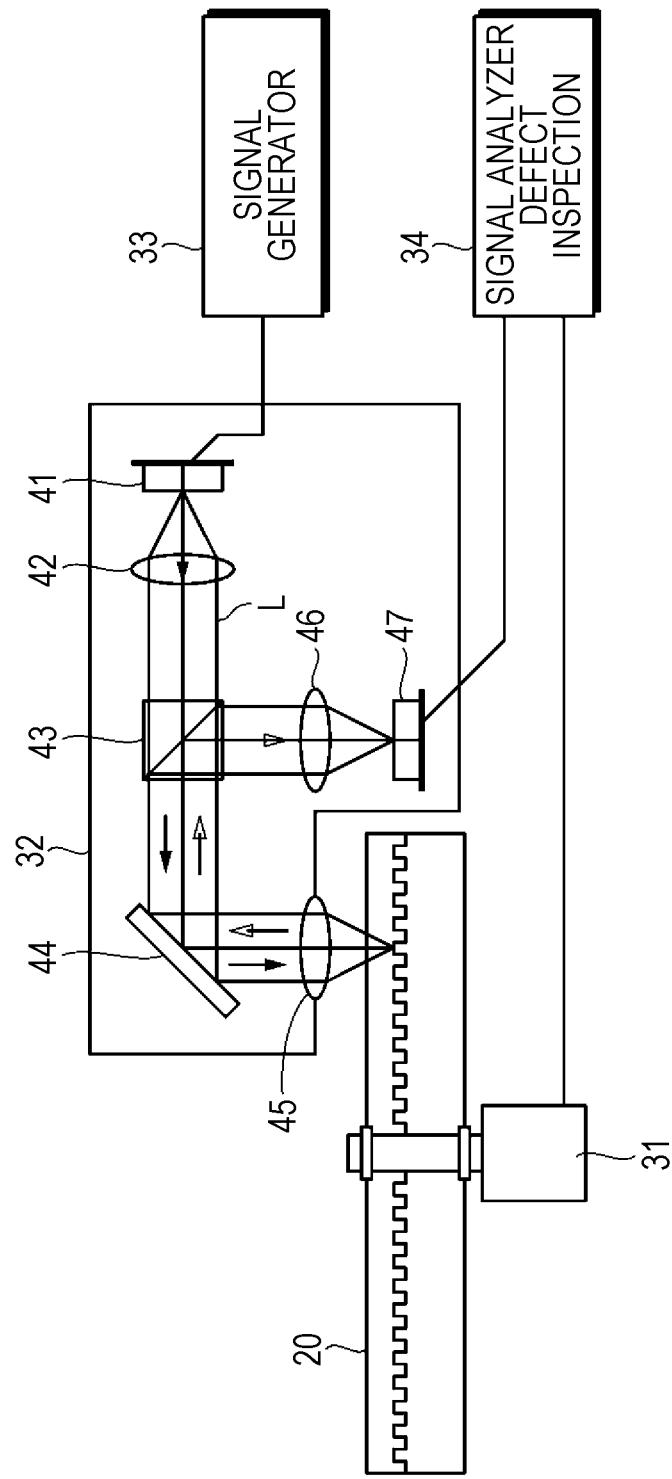
FIG. 5 is a schematic diagram showing the configuration of a disk drive-type evaluation system.

FIG. 5 shows the configuration of a disk drive type evaluation system. Hereinafter, referring to FIG. 5, a description will be given of operation and procedure, from placing an optical disk 20 to be evaluated in the disk drive type evaluation system to evaluating signals.

First, the optical disk 20 is mounted to a spindle motor unit 31 and then rotated. Light is then emitted from a laser diode 41 in a recording/reproducing optical system 32, and the laser beam L is allowed to enter a mirror 44 through a collimator lens 42 and a beam splitter 43. The laser beam L reflected by the mirror 44 is directed downward while being collected at the recording layer of the optical disk 20 through an objective lens 45.

The objective lens 45 is then operated up and down in a direction perpendicular to the light-receiving surface of the optical disk 20 (optical axial direction) so that the focal point of the laser beam L traverses the recording layer of the optical disk 20. At the time, the laser beam L reflected by the recording layer of the optical disk 20 goes backward in the path where the beam has advanced and is partially or fully reflected by the beam splitter 43 in the recording/reproducing optical system 32 to come into a photo-detector 47 through a collective lens 46. The light received by the photo-detector 47 is converted to electrical signals, which are supplied to a signal analyzer 34. The signal analyzer 34 generates a focus servo error signal, a tracking servo error signal, an RF signal, and other signals based on the electrical signals supplied from the photo-detector 47, and performs servo control and other operation based on the generated signals. For example, in focus servo control, focus servo is activated using the focus error signal, so that the laser beam is controlled to have its focal point constantly set at the recording layer. Using the tracking error signal, the laser beam is controlled to have its focal point set on the top (groove) of a guide groove on the recording layer. The state ready for information recording is attained by the process up to this point. If information signals have already been recorded on the optical disk, the information signals can be read out (reproduced) from the optical disk 20.

Information signal are recorded on the optical disk 20 in the following manner. A signal generator 33 controls laser emission from the laser diode 41 based on the information signals to be recorded on the optical disk 20. In this way, the laser beam L emitted from the laser diode 41 is applied to the recording layer of the optical disk 20 while its emission waveform is controlled. The recording layer irradiated with the laser beam L is changed by the laser energy. In the recording layer in the examples, $MnO_2$ is decomposed by the laser energy to produce $O_2$, so that the recording layer changes its refractive index and physically expands in volume. The laser beam L is adapted to supply the recording layer with energy enough to cause these changes.

Information signals are reproduced from the optical disk 20 in the following manner. In the information signal reproduction, laser beam irradiation is performed with such sufficiently low power that the recording layer of the optical disk 20 would not change even if signals are reproduced a million times from the same location and that the recorded information signals can be read out with a sufficient S/N ratio. The laser beam adapted in this manner will be referred to as the reproduction beam, and the laser power thereof will be referred to as the reproduction power. The reproduction beam applied to the recording layer of the optical disk 20 goes backward in the recording/reproducing optical system and is detected by the photo-detector 47. If information has been recorded on the recording layer of the optical disk 20, for example, light returning from the recorded part has quantity smaller than that of light from the unrecorded part. Alternatively, a certain disk is so designed that the quantity of light returning from the recorded part is larger than that from the unrecorded part. The former is called high to low recording, and the latter is called low to high recording.

The optical disks 20 of the examples are high to low recording media, which are employed for CDs, DVDs, and BDs. The light detected by the photo-detector 47 is converted to electrical signals, which are supplied to the signal analyzer 34 and evaluated for quality by the signal analyzer 34. Evaluation indices that have already been established in the field of optical disk technology include, for example, i-MLSE, modulation degree, SER (error rate), and asymmetry.

Among the above, i-MLSE and SER each indicate the quality of information extraction from RF signals. Also in the examples, signal quality was evaluated using these evaluation indices.

(Method for Evaluating Signal Characteristics)

Unless otherwise specified, in the examples, signals recorded/reproduced on/from the optical disks were evaluated in the following manner using the above BD evaluation system. Signals were consecutively recorded on five tracks with an information recording density of 32 GB per information recording layer, which is 1.28 times that of a BD (25 GB), at a double speed (7.69 m/s), and the signals on the middle track were measured. In the evaluation of signal quality, an index called i-MLSE was used, which is used for BD-XL. The wavelength of the laser beam for recording in the evaluation system was 405 nm, and the numerical aperture NA of the collective lens was 0.85. Optimum recording power Pwo was defined as recording power that allowed i-MLSE to be optimum.

Examples of the present technique will be described in the following order.

1-1. Comparison between the characteristics of Mn-based recording material and Pd-based recording material
1-2. Relationship between the valence of Mn in recording layer and signal characteristics
1-3. Recording layer with two-layer structure
1-4. Addition of additive to recording layer
1-5. Concentration of Mn in recording layer
2-1. Addition of various metal oxides to Mn-based recording layer
2-2. Concentration of Mg in Mn-based recording layer
3-1. Comparison between the characteristics of dielectric layers including various metal oxides
3-2. Relationship between storage-reliability and the ratio of components in dielectric layer ($In_2O_3$—$ZrO_2$ layer)
3-3. Relationship between storage reliability and combination of dielectric layers provided on both sides of recording layer
3-4. Relationship between storage reliability and combination of recording material and dielectric material
4-1. Addition of Ru to recording layer <1-1. Comparison Between the Characteristics of Mn-Based Recording Material and Pd-Based Recording Material>

Optical disks were prepared with a Pd-based recording material, and optical disks were also prepared with a Mn-based recording material, in which inexpensive Mn was used instead of Pd. The characteristics of these optical disks were compared.

Example 1-1

First, a 1.1-mm-thick polycarbonate substrate was formed by injection molding. A concave-convex surface having in- and on-grooves was formed on the polycarbonate substrate. Next, a Mn-based recording layer and a dielectric layer were sequentially deposited on the concave-convex surface of the polycarbonate substrate by sputtering. The features of each layer were as follows.

Mn-Based Recording Layer
Material: Mn—Cu—W—Zn—O complex oxide (Mn:Cu:W:Zn=18:8:30:44 (atomic ratio (units: at %)), thickness: 33 nm
Dielectric Layer (Optically Transparent Layer Side)
Material: ITO, thickness: 10 nm The Mn-based recording layer was formed as follows. Under an atmosphere of a mixed gas of Ar and $O_2$, Mn, Cu, W, and Zn targets were co-sputtered to form the film. In this process, the power applied to each target was controlled in such a way that the resulting Mn-based recording layer had an atomic ratio of Mn:Cu:W:Zn of 18:8:30:44. The ratio between the flow rates of Ar and $O_2$ gases was controlled in such a way that the mixed gas atmosphere had a higher oxygen concentration.

Specific conditions for forming the Mn-based recording layer were as shown below.
Ar gas flow rate: 10 to 15 sccm
$O_2$ gas flow rate: 15 to 24 sccm
Applied power: 100 to 200 W Next, an ultraviolet-curable resin was uniformly applied to the dielectric layer by spin coating. The resin was then cured by being irradiated with ultraviolet rays, so that a 100-μm-thick optically transparent layer was formed on the dielectric layer.

In this way, the desired optical disk was obtained.

Example 1-2

An optical disk was obtained as in Example 1-1, except that a dielectric layer (substrate side) was further formed between the concave-convex surface of the polycarbonate substrate and the Mn-based recording layer.
The specific features of the dielectric layer (substrate side) were as shown below.
Dielectric Layer (Substrate Side)
Material: ITO, thickness: 5 nm Comparative Example 1-1

An optical disk was obtained as in Example 1-1, except that a Pd-based recording layer was formed instead of the Mn-based recording layer.
The specific features of the Pd-based recording layer were as follows.
Pd-Based Recording Layer
Material: Pd—Cu—W—Zn—O complex oxide (Pd:Cu:W:Zn=19:3:31:47 (atomic ratio (at %))), thickness: 39 nm Comparative Example 1-2

An optical disk was obtained as in Example 1-2, except that a Pd-based recording layer was formed instead of the Mn-based recording layer.
The specific features of the Pd-based recording layer were as follows.
Pd-Based Recording Layer
Material: Pd—Cu—W—Zn—O complex oxide (Pd:Cu:W:Zn=19:3:31:47 (atomic ratio (at %))), thickness: 39 nm
(Features of Optical Disks)
Table 1 shows the features of the optical disks of Examples 1-1 and 1-2 and Comparative Examples 1-1 and 1-2. Note that Table 1 shows the ratio of only metal components (exclusive of oxygen) in each recording material.

powers around the optimum recording power Pwo, and i-MLSE data was obtained for each recording power. A graph (power margin graph) was prepared by plotting the obtained data. Note that the vertical axis represents the i-MLSE value, and the horizontal axis represents the value (Pw/Pwo) obtained by normalizing the recording power Pw by the Pwo. FIGS. 6A and 6B show the results.
The evaluation results show the following.
The bottom value of i-MLSE and the Pw/Pwo spreading in the horizontal axis direction were substantially the same between the Pd-based recording material and the Mn-based recording material. Note that the lower the bottom value of i-MLSE, the better the characteristics of the optical disk. The Pw/Pwo spreading in the horizontal axis direction is called the margin width, and the wider the margin width, the better the characteristics of the optical disk. It is therefore apparent that the initial signal-recording characteristics of the optical disk prepared with the Mn-based recording material are substantially the same as those of the optical disk prepared with the Mn-based recording material.
(Reproduction Durability)
After information signals were recorded on the optical disks, the recorded information signals were reproduced many times, and changes in signal quality were plotted against the number of times of the reproduction. FIGS. 7A and 7B show the results. In this case, i-MLSE and symbol error rate (SER) (namely, the value indicating how frequently erroneous detection of readout information occurs) were used as indices for evaluating the signal quality. The reproduction power was 1.5 mW.
The evaluation results show the following.
In the case of the Pd-based recording material, the i-MLSE was significantly degraded from when the number of times of reproduction reached about 100,000. In the case of the Mn-based recording material, however, the degradation started from when about 1,000,000 times were reached. It is apparent

TABLE 1

| Sample No. | Substrate | Dielectric layer (substrate side) | | Recording material (complex oxide) | | Dielectric layer (light-receiving side) | | | Optical characteristics | | |
|---|---|---|---|---|---|---|---|---|---|---|---|
| | | Material | Thickness [nm] | Component ratio [at %] | Thickness [nm] | Material | Thickness [nm] | Cover layer | Rg-v [%] | T [%] | Pwo [mW] |
| Example 1-1 | PC substrate | — | — | Mn:Cu:W:Zn = 18:8:30:44 | 33 | ITO | 10 | UV resin | 7.8 | 75.3 | 12 |
| Example 1-2 | PC substrate | ITO | 5 nm | Mn:Cu:W:Zn = 18:8:30:44 | 33 | ITO | 10 | UV resin | 7.4 | 75.4 | 12.5 |
| Comparative Example 1-1 | PC substrate | — | — | Pd:Cu:W:Zn = 19:3:31:47 | 39 | ITO | 10 | UV resin | 5.2 | 78.3 | 12 |
| Comparative Example 1-2 | PC substrate | ITO | 5 nm | Pd:Cu:W:Zn = 19:3:31:47 | 39 | ITO | 10 | UV resin | 5.4 | 78.5 | 14.7 |

(Evaluation of Optical Disks)
The optical disks of Example 1-1 and Comparative Example 1-1 obtained as described above were evaluated as described below.
(Evaluation of Optical Characteristics)
The reflectance and transmittance of the recording layer of each prepared optical disk were measured using the reflectance- and transmittance-measuring functions of a spectrophotometer. Table 1 shows the results.
(Evaluation of Optimum Recording Power Pwo)
The recording power at which i-MLSE was optimum was determined and called the optimum recording power Pwo. Table 1 shows the results.
(Initial Characteristics)
When the i-MLSE as an evaluation index was measured, the laser beam for signal recording was applied with different that the reproduction durability of the Mn-based recording material is significantly higher than that of the Pd-based recording material.
(Archival Characteristics)
The optical disks used in the evaluation of the initial characteristics were stored in a hot environment at 80° C. and 85% for 120 hours. Subsequently, the data region used in the evaluation of the initial characteristics was subjected to the measurement again, and changes in the i-MLSE value against the normalized value (Pw/Pwo) were evaluated again. FIGS. 8A to 9B show the results (the results of the archival test).
The evaluation results show the following.
It is apparent that slight changes in the characteristics from the initial ones were observed after the test in both the cases of the Pd-based recording material and the Mn-based recording material. It is also apparent that the degree of the changes is almost equal between the Pd-based recording material and the Mn-based recording material.

(Shelf Characteristics)

The optical disks were stored in a hot environment at 80° C. and 85% for 120 hours. Subsequently, changes in the i-MLSE value against the normalized value (Pw/Pwo) were evaluated in the same way as in the evaluation of the initial characteristics. FIGS. 8A to 9B show the results (the results of the shelf test).

Changes from the initial characteristics were clearly observed in both the cases of the Pd-based recording material and the Mn-based recording material. It is apparent, however, that the degree of the changes is almost equal between the Pd-based recording material and the Mn-based recording material.

The above evaluation results demonstrate that optical disks prepared with Mn-based recording materials can have characteristics not inferior to those of optical disks prepared with Pd-based recording materials. In terms of both cost and performance for optical disks, therefore, Mn-based recording materials are significantly advantageous over Pd-based recording materials. In terms of reproduction durability, Mn-based recording materials are also significantly advantageous over Pd-based recording materials.

<1-2. Relationship Between the Valence of Mn in Recording Layer and Signal Characteristics>

Example 2-1

An optical disk was obtained as in Example 1-2, except that a dielectric layer (substrate side), a Mn-based recording layer, and a dielectric layer (optically transparent layer side) having the features below were sequentially deposited on the concave-convex surface of the polycarbonate substrate.

The specific features of each layer were as shown below.
Dielectric Layer (Substrate Side)
Material: ITO, thickness: 5 nm
Mn-Based Recording Layer
Material: Mn—W—Zn—O (Mn:W:Zn=20:30:50 (atomic ratio)), thickness: 33 nm
Dielectric Layer (Optically Transparent Layer Side)
Material: ITO, thickness: 10 nm The Mn-based recording layer was formed as follows. Under an atmosphere of a mixed gas of Ar and $O_2$, Mn, W, and Zn targets were co-sputtered to form the film. In this process, the power applied to each target was controlled in such a way that the resulting Mn-based recording layer had an atomic ratio of Mn:W:Zn of 20:30:50. The ratio between the flow rates of Ar and $O_2$ gases was controlled in such a way that the mixed gas atmosphere had a higher oxygen concentration.

Specific conditions for forming the Mn-based recording layer were as shown below.
Ar gas flow rate: 10 to 15 sccm
$O_2$ gas flow rate: 15 to 24 sccm
Applied power: 100 to 200 W Example 2-2

An optical disk was obtained as in Example 2-1, except that the conditions for forming the Mn-based recording layer were changed as shown below so that the mixed gas atmosphere would have a lower oxygen concentration.
Ar gas flow rate: 10 to 15 sccm
$O_2$ gas flow rate: 8 to 12 sccm
Applied power: 100 to 200 W (Analysis and Evaluation)

The optical disks of Examples 2-1 and 2-2 obtained as described above were analyzed and evaluated as described below.

(Analysis of State of Mn in Recording Layer)

The state of Mn in the Mn-based recording layer of the optical disk of Example 2-1 was analyzed as described below. The spectrum of the outermost surface of the Mn-based recording layer was measured by X-ray photoelectron spectroscopy (XPS). The $2P_{3/2}$ photoelectron spectrum peak resolution was performed when the state of M in the Mn-based recording layer was determined. FIG. 10A shows the results. For reference, FIG. 10B shows $2P_{3/2}$ binding energy.

The analysis results show that part of the Mn atoms in the Mn-based recording layer are present as Mn with a valence of +4 (namely, $MnO_2$).

(Initial Characteristics)

Figure 11:
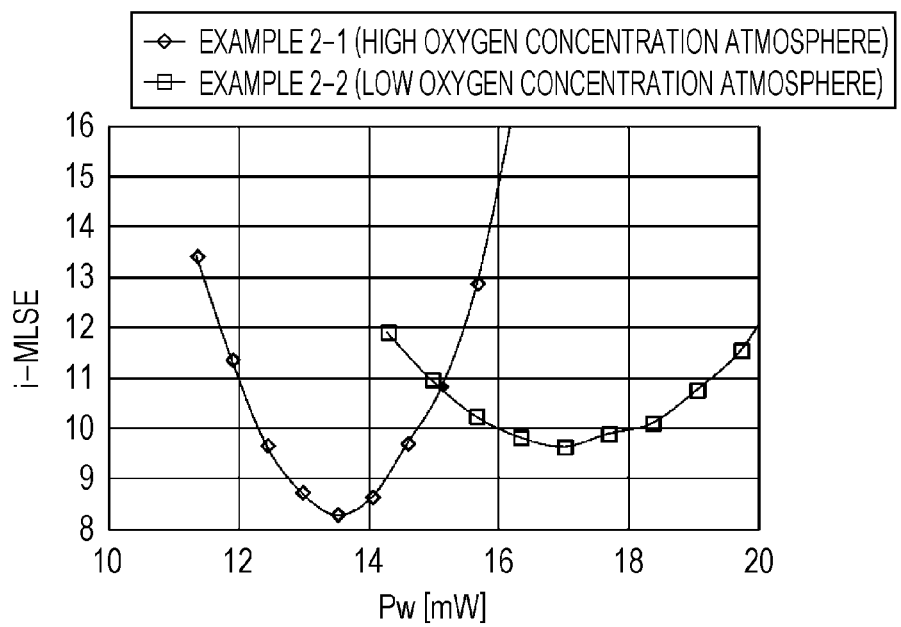
FIG. 11 is a graph showing the results of evaluation of the initial characteristics of optical disks of Examples 2-1 and 2-2.

The initial characteristics were evaluated in the same way as in Examples 1-1 and 1-2 shown above. FIG. 11 shows the results.

The evaluation results show the following. The recording sensitivity and the bottom value of i-MLSE are higher and lower, respectively, when the Mn-based recording layer is formed under the high-oxygen-content atmosphere than when the Mn-based recording layer is formed under the low-oxygen-content atmosphere. The reason for this higher recording sensitivity would be that the Mn-based recording layer formed under the high-oxygen-content atmosphere has a higher $MnO_2$ content and a higher content of Mn-based oxides with a higher valence state of Mn, so that the recording layer has a higher ability to absorb light.

<1-3. Recording Layer with Two-Layer Structure>

Example 3-1

An optical disk was obtained as in Example 1-1, except that a Mn-based recording layer and a dielectric layer (optically transparent layer side) having the features below were sequentially deposited on the concave-convex surface of the polycarbonate substrate.

The specific features of each layer were as shown below.
Mn-Based Recording Layer
Material: Mn—W—Zn—O (Mn:W:Zn=20:32:48 (atomic ratio (units: at %))), thickness: 33 nm
Dielectric Layer (Optically Transparent Layer Side)
Material: ITO, thickness: 10 nm Example 3-2

An optical disk was obtained as in Example 1-1, except that a Mn-based recording layer and a dielectric layer (optically transparent layer side) having the features below were sequentially deposited on the concave-convex surface of the polycarbonate substrate.

The specific features of each layer were as shown below.
Mn-Based Recording Layer
Material: Mn—W—Zn—O (Mn:W:Zn=18:51:31 (atomic ratio (units: at %))), thickness: 33 nm
Dielectric Layer (Optically Transparent Layer Side)
Material: ITO, thickness: 10 nm Example 3-3

An optical disk was obtained as in Example 1-2, except that a first Mn-based recording layer, a second Mn-based recording layer, and a dielectric layer (optically transparent layer side) having the features below were sequentially deposited on the concave-convex surface of the polycarbonate substrate.

The specific features of each layer were as shown below.
First Mn-Based Recording Layer
Material: Mn—W—Zn—O (Mn:W:Zn=18:51:31 (atomic ratio (units: at %))), thickness: 13 nm
Second Mn-Based Recording Layer
Material: Mn—W—Zn—O (Mn:W:Zn=20:32:48 (atomic ratio (units: at %))), thickness: 10 nm
Dielectric Layer (Optically Transparent Layer Side)
Material: ITO, thickness: 10 nm
(Initial Characteristics)

Figure 12:
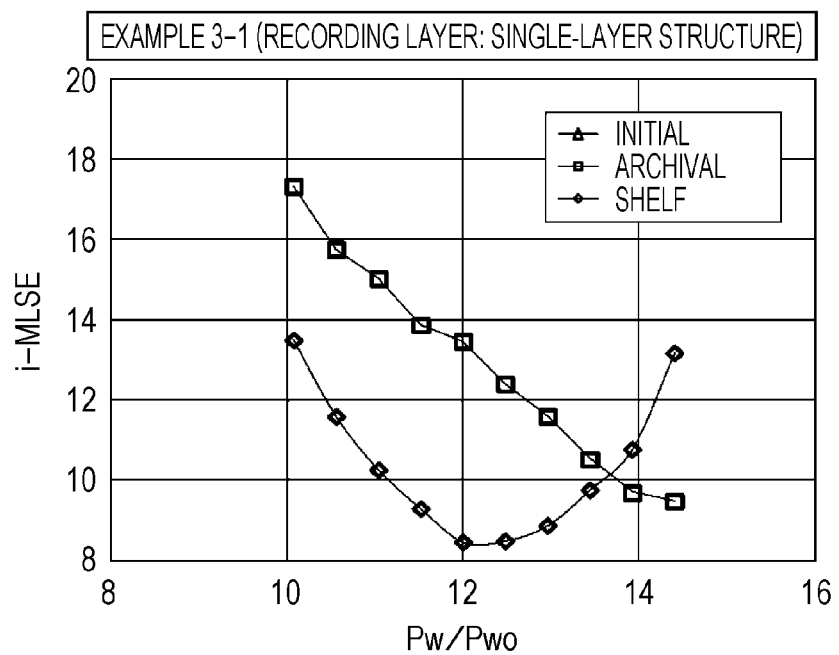
FIG. 12 is a graph showing the results of evaluation of the initial, archival, and shelf characteristics of an optical disk of Example 3-1.
Figure 13:
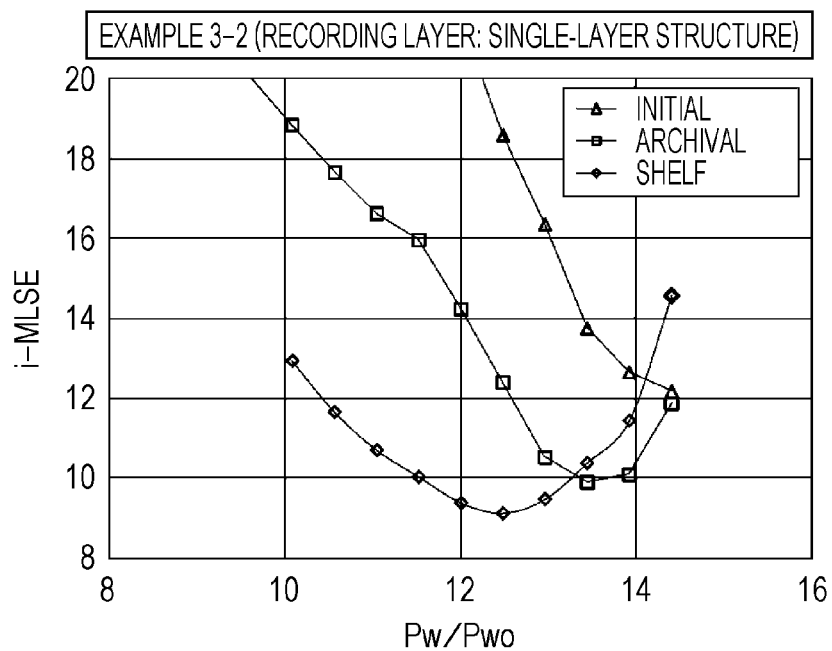
FIG. 13 is a graph showing the results of evaluation of the initial, archival, and shelf characteristics of an optical disk of Example 3-2.
Figure 14:
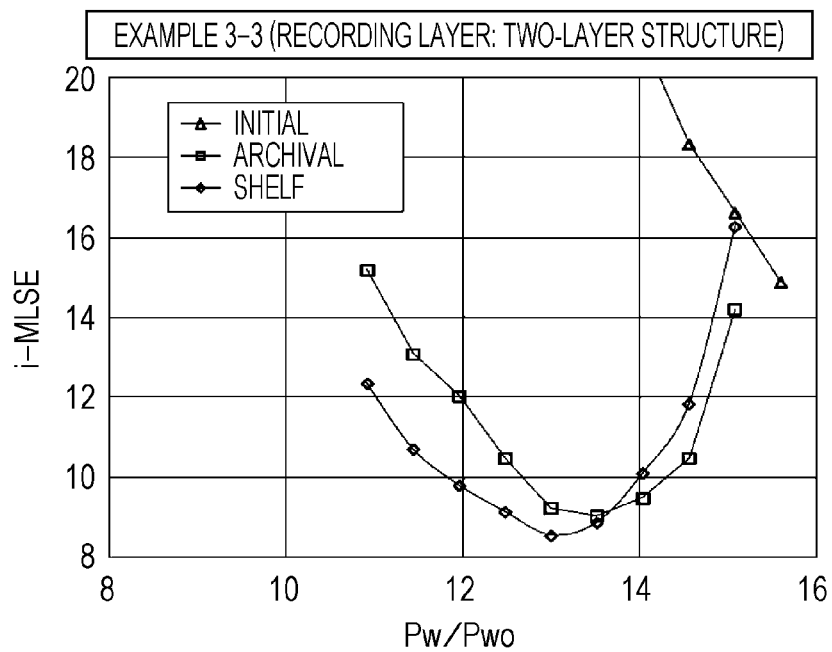
FIG. 14 is a graph showing the results of evaluation of the initial, archival, and shelf characteristics of an optical disk of Example 3-3.

The initial characteristics of the optical disks of Examples 3-1 to 3-3 obtained as described above were evaluated in the same way as in Examples 1-1 and 1-2 shown above. FIGS. 12 to 14 show the results. FIG. 12 does not show the results of the evaluation of the shelf characteristics because in Example 3-1, the results of the evaluation of the shelf characteristics were out of the range shown in the graph.

The evaluation results show the following.

In Example 1-1, the bottom value of i-MLSE for the initial characteristics is low and good, but the shelf characteristics are significantly degraded.

In Example 2-1, the bottom value of i-MLSE for the initial characteristics tends to be slightly worse than that in Example 1-1, but the shelf characteristics are significantly higher than those in Example 1-1.

In Example 2-3, the bottom value of i-MLSE for the initial characteristics is low and good, and the shelf characteristics are higher than those in Example 1-1.

Therefore, the use of a Mn-based recording layer with a two-layer structure makes it possible to improve RF signal characteristics, which has been difficult to achieve with a single-layer structure.

<1-4. Addition of Additive to Recording Layer>

Example 4-1

An optical disk was obtained as in Example 1-2, except that a dielectric layer (substrate side), a Mn-based recording layer, and a dielectric layer (optically transparent layer side) having the features below were sequentially deposited on the concave-convex surface of the polycarbonate substrate.

The specific features of each layer were as shown below.
Dielectric Layer (Substrate Side)
Material: ITO, thickness: 5 nm
Mn-Based Recording Layer
Material: Mn—W—Zn—O (Mn:W:Zn=19:32:49 (atomic ratio (units: at %))), thickness: 40 nm
Dielectric Layer (Optically Transparent Layer Side)
Material: ITO, thickness: 10 nm Example 4-2

An optical disk was obtained as in Example 4-1, except that the Mn-based recording layer had the following features.
Mn-Based Recording Layer
Material: Mn—W—Zn—Bi—O (Mn:W:Zn:Bi=11:20:29:40 (atomic ratio (units: at %))), thickness: 40 nm The Mn-based recording layer was formed as follows. Under an atmosphere of a mixed gas of Ar and $O_2$, Mn, W, Zn, and Bi targets were co-sputtered to form the film. In this process, the power applied to each target was controlled in such a way that the resulting Mn-based recording layer had the Mn/W/Zn/Bi atomic ratio shown above.

Example 4-3

An optical disk was obtained as in Example 4-1, except that the Mn-based recording layer had the following features.
Mn-Based Recording Layer
Material: Mn—W—Zn—Cu—O (Mn:W:Zn:Cu=18:30:44:8 (atomic ratio (units: at %))), thickness: 40 nm The Mn-based recording layer was formed as follows. Under an atmosphere of a mixed gas of Ar and $O_2$, Mn, W, Zn, and Cu targets were co-sputtered to form the film. In this process, the power applied to each target was controlled in such a way that the resulting Mn-based recording layer had the Mn/W/Zn/Cu atomic ratio shown above.
(Initial Characteristics)

Figure 15:
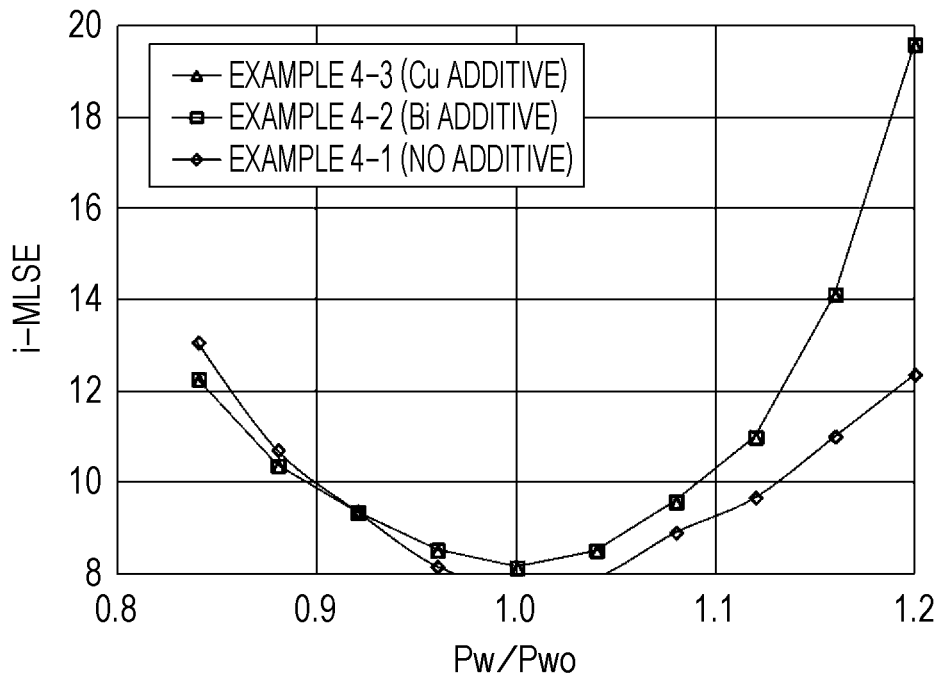
FIG. 15 is a graph showing the results of evaluation of the initial characteristics of optical disks of Examples 4-1 to 4-3.

The initial characteristics of the optical disks of Examples 4-1 to 4-3 obtained as described above were evaluated in the same way as in Examples 1-1 and 1-2 shown above. FIG. 15 shows the results.

The evaluation results show the following.

When Bi or Cu is added, no reduction in the bottom value of i-MLSE is observed. On the other hand, when Bi or Cu is added, the resulting power margin (width) has a sufficient range for practical use although a slight reduction in the power margin is observed. For example, if a Pw/Pwo range of ±0.15% is achieved under 15% i-MLSE threshold, the power margin will be wide enough for practical use.

Therefore, even when Bi or Cu is added to Mn-based recording materials, substantially the same level of signal characteristics can be obtained. Even when both Bi and Cu are added to Mn-based recording materials, the same advantageous effects would be obtained. In addition, even when at least one metal element other than Bi and Cu, for example, at least one metal element selected from the group consisting of Sn, Zn, Ge, Co, W, and Al is added to Mn-based recording materials, the same advantageous effects would be obtained.

<1-5. Concentration of Mn in Recording Layer>

Example 5-1

An optical disk was obtained as in Example 1-2, except that a dielectric layer (substrate side), a Mn-based recording layer, and a dielectric layer (optically transparent layer side) having the features below were sequentially deposited on the concave-convex surface of the polycarbonate substrate.

The specific features of each layer were as shown below.
Dielectric Layer (Substrate Side)
Material: ITO, thickness: 5 nm
Mn-Based Recording Layer
Material: Mn—W—Zn—O (Mn:W:Zn=12:35:53 (atomic ratio (units: at %))), thickness: 40 nm
Dielectric Layer (Optically Transparent Layer Side)
Material: ITO, thickness: 10 nm Example 5-2

An optical disk was obtained as in Example 5-1, except that the Mn-based recording layer had the following features.
Mn-Based Recording Layer
Material: Mn—W—Zn—O (Mn:W:Zn:Cu=24:30:46 (atomic ratio (units: at %))), thickness: 40 nm Example 5-3

An optical disk was obtained as in Example 5-1, except that the Mn-based recording layer had the following features.
Mn-Based Recording Layer
Material: Mn—W—Zn—O (Mn:W:Zn:Cu=43:23:34 (atomic ratio (units: at %))), thickness: 40 nm

Example 5-4

An optical disk was obtained as in Example 5-1, except that the Mn-based recording layer had the following features.
Mn-Based Recording Layer
Material: Mn—O (Mn=100 (atomic ratio of a metal (units: at %))), thickness: 12 nm
(Evaluation)
The optical disks of Examples 5-1 to 5-4 obtained as described above were evaluated as described below.
(Evaluation of Optimum Recording Power Pwo)
The optimum recording power Pwo was evaluated as in Examples 1-1 and 1-2 shown above. Table 2 shows the results.
Table 2 shows the results of the evaluation of the optimum recording power Pwo of the optical disks of Examples 5-1 to 5-4.

TABLE 2

| Sample No. | Mn concentration [at %] | Pwo [mW] |
|---|---|---|
| Example 5-1 | 12 | 35 |
| Example 5-2 | 24 | 15 |
| Example 5-3 | 43 | 9.5 |
| Example 5-4 | 100 | 8.7 |

Figure 16:
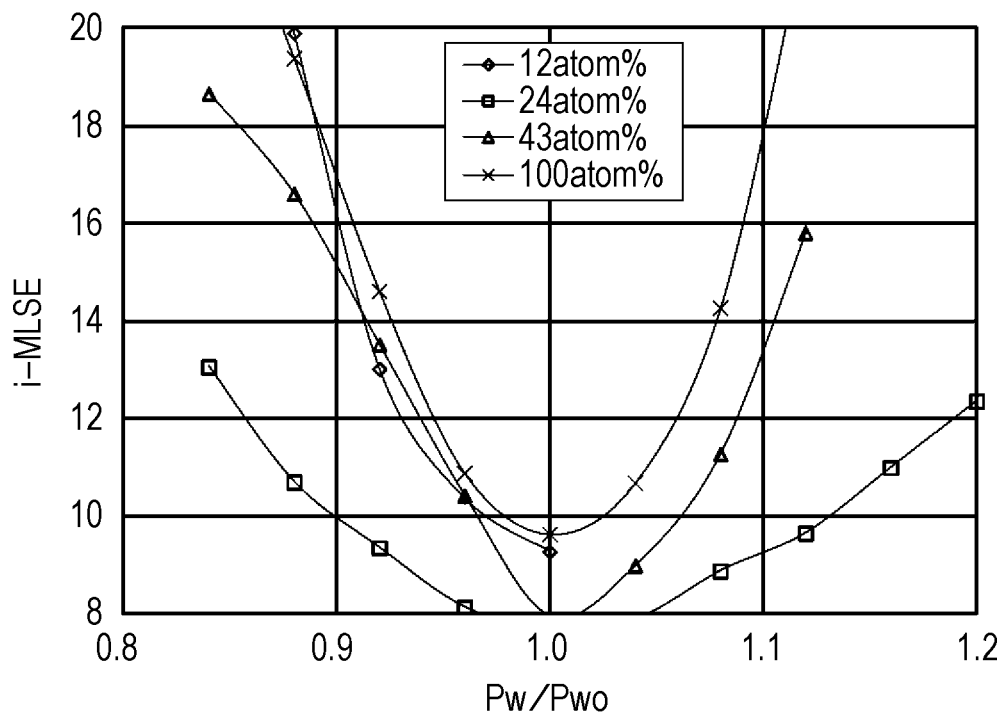
FIG. 16 is a graph showing the results of evaluation of the initial characteristics of optical disks of Examples 5-1 to 5-4.
Figure 17:
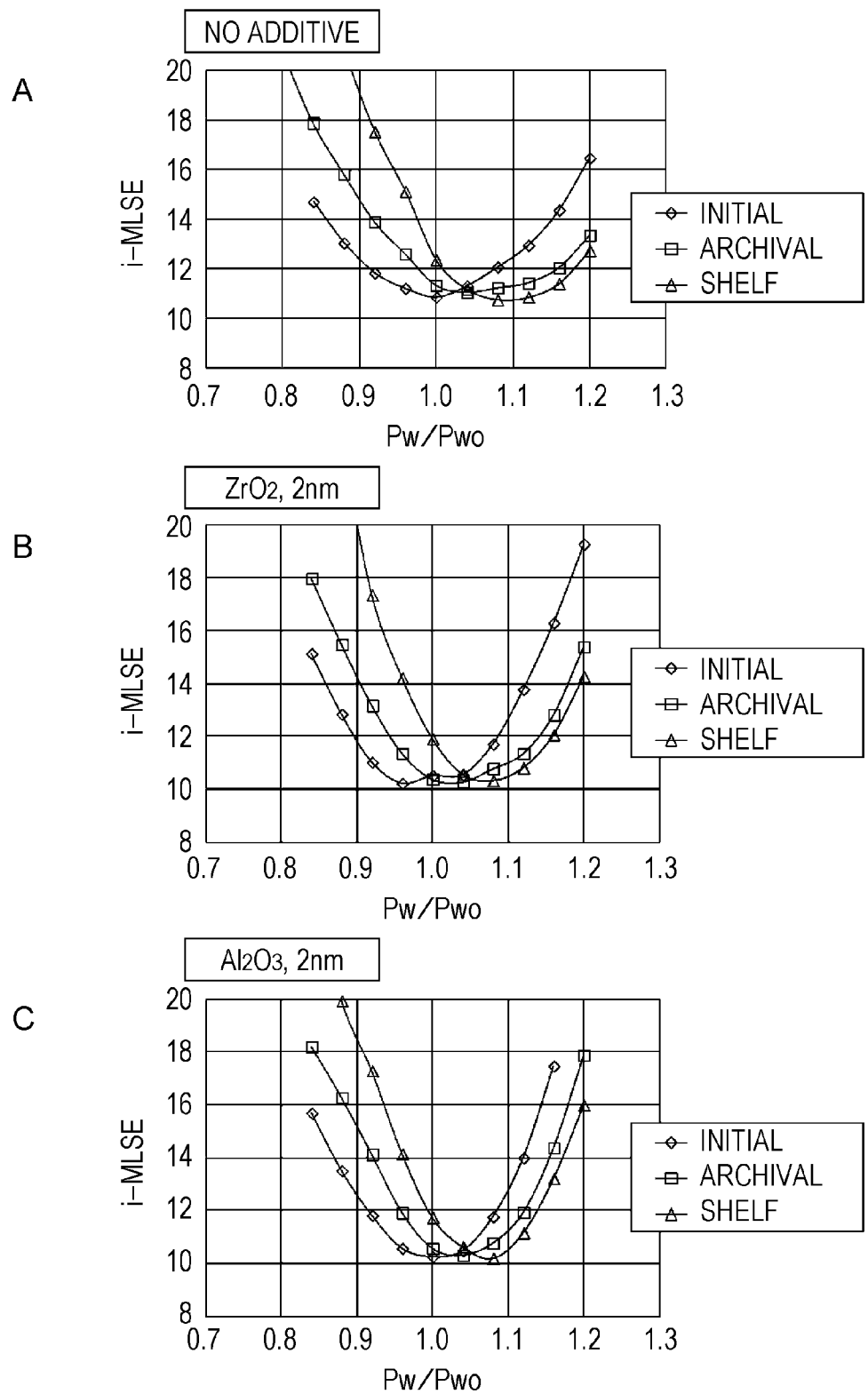
FIG. 17A is a graph showing the results of evaluation of the initial, archival, and shelf characteristics of an optical disk of Example 6-1.
FIGS. 17B and 17C are graphs showing the results of evaluation of the initial, archival, and shelf characteristics of optical disks of Examples 7-1 and 7-2, respectively.
Figure 18:
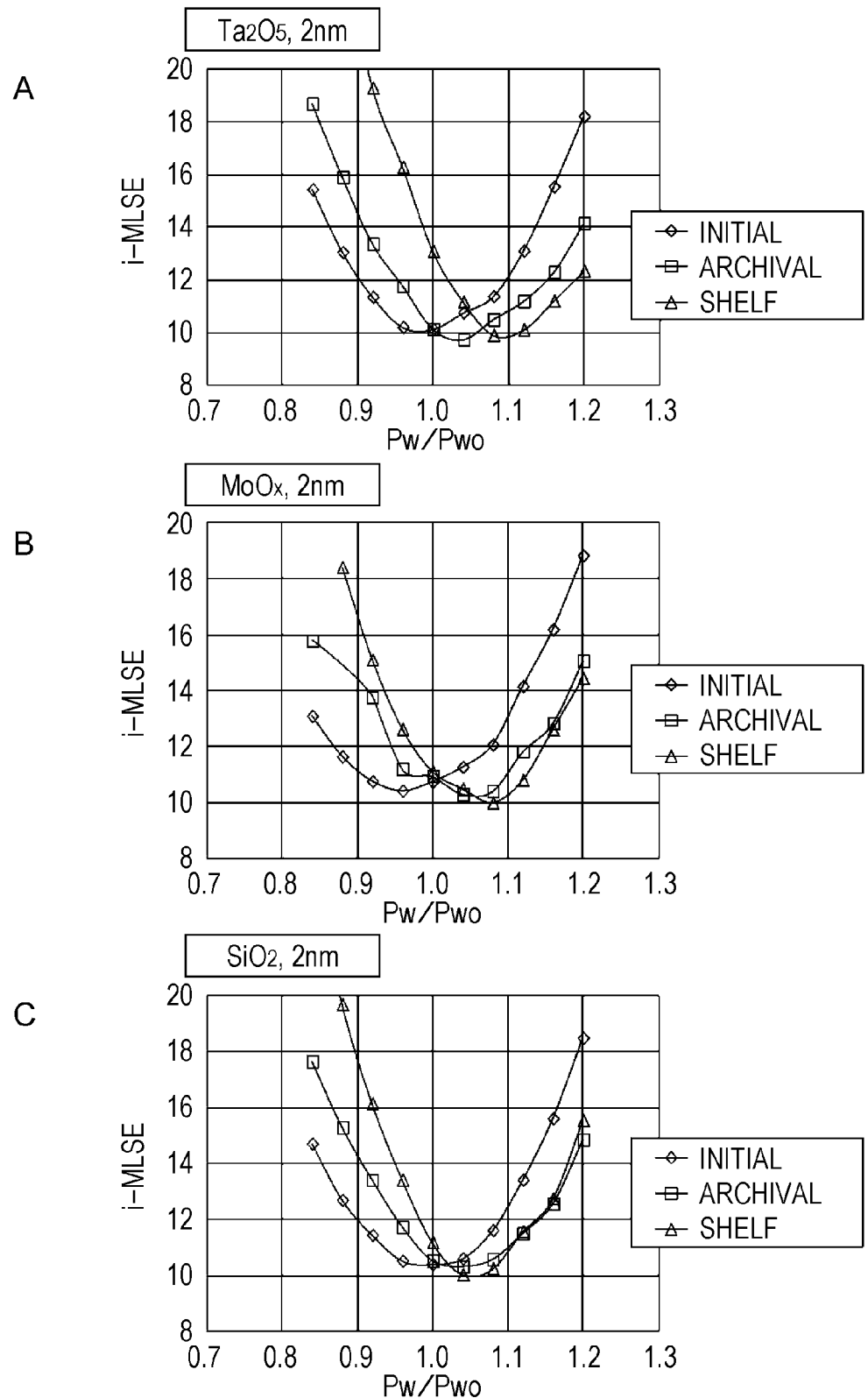
FIGS. 18A to 18C are graphs showing the results of evaluation of the initial, archival, and shelf characteristics of optical disks of Examples 7-3 to 7-5, respectively.
Figure 19:
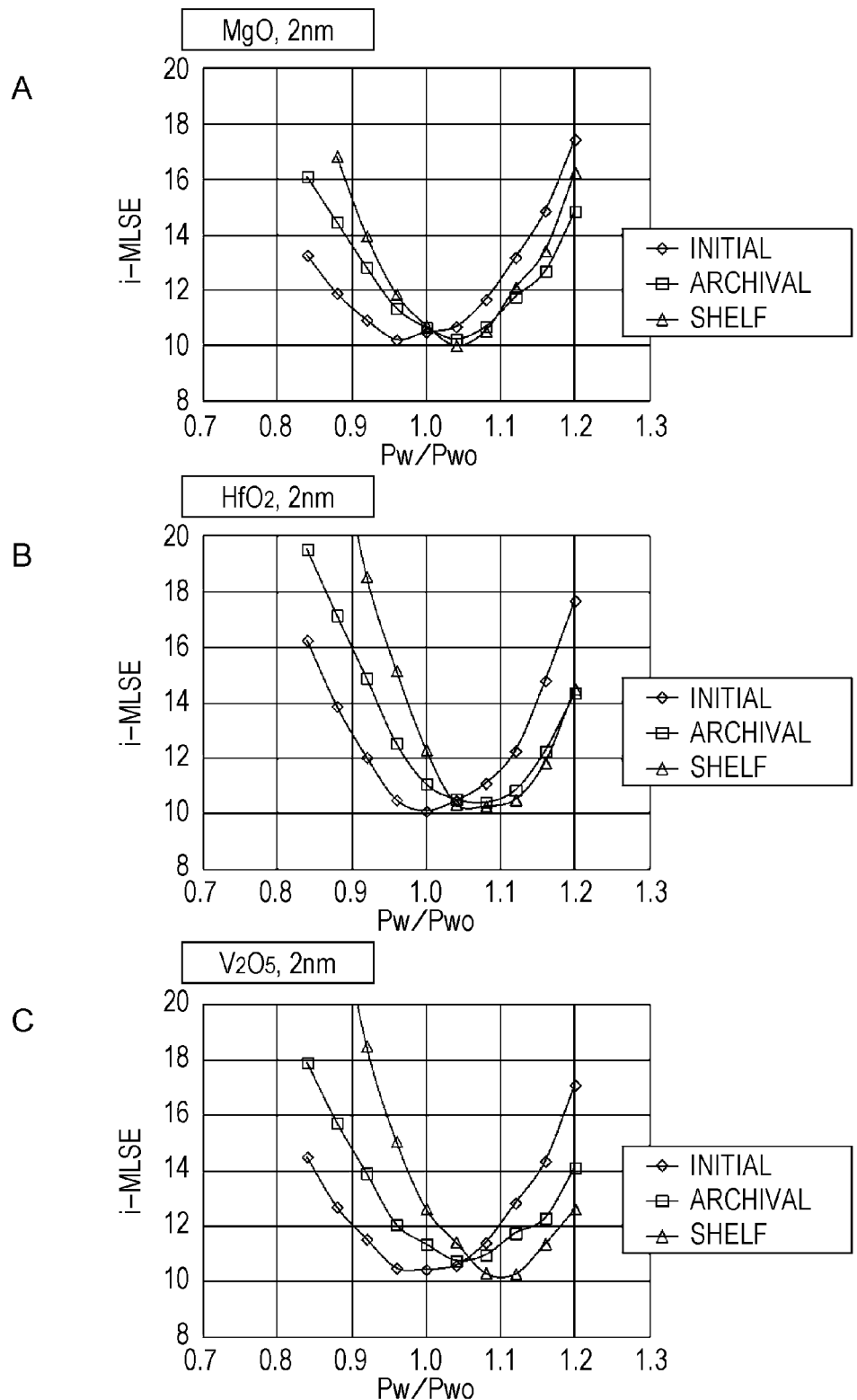
FIGS. 19A to 19C are graphs showing the results of evaluation of the initial, archival, and shelf characteristics of optical disks of Examples 7-6 to 7-8, respectively.
Figure 20:
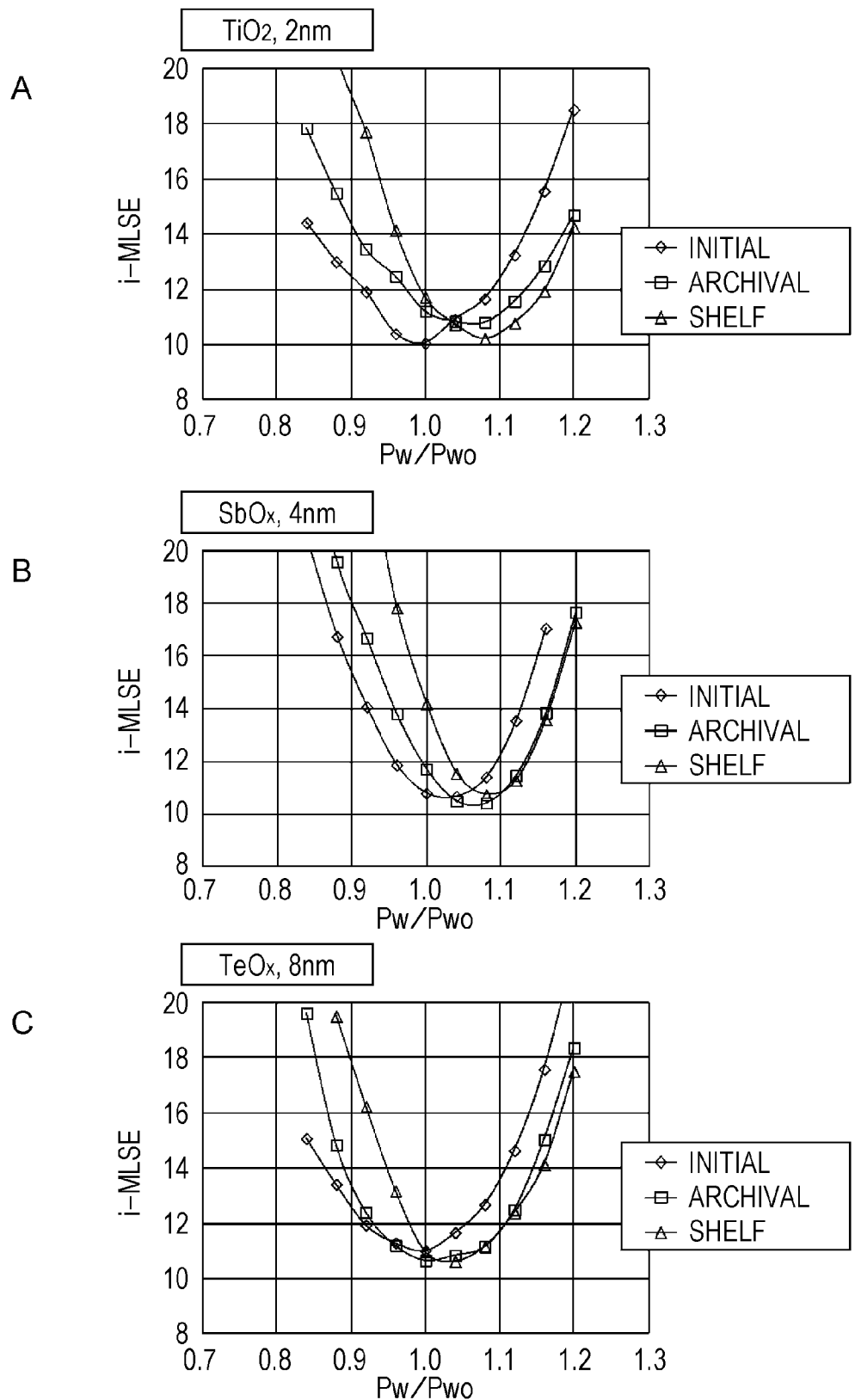
FIGS. 20A to 20C are graphs showing the results of evaluation of the initial, archival, and shelf characteristics of optical disks of Examples 7-9 to 7-11, respectively.
Figure 21:
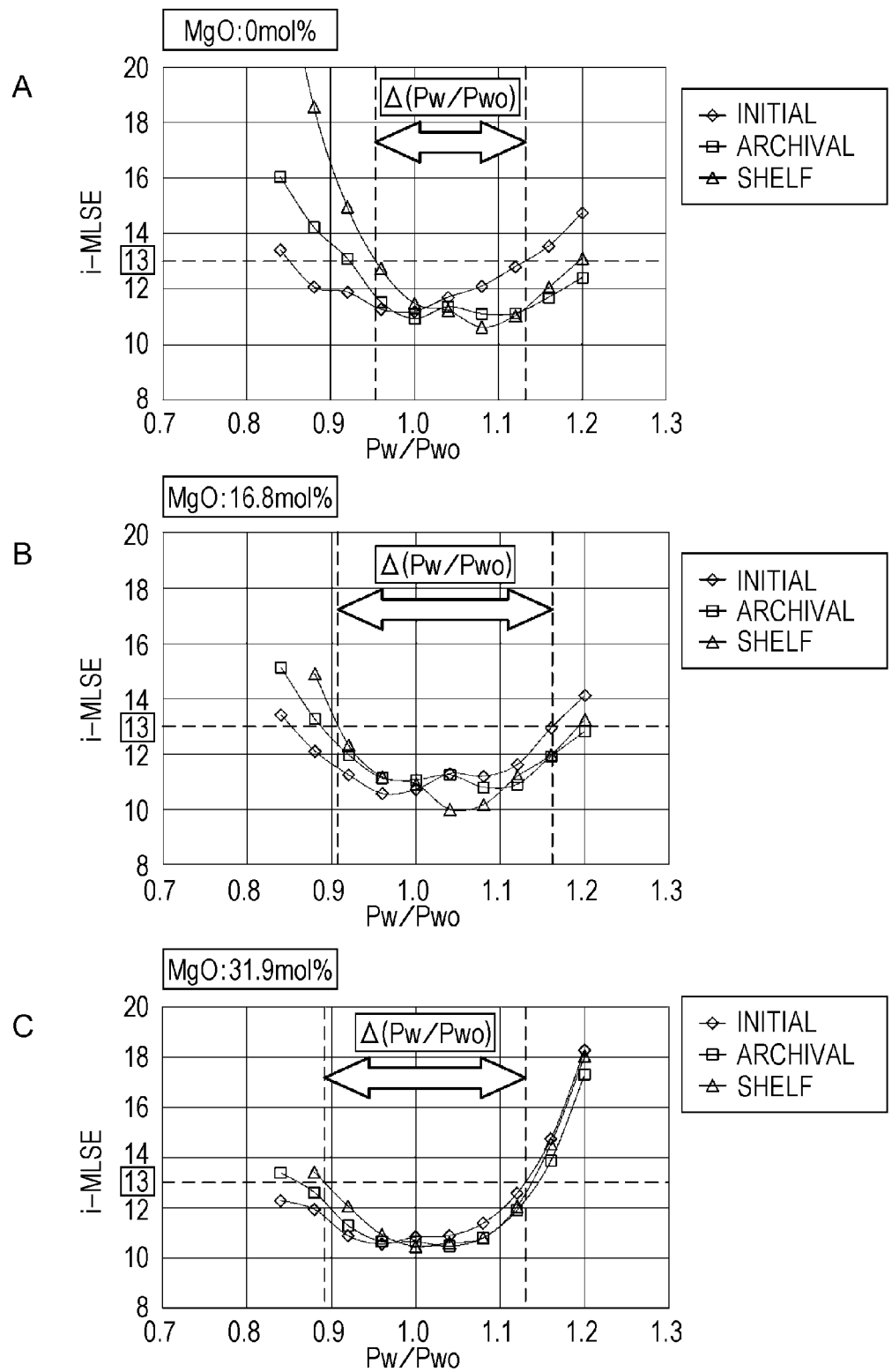
FIGS. 21A to 21C are graphs showing the results of evaluation of the initial, archival, and shelf characteristics of optical disks of Examples 8-1 to 8-3, respectively.
Figure 22:
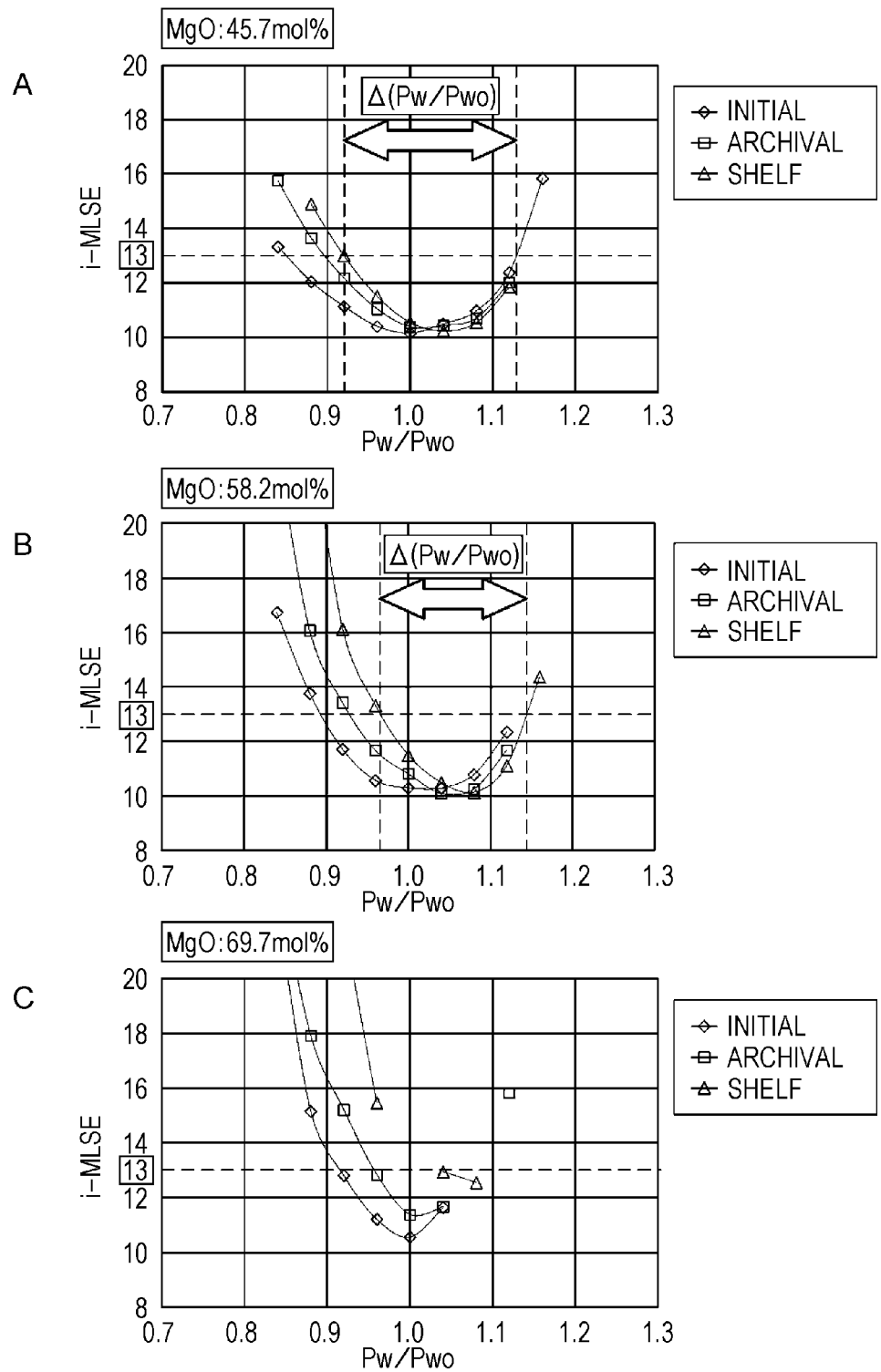
FIGS. 22A to 22C are graphs showing the results of evaluation of the initial, archival, and shelf characteristics of optical disks of Examples 8-4 to 8-6, respectively.

(Initial Characteristics)
The initial characteristics were evaluated in the same way as in Examples 1-1 and 1-2 shown above. FIG. 16 shows the results.
The evaluation results show the following.
The bottom value of i-MLSE and the power margin (width) vary depending on the Mn concentration.
The bottom value of i-MLSE is good when the concentration of Mn in the Mn-based recording layer falls within the range of 12 at % to 100 at %. The power margin (width) also has a promising range for practical use although a slight decreasing tendency is observed in the range.

<2-1. Addition of Various Metal Oxides to Mn-Based Recording Layer>

An optical disk was prepared with a Mn-based recording material including $MnO_x$—$WO_3$—ZnO. Optical disks were also prepared with materials produced by adding a certain amount (by volume ratio) of metal oxide (an oxide of Zr, Al, Ta, Mo, Si, Mg, Hf, V, Ti, Sb, or Te) to the Mn-based recording material. A comparison was made on the effect of the added oxide.

Example 6-1

An optical disk was obtained as in Example 1-1, except that a dielectric layer (substrate side), a Mn-based recording layer, and a dielectric layer (optically transparent layer side) having the features below were sequentially deposited on the concave-convex surface of the polycarbonate substrate.
Dielectric Layer (Substrate Side)
Material: ITO, thickness: 10 nm
Mn-Based Recording Layer
Material: Mn—W—Zn—O complex oxide (Mn:W:Zn=18:8:30:44 (atomic ratio (units: at %))), thickness: 33 nm
Dielectric Layer (Optically Transparent Layer Side)
Material: ITO, thickness: 10 nm
The Mn-based recording layer was formed as follows. Under an atmosphere of a mixed gas of Ar and $O_2$, Mn, W, and Zn targets were co-sputtered to form the film. The power applied to each target was controlled in such a way that a component ratio (atomic ratio) of Mn:W:Zn of 23:31:46 (units: at %) was obtained after the co-sputtering. The ratio between the flow rates of Ar and $O_2$ gases was controlled in such a way that the mixed gas atmosphere had a higher oxygen concentration.
Specific conditions for forming the Mn-based recording layer were as shown below.
Ar gas flow rate: 10 to 15 sccm
$O_2$ gas flow rate: 15 to 24 sccm
Applied power: 100 to 200 W

Examples 7-1 to 7-11

Optical disks were obtained as in Example 6-1, except that various metal oxides ($MeO_x$) were added to the Mn-based recording layer, respectively. Hereinafter, the Mn-based recording layer containing any of various metal oxides ($MeO_x$) is referred to as the Mn-Me-based recording layer. The Mn-based recording material containing any of various metal oxides ($MeO_x$) is also referred to as the Mn-Me-based recording material.
The specific features of the Mn-Me-based recording layer were as shown below.
Material: $MnO_x$—$WO_3$—ZnO-$MeO_x$ (Mn:W:Zn:Me=22.0-23.3:27.7-29.4:41.6-44.1:3.3-8.6 (atomic ratio (units: at %)))
Added metal (Me): Zr, Al, Ta, Mo, Si, Mg, Hf, V, Ti, Sb, or Te
Thickness: 33 nm
The Mn-Me-based recording layer was formed under the following conditions. Any of various metal oxides ($MeO_x$) was added by co-sputtering in such a way that a Mn-Me recording layer containing 6% by volume of any of various metal oxides ($MeO_x$) was formed. Specifically, any of various metal oxides ($MeO_x$) was added by co-sputtering in such a way that a 33-nm-thick Mn-Me-based recording layer containing the Mn-Me-based recording material in an amount corresponding to a thickness of 2 nm was formed.
(Features of Optical Disks)
Table 3 shows the features of the optical disks of Examples 6-1 and 7-1 to 7-11. Note that Table 3 shows the ratio of only metal components (exclusive of oxygen) in the Mn-based and Mn-Me-based recording materials.

TABLE 3

| Sample No. | Recording material composition [at %] |
|---|---|
| Example 6-1 | Mn:W:Zn = 23.0:31.0:46.0 |
| Example 7-1 | Mn:W:Zn:Zr = 23.0:29.0:43.5:4.5 |
| Example 7-2 | Mn:W:Zn:Al = 22.5:28.4:42.6:6.5 |
| Example 7-3 | Mn:W:Zn:Ta = 23.1:29.2:43.8:4.0 |
| Example 7-4 | Mn:W:Zn:Mo = 23.3:29.4:44.1:3.3 |
| Example 7-5 | Mn:W:Zn:Si = 23.2:29.3:43.9:3.7 |
| Example 7-6 | Mn:W:Zn:Mg = 22.0:27.7:41.6:8.6 |
| Example 7-7 | Mn:W:Zn:Hf = 23.0:29.0:43.5:4.6 |
| Example 7-8 | Mn:W:Zn:V = 23.2:29.2:43.9:3.7 |
| Example 7-9 | Mn:W:Zn:Ti = 22.8:28.8:43.2:5.2 |
| Example 7-10 | Mn:W:Zn:Sb = 23.1:29.2:43.8:3.9 |
| Example 7-11 | Mn:W:Zn:Te = 23.2:29.3:43.9:3.6 |

(Initial Characteristics)
The initial characteristics were evaluated in the same way as in Examples 1-1 and 1-2 shown above. FIGS. 17A to 20C show the results.
(Archival Characteristics)
The optical disks used in the evaluation of the initial characteristics were stored in a thermo-hygrostat chamber at 80° C. and 85% for 200 hours. Subsequently, the data region used in the evaluation of the initial characteristics was subjected to the measurement again, and changes in the i-MLSE value against the normalized value (recording power Pw/optimum recording power Pwo) were evaluated again. FIGS. 17A to 20C show the results (the results of the archival test).

(Shelf Characteristics)

The prepared optical disks were stored in a thermo-hygrostat chamber at 80° C. and 85% for 200 hours. Subsequently, changes in the i-MLSE value against the normalized value (recording power Pw/optimum recording power Pwo) were evaluated in the same way as in the evaluation of the initial characteristics. FIGS. 17A to 20C show the results (the results of the shelf test).

FIG. 17A shows the results of the evaluation of the initial, archival, and shelf characteristics of the optical disk of Example 6-1 prepared using the Mn-based recording layer. The evaluation results show the following.

The recording power at the position of the bottom of the i-MLSE after the archival test is about 5% greater than that at the position of the bottom of the initial i-MLSE.

The recording power (Pw/Pwo) at the position of the bottom of the i-MLSE after the shelf test is about 10% greater than that at the position of the bottom of the initial i-MLSE.

A comparison between the initial i-MLSE and the i-MLSE after the shelf test at the position Pw/Pwo=0.9 shows that the i-MLSE after the shelf test is about 7% worse than the initial i-MLSE.

It is desirable that both the i-MLSE values after the archival test and the shelf test are equal to the initial i-MLSE value. Unfortunately, when the optical disk has ITO dielectric layers provided on both sides of the Mn-based recording layer, it is difficult to prevent environmental test-induced changes in the i-MLSE of the optical disk.

FIGS. 17B to 20C show the results of the evaluation of the initial, archival, and shelf characteristics of the optical disks of Examples 7-1 to 7-11 prepared using the Mn-Me-based recording layer. The evaluation results show the following.

The optical disks of Examples 7-4, 7-5, 7-6, and 7-11 contain $MoO_x$, $SiO_2$, MgO, and $TeO_x$, respectively, as the metal oxide ($MeO_x$). The changes between the initial i-MLSE of these optical disks and the i-MLSE after the archival test and the shelf test are smaller than those in the i-MLSE of the optical disk of Example 6-1 to which the metal oxide ($MeO_x$) is not added. The same advantageous effect would be obtained also when a combination of two or more selected from the group consisting of $MoO_x$, $SiO_2$, MgO, and $TeO_x$ is used as the metal oxide ($MeO_x$).

On the other hand, the optical disks of Examples 7-1 to 7-3 and 7-7 to 7-10 contain the metal oxide ($MeO_x$) other than the above. The changes between the initial i-MLSE of these optical disks and the i-MLSE after the archival test and the shelf test are at the same level as that in the case of the optical disk of Example 6-1 to which the metal oxide ($MeO_x$) is not added.

Among the optical disks of Examples 7-4, 7-5, 7-6, and 7-11 to which $MoO_x$, $SiO_2$, MgO, and $TeO_x$ are added, respectively, in particular, the changes from the initial characteristics are significantly suppressed in the optical disk of Example 7-6, to which MgO is added.

Among the optical disks of Examples 7-4, 7-5, and 7-11 to which $MoO_x$, $SiO_2$, and $TeO_x$ are added, respectively, the changes from the initial characteristics are more suppressed in the optical disk of Example 7-4, to which $MoO_x$ is added.

In view of all these results, the metal oxide ($MeO_x$) that may be added to the Mn-based recording layer for the purpose of improving storage reliability while maintaining the RF signal characteristics is preferably an oxide of at least one metal element selected from the group of Mg, Mo, Si, and Te, more preferably an oxide of at least one metal element selected from the group consisting of Mo, Si, and Te, most preferably an oxide of Mg.

<2-2. Concentration of Mg in Mn-Based Recording Layer>

The results of the study in the section 2-1 show that MgO is most effective in improving storage reliability. It was examined how the storage reliability varied with the amount of added MgO.

Examples 8-1 to 8-6

Optical disks were obtained as in Example 6-1, except that the recording layer formed was a Mn—Mg-based recording layer having the following features.

Material: $MnO_x$—$WO_2$—ZnO—MgO (Mn:W:Zn:Mg=13.3-16.8:6.8-33.3:10.2-49.9:0-69.7 (atomic ratio (units: at %))), thickness: 33 nm The Mn—Mg-based recording layer was formed as follows. Under an atmosphere of a mixed gas of Ar and $O_2$, Mn, W, Zn, and Mg targets were co-sputtered to form the film. In this process, the component ratio of Mn, Mg, W, and Zn was controlled as follows. The Mn content was kept constant, and the contents of W and Zn were kept constant in such a way that W:Zn=40:60 (atom %). The Mg content was changed on the condition that the sum of the metal element ratios in WZnO and MgO is constant. The Mn ratio is made lower than that in Examples 6-1 and 7-1 to 7-11 (see Table 3). This is a measure against the fact that as the Mg content increases, the optimum Mn content for RF signal characteristics shifts to the lower side.

(Features of Optical Disks)

Table 4 shows the features of the optical disks of Examples 8-1 to 8-6. Note that Table 4 shows the ratio of only metal components (exclusive of oxygen) in each Mn—Mg-based recording material.

TABLE 4

| Sample No. | Recording material composition [at %] |
|---|---|
| Example 8-1 | Mn:W:Zn:Mg = 16.8:33.3:49.9:0.0 |
| Example 8-2 | Mn:W:Zn:Mg = 16.0:26.9:40.3:16.8 |
| Example 8-3 | Mn:W:Zn:Mg = 15.2:21.2:31.7:31.9 |
| Example 8-4 | Mn:W:Zn:Mg = 14.5:15.9:23.9:45.7 |
| Example 8-5 | Mn:W:Zn:Mg = 13.9:11.2:16.7:58.2 |
| Example 8-6 | Mn:W:Zn:Mg = 13.3:6.8:10.2:69.7 |

(Initial, Archival, and Shelf Characteristics)

The initial, archival, and shelf characteristics of the optical disks of Examples 8-1 to 8-6 obtained as described above were evaluated in the same way as for the optical disks of Examples 6-1 and 7-1 to 7-11 shown above. FIGS. 21A to 22C show the results.

Figure 23:
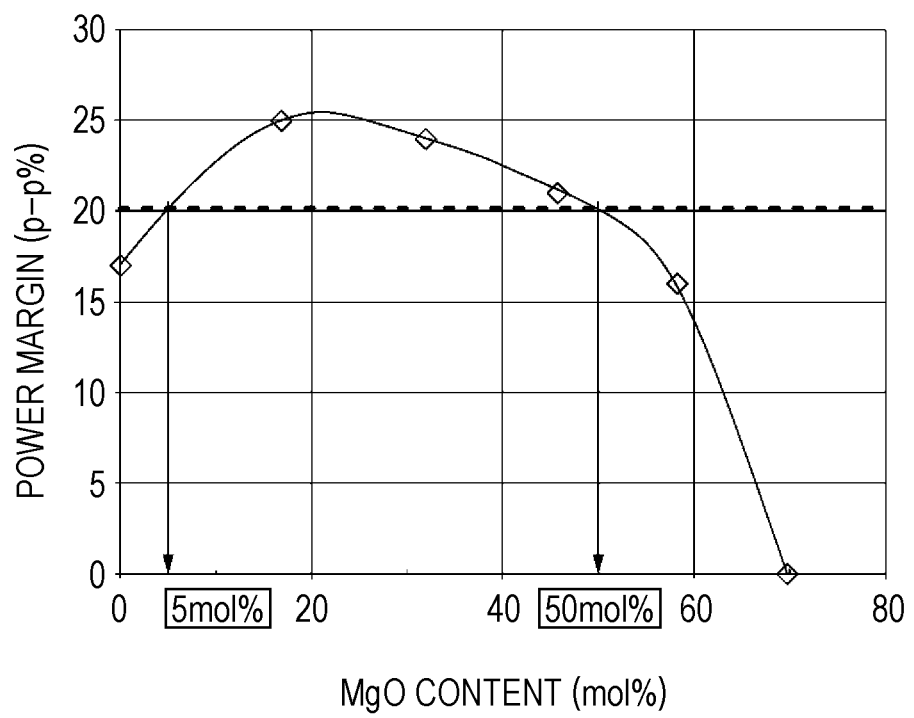
FIG. 23 is a graph showing the results of evaluation of the power margin Δ (Pw/Pwo) for optical disks of Examples 8-1 to 8-6.
Figure 24:
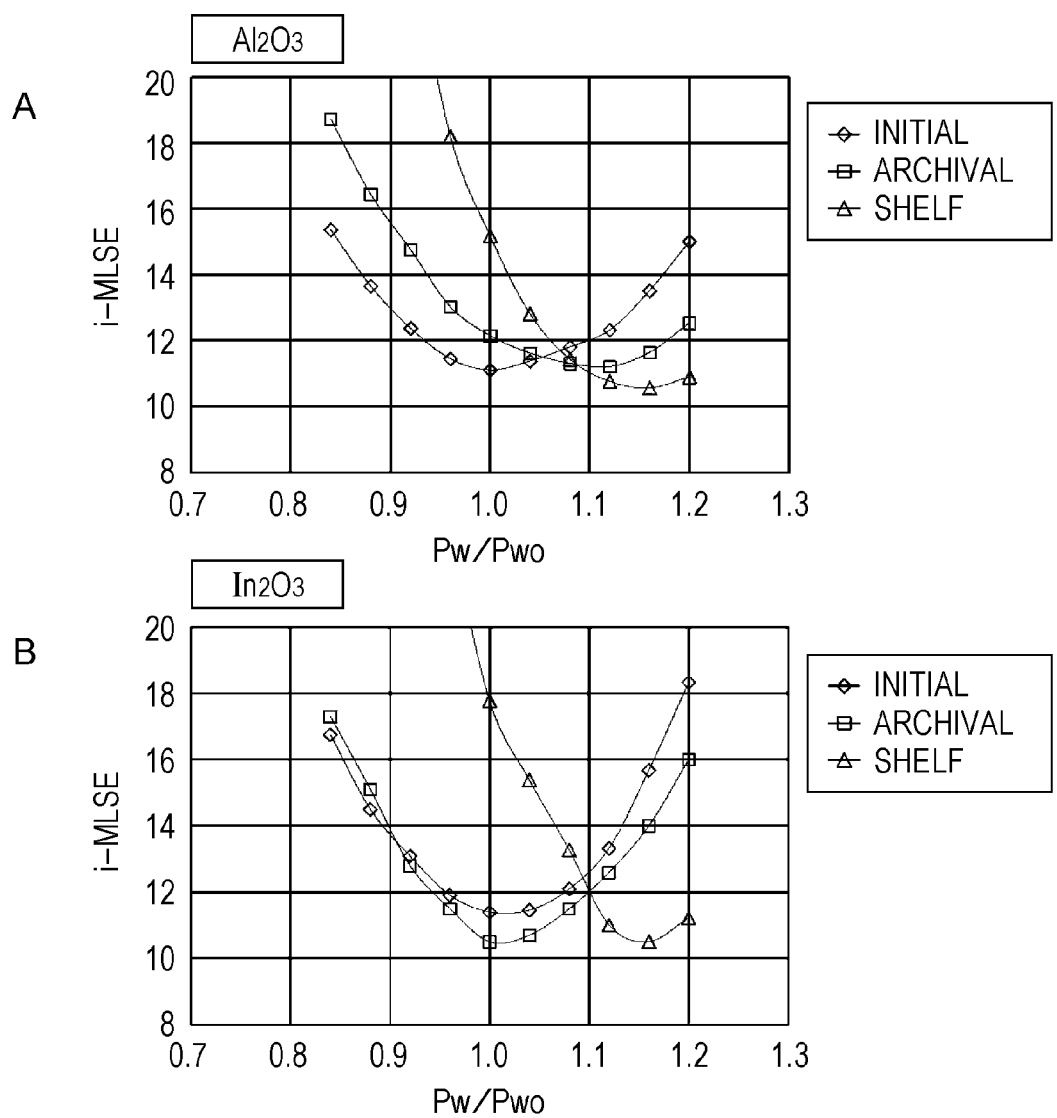
FIGS. 24A and 24B are graphs showing the results of evaluation of the initial, archival, and shelf characteristics of optical disks of Examples 9-1 and 9-2, respectively.
Figure 25:
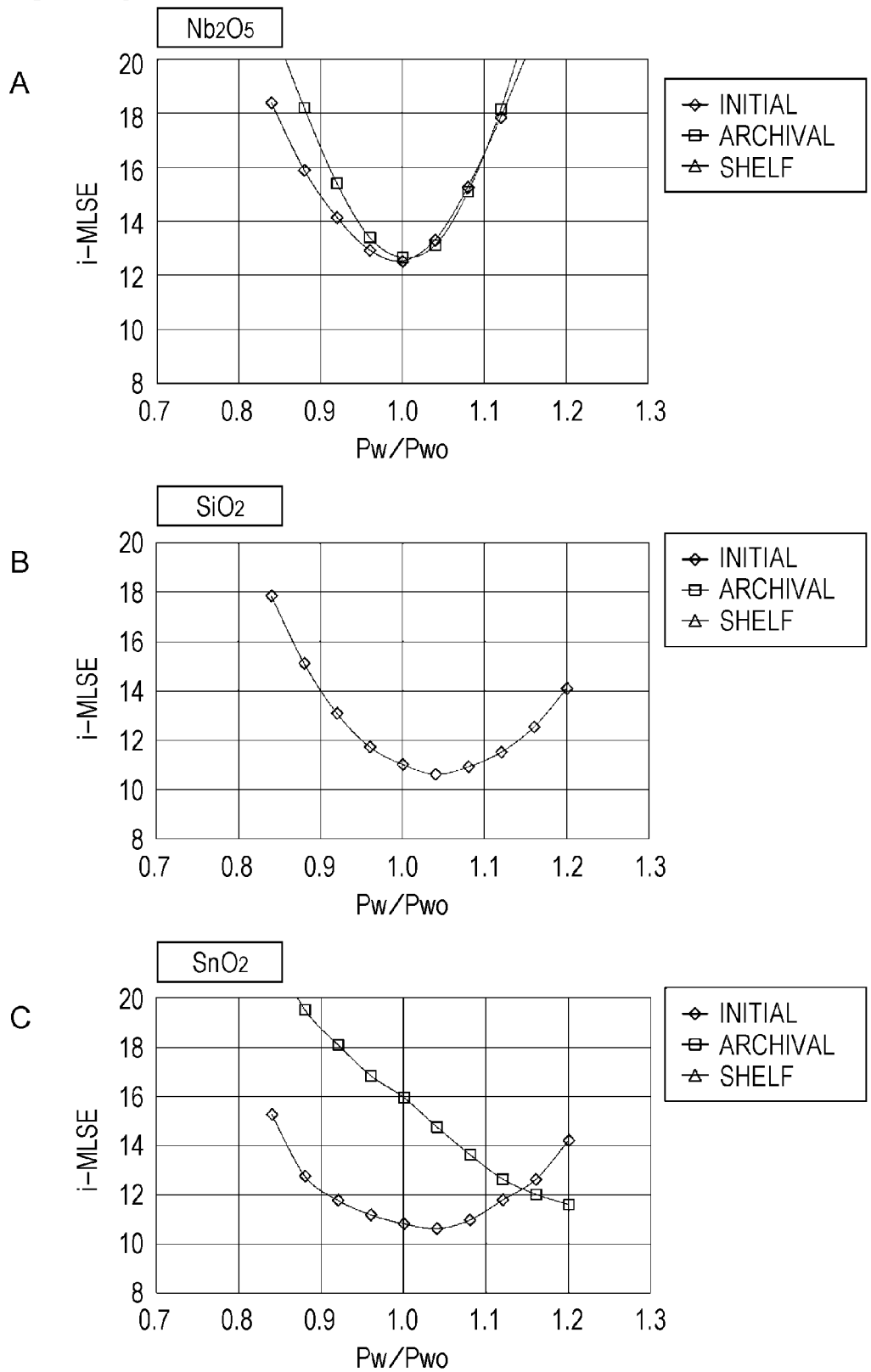
FIGS. 25A to 25C are graphs showing the results of evaluation of the initial, archival, and shelf characteristics of optical disks of Examples 9-3 to 9-5, respectively.
Figure 26:
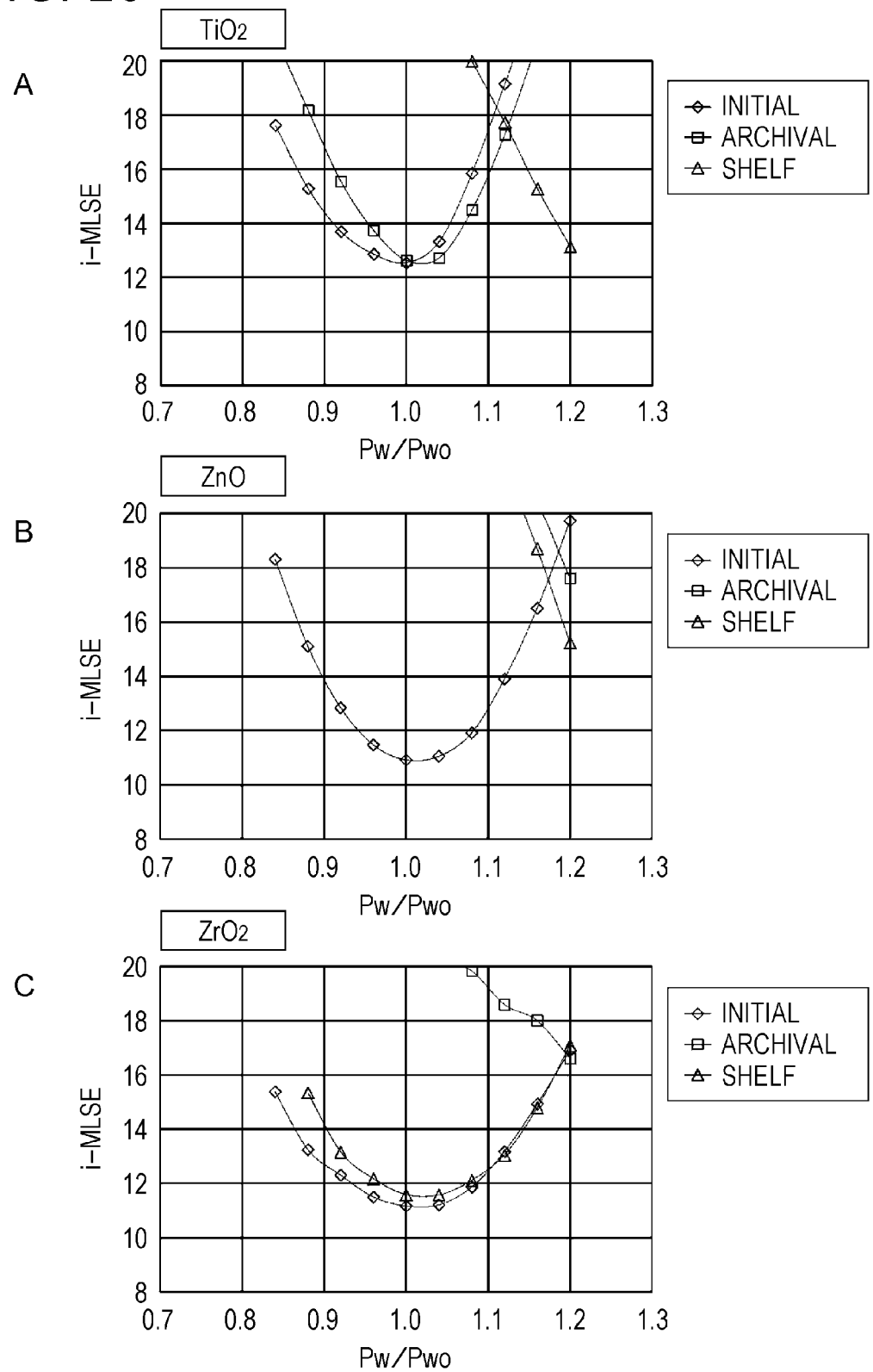
FIGS. 26A to 26C are graphs showing the results of evaluation of the initial, archival, and shelf characteristics of optical disks of Examples 9-6 to 9-8, respectively.
Figure 27:
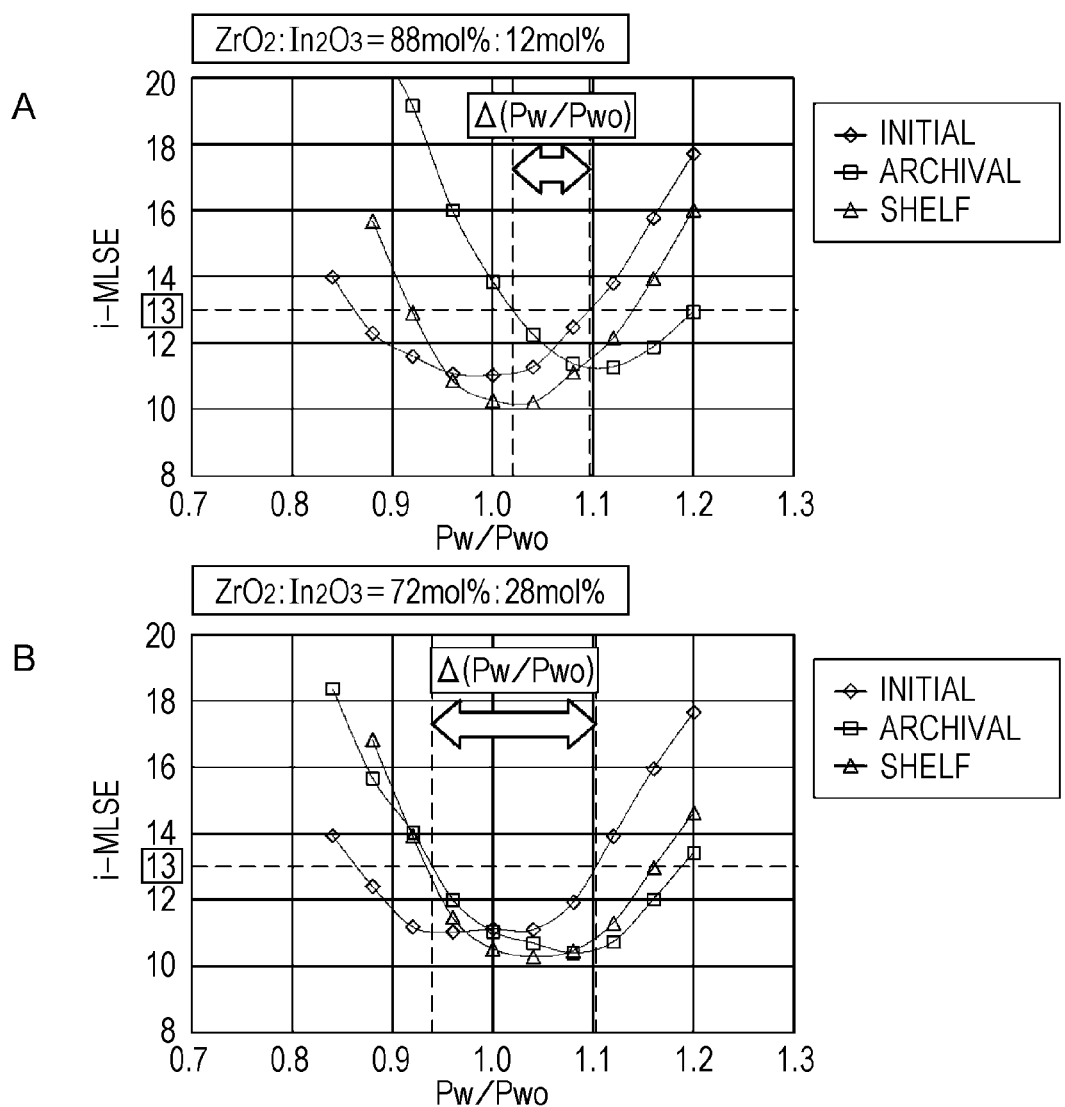
FIGS. 27A and 27B are graphs showing the results of evaluation of the initial, archival, and shelf characteristics of optical disks of Examples 10-2 and 10-2, respectively.
Figure 28:
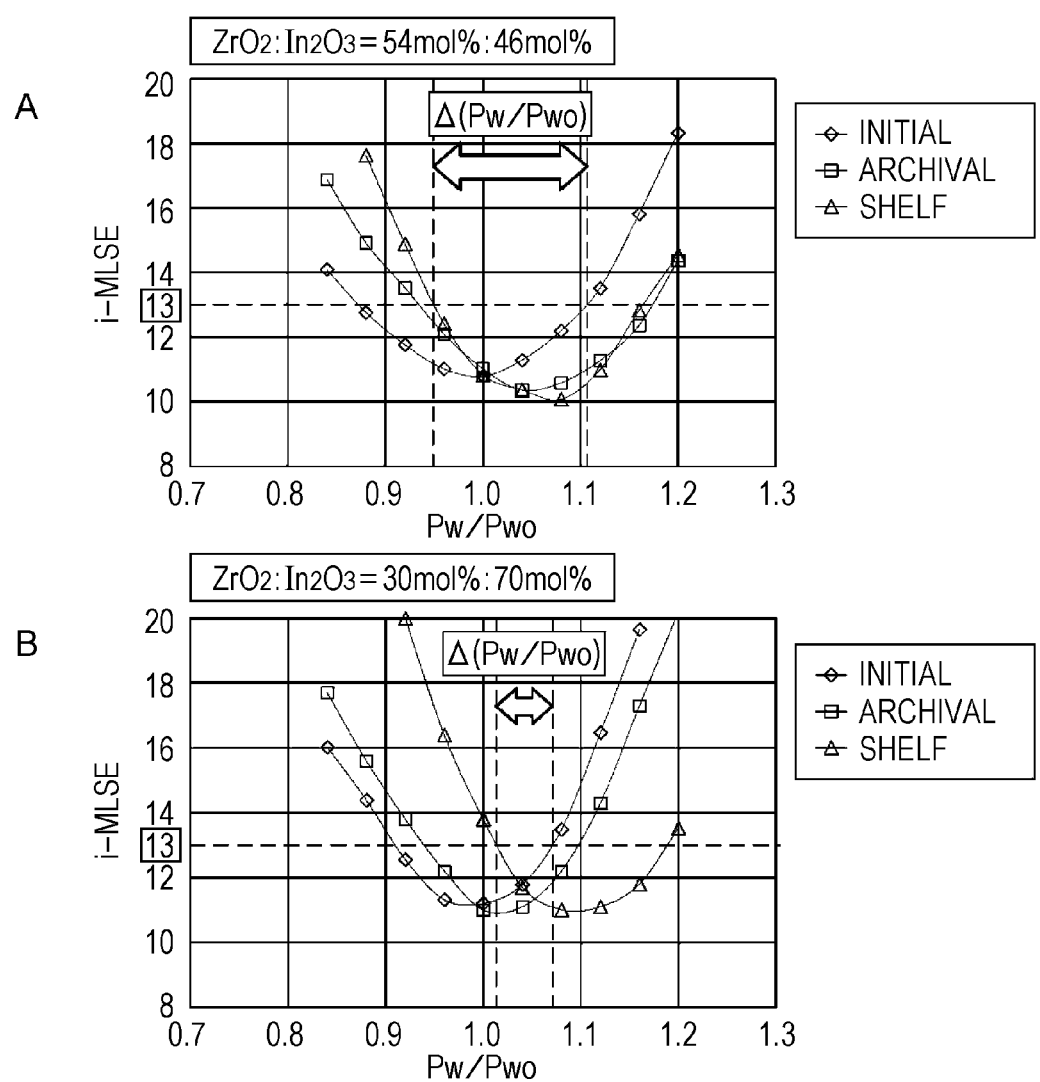
FIGS. 28A and 28B are graphs showing the results of evaluation of the initial, archival, and shelf characteristics of optical disks of Examples 10-3 and 10-4, respectively.

In this case, the evaluation index for BD-XL can be used as a reference. According to the evaluation index, if the region of the power margin curve under i-MLSE=13% has a width (max−min width) equal to 20% of the optimum recording power, the system will be acceptable. Therefore, all the initial i-MLSE, the i-MLSE after the archival test, and the i-MLSE after the shelf test were superimposed on each of the graphs of FIGS. 21A to 22C, and then, the power margin Δ (Pw/Pwo) of the region under 13% i-MLSE was determined. A graph was prepared by plotting each resulting power margin Δ (Pw/Pwo). FIG. 23 shows the results. In the graph of FIG. 23, the vertical axis represents the power margin Δ (Pw/Pwo), and the horizontal axis represents the content of MgO in the Mn—Mg-based recording layer. Note that in FIG. 23, the power margin Δ (Pw/Pwo) is alternatively expressed in units of percentage.

FIG. 23 shows that if the MgO content is in the range of 5 mol % to 50 mol %, a power margin Δ (Pw/Pwo) of 20% can be achieved.

In order to further improve the storage reliability (archival and shelf characteristics), therefore, the MgO content should preferably be in the range of 5 mol % to 50 mol %.

<3-1. Comparison Between the Characteristics of Dielectric Layers Including Various Metal Oxides>

Optical disks were prepared each having a Mn-based recording layer and dielectric layers including any of various metal oxides and provided on both sides of the Mn-based recording layer, and the effect of the dielectric layers was examined.

Examples 9-1 to 9-8

Optical disks were obtained as in Example 6-1, except that a dielectric layer (substrate side), a Mn-based recording layer, and a dielectric layer (optically transparent layer side) having the features below were sequentially deposited on the concave-convex surface of the polycarbonate substrate.

Dielectric Layer (Substrate Side)
Material: $Al_2O_3$, $In_2O_3$, $Nb_2O_5$, $SiO_2$, $SnO_2$, $TiO_2$, ZnO, or $ZrO_2$
Thickness: 5 nm
Mn-Based Recording Layer
Material: Mn—W—Zn—O complex oxide (Mn:W:Zn=23:31:46 (atomic ratio (units: at %))), thickness: 33 nm
Dielectric Layer (Optically Transparent Layer Side)
Material: $Al_2O_3$, $In_2O_3$, $Nb_2O_5$, $SiO_2$, $SnO_2$, $TiO_2$, ZnO, or $ZrO_2$
Thickness: 10 nm The same material was used to form the dielectric layers on the substrate side and the optically transparent layer side.

(Features of Optical Disks)

Table 5 shows the features of the optical disks of Examples 9-1 to 9-8.

TABLE 5

| Sample No. | Material for dielectric layers on substrate side and optically transparent layer side |
|---|---|
| Example 9-1 | $Al_2O_3$ |
| Example 9-2 | $In_2O_3$ |
| Example 9-3 | $Nb_2O_5$ |
| Example 9-4 | $SiO_2$ |
| Example 9-5 | $SnO_2$ |
| Example 9-6 | $TiO_2$ |
| Example 9-7 | ZnO |
| Example 9-8 | $ZrO_2$ |

(Initial, Archival, and Shelf Characteristics)

The initial, archival, and shelf characteristics of the optical disks of Examples 9-1 to 9-8 obtained as described above were evaluated in the same way as for the optical disks of Examples 6-1 and 7-1 to 7-11. FIGS. 24A to 26C show the results.

FIGS. 24A to 26C show the results of evaluation of the initial, archival, and shelf characteristics of the optical disks of Examples 9-1 to 9-8. The evaluation results show the following.

When $In_2O_3$ is used to form the dielectric layers on the substrate side and the optically transparent layer side, the resulting optical disk has a smaller difference between the initial i-MLSE and the i-MLSE after the archival test, and its power margin also remains wide and good. However, the optimum recording power for this optical disk after the shelf test is about 10% higher than the initial optimum recording power.

On the other hand, when $ZrO_2$ is used to form the dielectric layers on the substrate side and the optically transparent layer side, the resulting optical disk has a smaller difference between the initial i-MLSE and the i-MLSE after the shelf test, and its power margin also remains wide and good. However, the optimum recording power for this optical disk after the archival test is significantly different from the initial optimum recording power.

In order to improve the archival characteristics, therefore, it is preferable to use $In_2O_3$ as a material for the dielectric layers on the substrate side and the optically transparent layer side. In order to improve the shelf characteristics, it is preferable to use $ZrO_2$ as a material for the dielectric layers on the substrate side and the optically transparent layer side.

<3-2. Relationship Between Storage-Reliability and the Ratio of Components in Dielectric Layer ($In_2O_3$—$ZrO_2$ Layer)>

Dielectric layers were formed using a mixture of $In_2O_3$ and $ZrO_2$, in which $In_2O_3$ and $ZrO_2$ were found to be effective in improving the archival characteristics and the shelf characteristics, respectively, as a result of the study in the section 3-1. In addition, the composition of the mixture was varied to study the relationship between the composition and the storage reliability.

Examples 10-1 to 10-4

Optical disks were obtained as in Example 9-1, except that the dielectric layer (substrate side) and the dielectric layer (optically transparent layer side) had the following features.

Dielectric Layer (Substrate Side)
Material: $In_2O_3$—$ZrO_2$ complex oxide ($In_2O_3$:$ZrO_2$=12-70:30-88 (molar ratio (units: mol %))), thickness: 5 nm
Dielectric Layer (Optically Transparent Layer Side)
Material: $In_2O_3$—$ZrO_2$ complex oxide ($In_2O_3$:$ZrO_2$=12:88 (molar ratio (units: mol %))), thickness: 10 nm Table 6 shows the features of the optical disks of Examples 10-1 to 10-4

TABLE 6

| Sample No. | Material for dielectric layers on substrate side and optically transparent layer side |
|---|---|
| Example 10-1 | $In_2O_3$:$ZrO_2$ = 12:88 |
| Example 10-2 | $In_2O_3$:$ZrO_2$ = 28:72 |
| Example 10-3 | $In_2O_3$:$ZrO_2$ = 46:54 |
| Example 10-4 | $In_2O_3$:$ZrO_2$ = 70:30 |

(Initial, Archival, and Shelf Characteristics)

The initial, archival, and shelf characteristics of the optical disks of Examples 10-1 to 10-4 obtained as described above were evaluated in the same way as for the optical disks of Examples 6-1 and 7-1 to 7-11. FIGS. 27A to 28B show the results.

Figure 29:
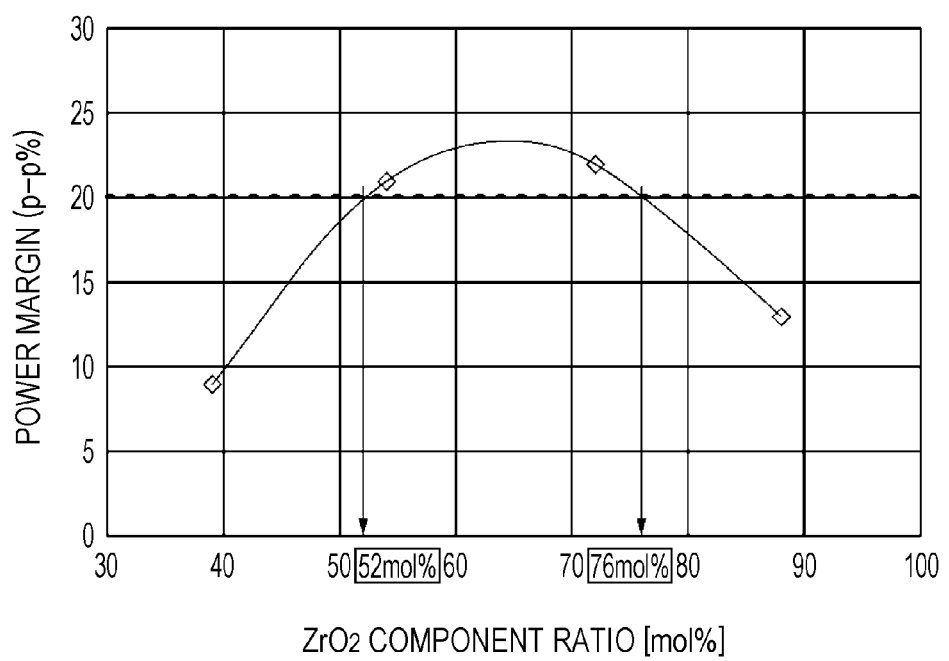
FIG. 29 is a graph showing the results of evaluation of the power margin Δ (Pw/Pwo) for optical disks of Examples 10-1 to 10-4.
Figure 30:
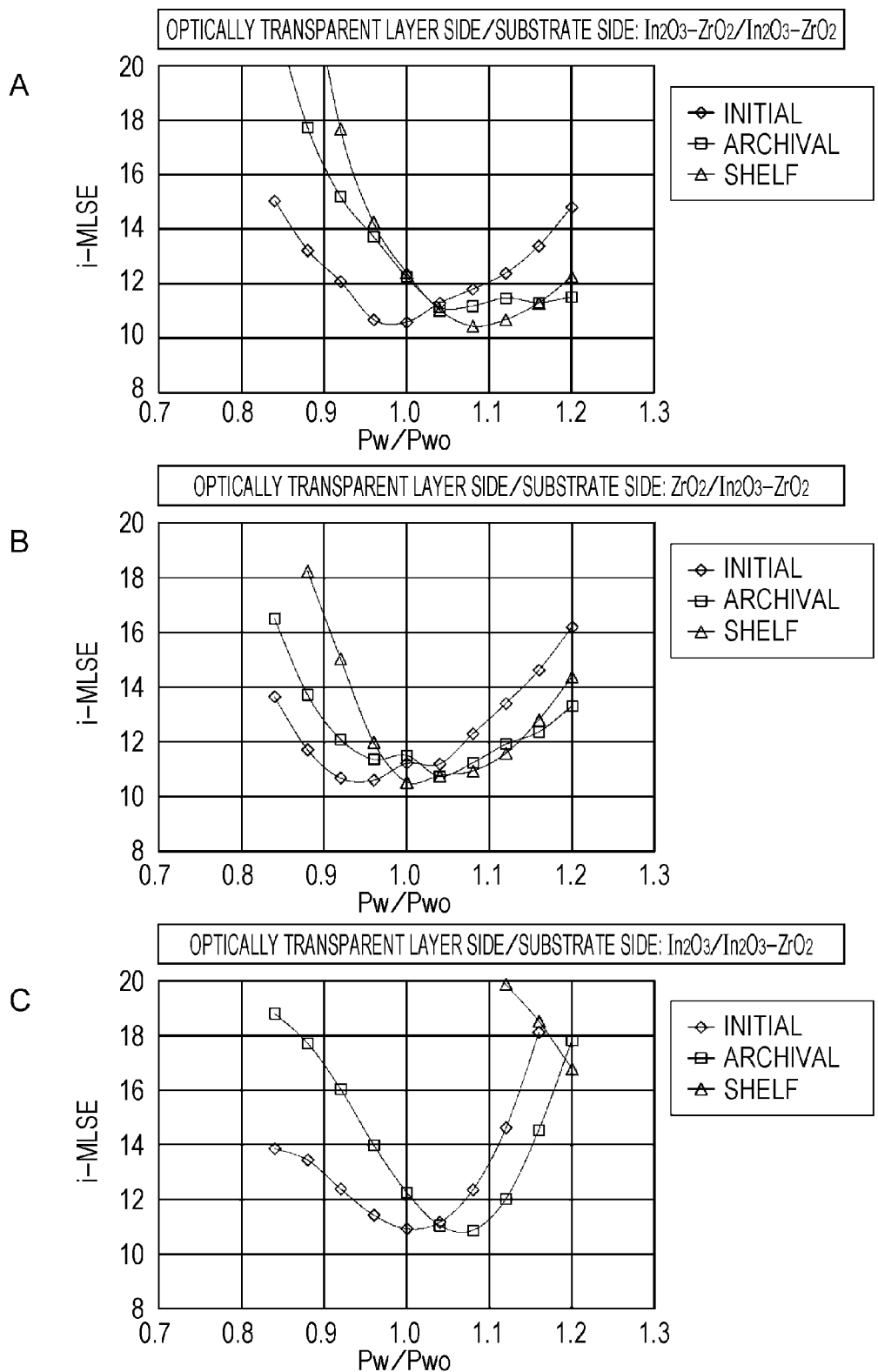
FIGS. 30A to 30C are graphs showing the results of evaluation of the initial, archival, and shelf characteristics of optical disks of Examples 11-1 to 11-3, respectively.
Figure 31:
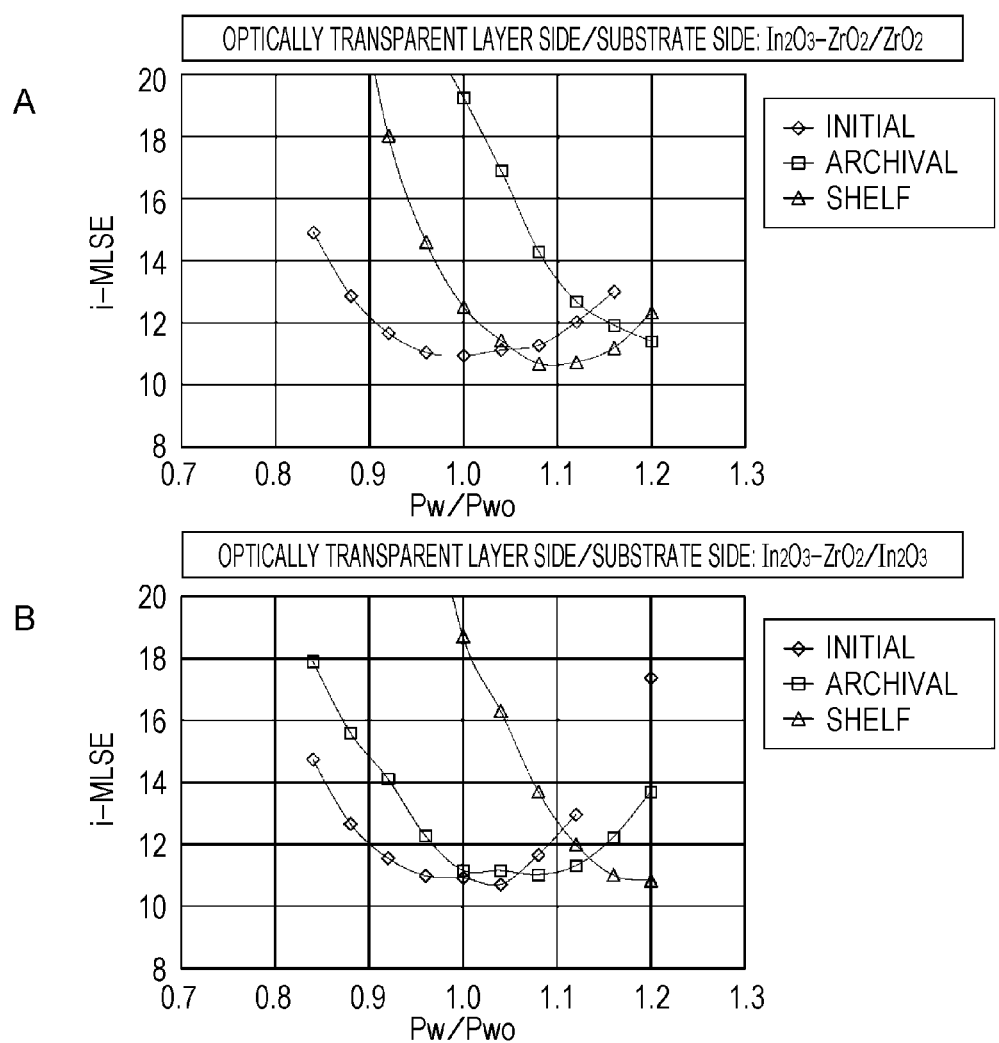
FIGS. 31A and 31B are graphs showing the results of evaluation of the initial, archival, and shelf characteristics of optical disks of Examples 11-4 and 11-5, respectively.
Figure 32:
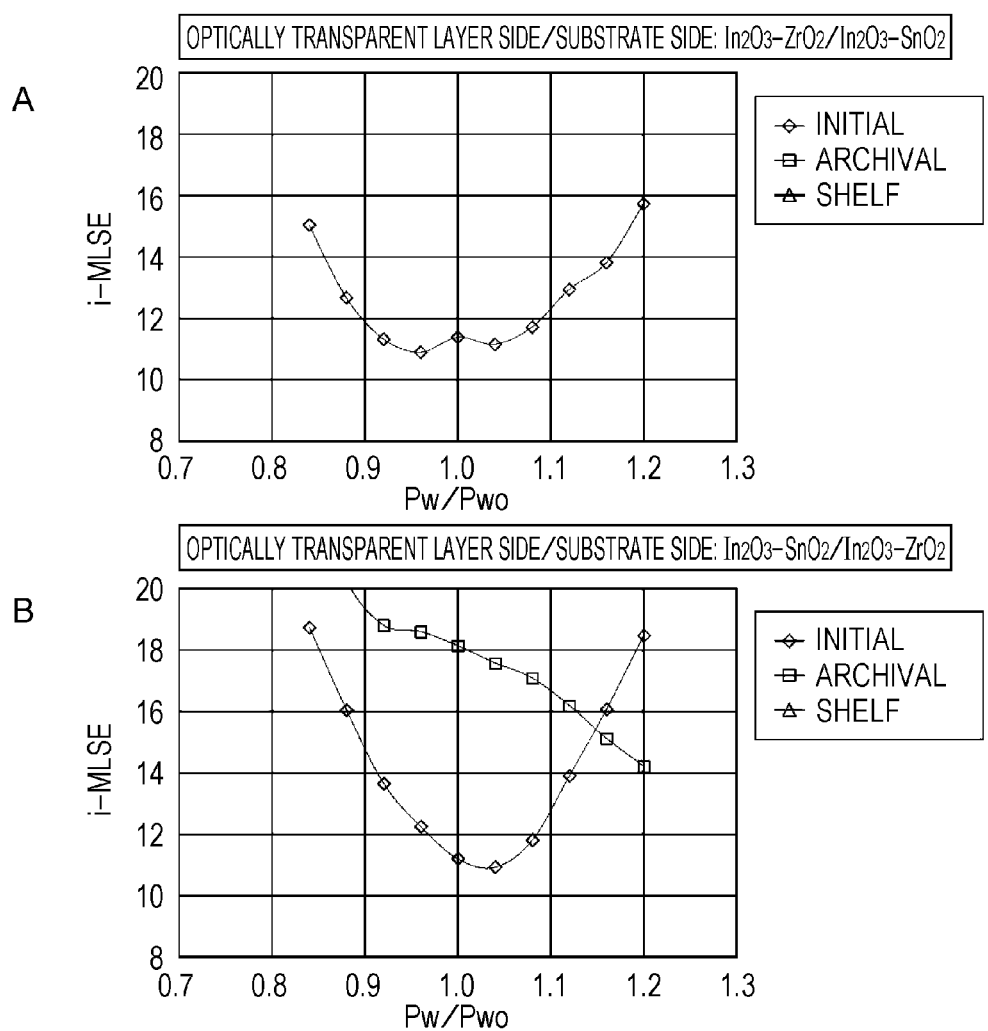
FIGS. 32A and 32B are graphs showing the results of evaluation of the initial, archival, and shelf characteristics of optical disks of Examples 11-6 and 11-7, respectively.
Figure 33:
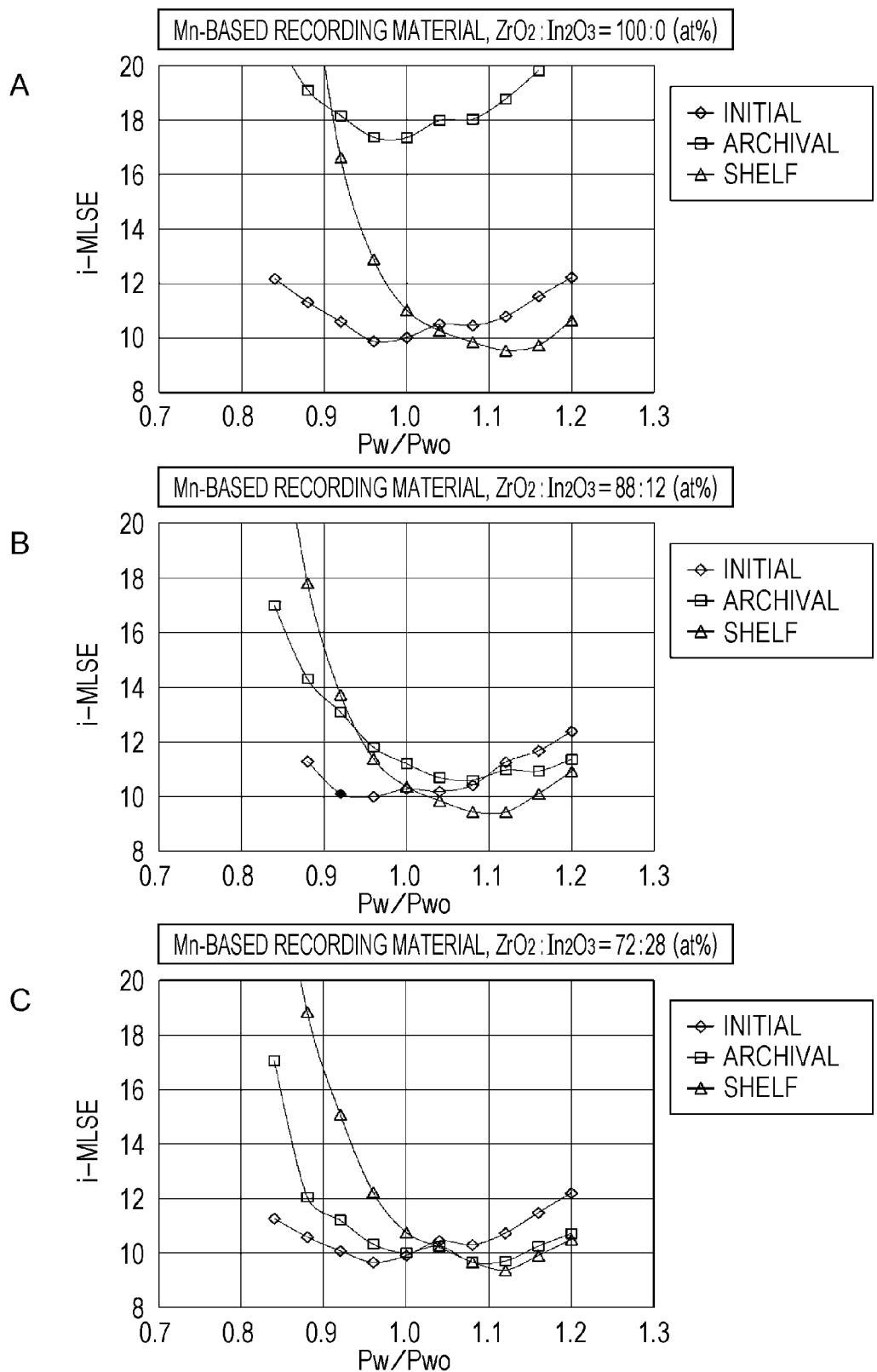
FIGS. 33A to 33C are graphs showing the results of evaluation of the initial, archival, and shelf characteristics of optical disks of Examples 12-1 to 12-3, respectively.
Figure 34:
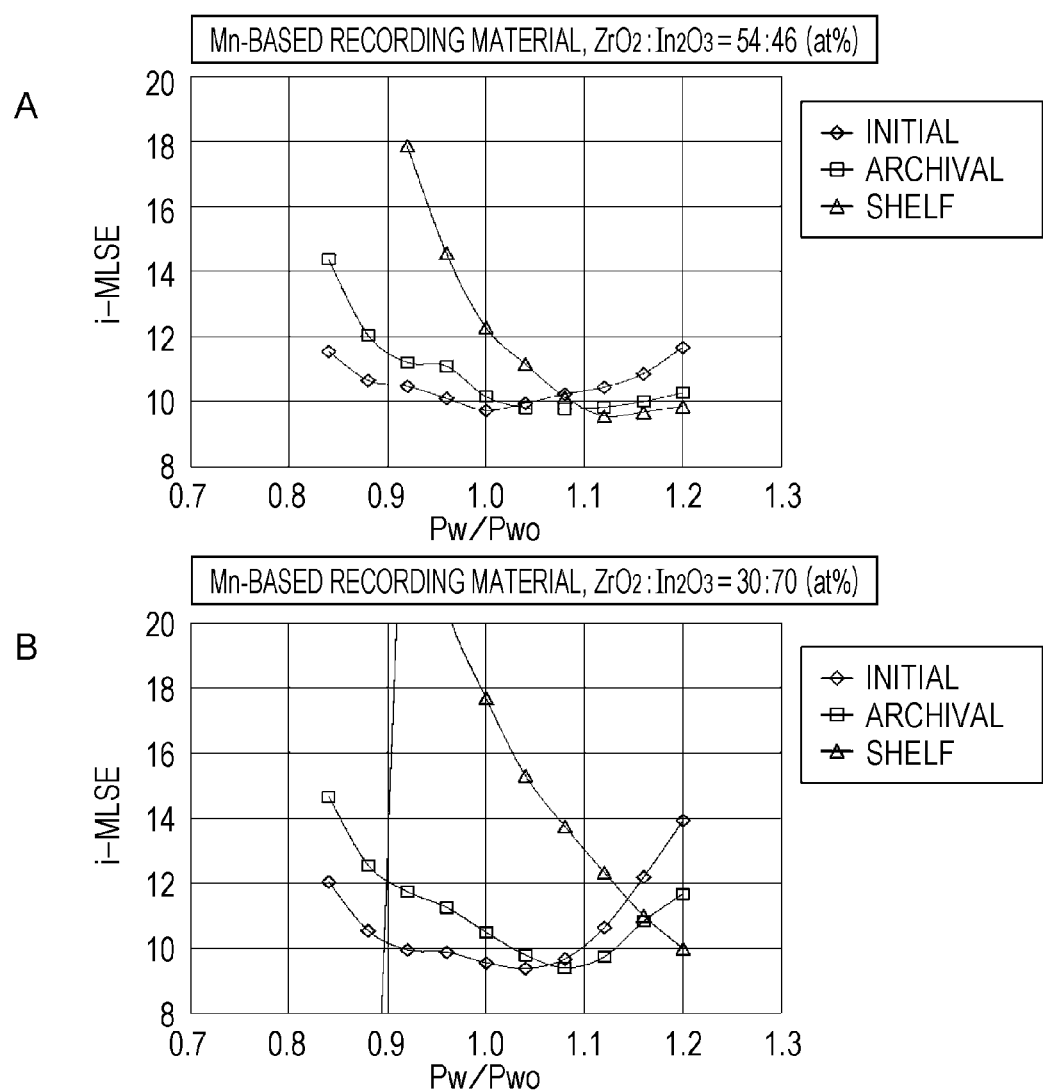
FIGS. 34A and 34B are graphs showing the results of evaluation of the initial, archival, and shelf characteristics of optical disks of Examples 12-4 and 12-5, respectively.
Figure 35:
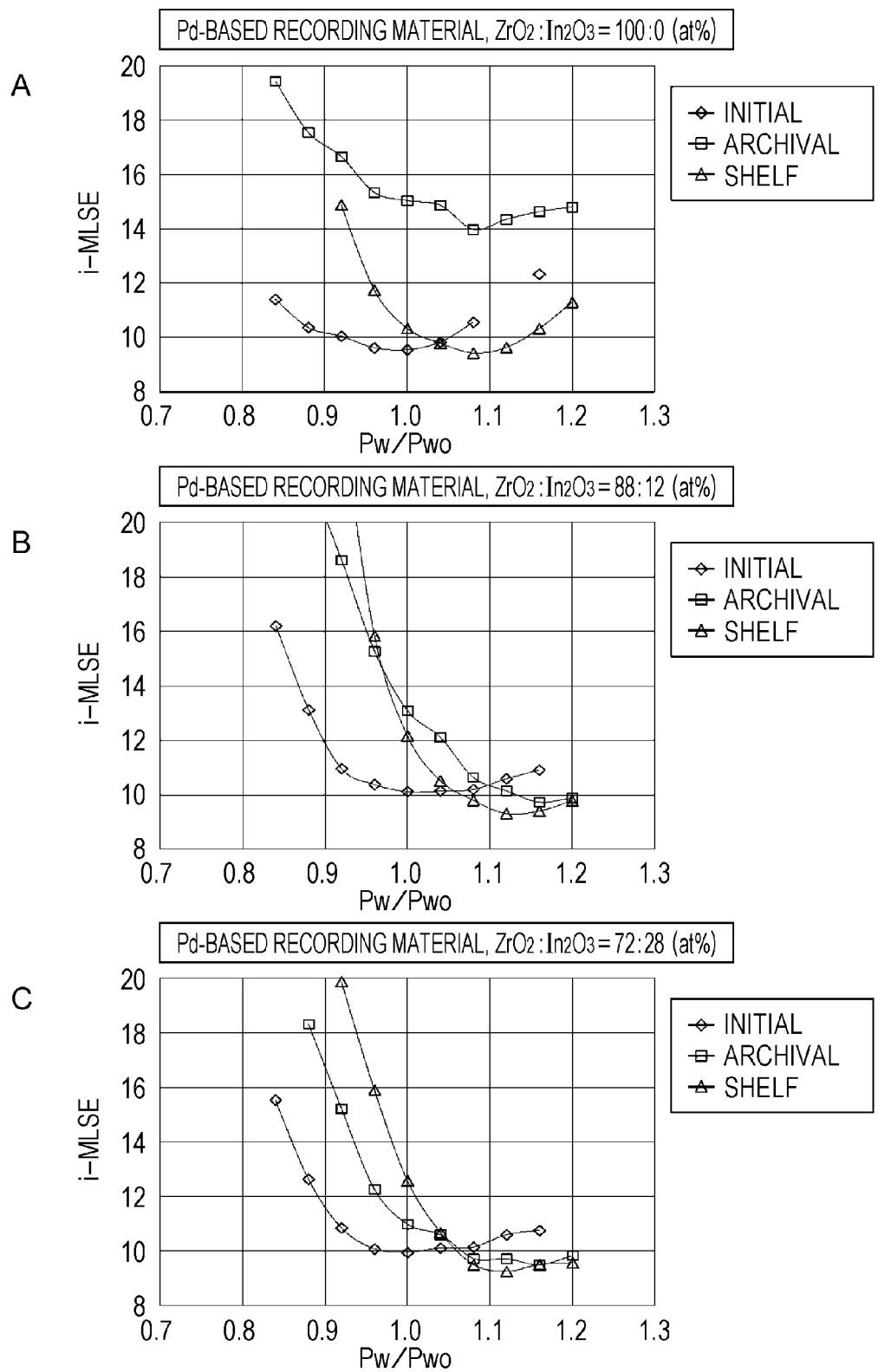
FIGS. 35A to 35C are graphs showing the results of evaluation of the initial, archival, and shelf characteristics of optical disks of Comparative Examples 2-1 to 2-3, respectively.
Figure 36:
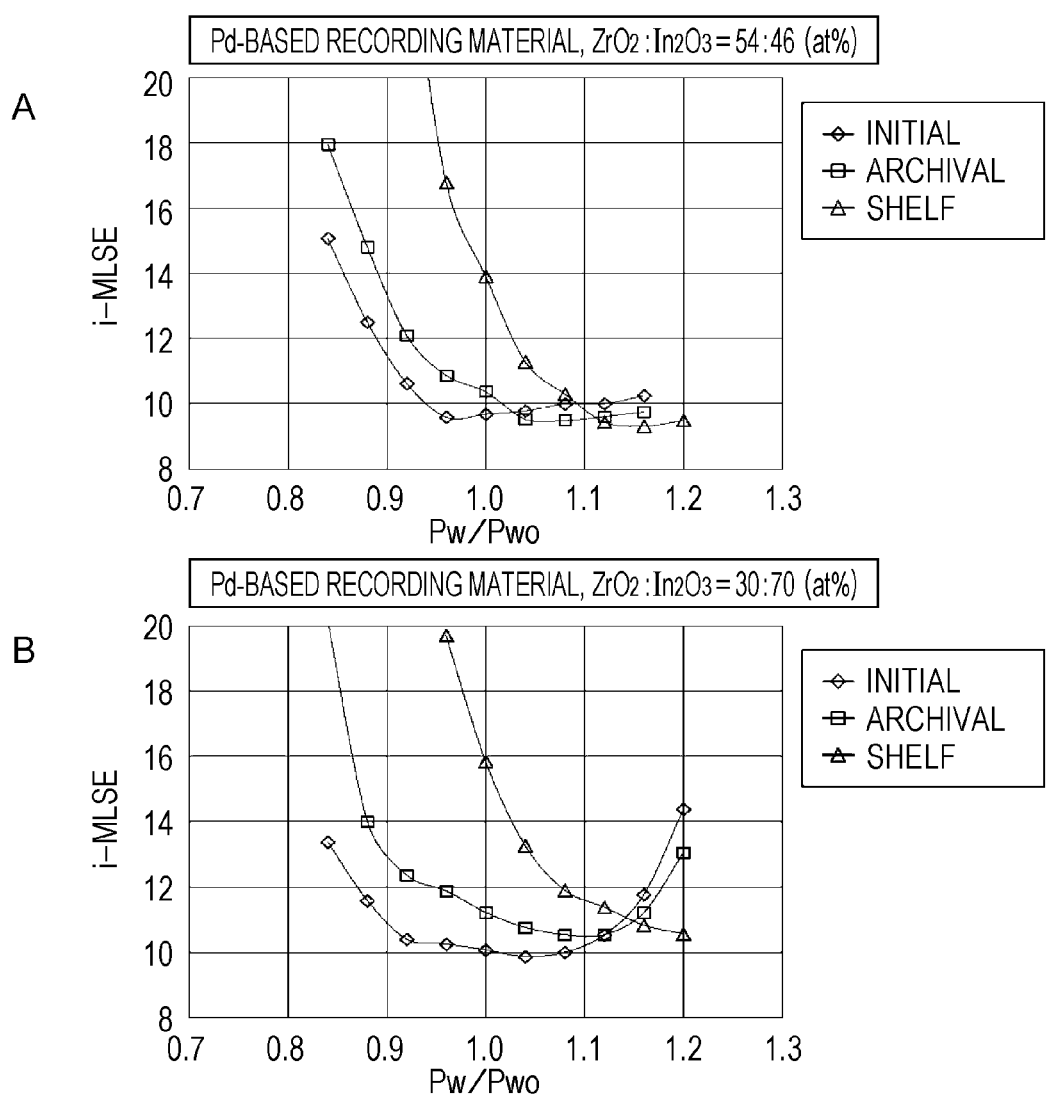
FIGS. 36A and 36B are graphs showing the results of evaluation of the initial, archival, and shelf characteristics of optical disks of Comparative Examples 2-4 and 2-5, respectively.

In this case, the evaluation index for BD-XL can be used as a reference. According to the evaluation index, if the region of the power margin curve under i-MLSE=13% has a width (max−min width) equal to 20% of the optimum recording power, the system will be acceptable. Therefore, all the initial i-MLSE, the i-MLSE after the archival test, and the i-MLSE after the shelf test were superimposed on each of the graphs of FIGS. 27A to 28B, and then, the power margin Δ (Pw/Pwo) of the region under 13% i-MLSE was determined. A graph was prepared by plotting each resulting power margin Δ (Pw/Pwo). FIG. 29 shows the results. In the graph of FIG. 29, the vertical axis represents the power margin Δ (Pw/Pwo), and the horizontal axis represents the molar ratio of the amount B of $ZrO_2$ to the total amount A of the $In_2O_3$—$ZrO_2$ complex oxide ((B/A)×100 (mol %)). Note that in FIG. 29, the power margin Δ (Pw/Pwo) is alternatively expressed in units of percentage.

FIGS. 27A to 28B show the results of evaluation of the initial, archival, and shelf characteristics of the optical disks of Examples 10-1 to 10-4. The evaluation results show the following.

When $In_2O_3$—$ZrO_2$ complex oxide is used to form the dielectric layers on the substrate side and the optically transparent layer side, the changes between the initial i-MLSE and the i-MLSE after the archival test and the shelf test can be kept small. In other words, good archival characteristics and good shelf characteristics can be achieved at the same time.

However, when $Al_2O_3$, $Bi_2O_3$, $In_2O_3$, $Nb_2O_5$, $SiO_2$, $SnO_2$, $TiO_2$, ZnO, or $ZrO_2$ is used to form the dielectric layers on the substrate side and the optically transparent layer side, it is difficult to achieve both good archival characteristics and good shelf characteristics together (FIGS. 24A to 26C).

When the molar ratio of the amount B of $ZrO_2$ to the total amount A of the $In_2O_3$—$ZrO_2$ complex oxide ((B/A)×100 (mol %)) is in the range of about 50 to 70 mol %, the archival characteristics and the shelf characteristics can be particularly improved at the same time.

FIG. 29 is a graph showing the results of evaluation of the power margin Δ (Pw/Pwo) of the optical disks of Examples 10-1 to 10-4. The evaluation results show the following.

It is apparent that if the molar ratio of the amount B of $ZrO_2$ to the total amount A of the $In_2O_3$—$ZrO_2$ complex oxide ((B/A)×100 (mol %)) is in the range of 52 mol % to 76 mol %, a power margin Δ (Pw/Pwo) of 20% can be achieved.

In order to further improve the storage reliability (archival and shelf characteristics), therefore, the molar ratio of the amount B of $ZrO_2$ should preferably be in the range of 52 mol % to 76 mol %.

<3-3. Relationship Between Storage Reliability and Combination of Dielectric Layers Provided on Both Sides of Recording Layer>

The above study demonstrated that the use of $In_2O_3$—$ZrO_2$ as the material for both the dielectric layers on the substrate side and the optically transparent layer side was effective in improving storage reliability. This study was performed using $In_2O_3$—$ZrO_2$ as the material for the dielectric layer on one of the substrate side and the optically transparent layer side and using $In_2O_3$, $ZrO_2$, $In_2O_3$—$ZrO_2$, or ITO as the material for the other dielectric layer. It was also examined how the effect of improving storage reliability varied with a combination of these dielectric layers.

Example 11-1

An optical disk was obtained as in Example 9-1, except that the dielectric layers on the substrate side and the optically transparent layer side had the following features.

Dielectric Layer (Substrate Side)

Material: $In_2O_3$—$ZrO_2$ complex oxide ($In_2O_3$:$ZrO_2$=40:60 (molar ratio (units: mol %))), thickness: 5 nm Dielectric Layer (Optically Transparent Layer Side)

Material: $In_2O_3$—$ZrO_2$ complex oxide ($In_2O_3$:$ZrO_2$=40:60 (molar ratio (units: mol %))), thickness: 10 nm Example 11-2

An optical disk was obtained as in Example 11-1, except that the dielectric layer on the optically transparent layer side had the following features.

Dielectric Layer (Optically Transparent Layer Side)

Material: $ZrO_2$, thickness: 10 nm

Example 11-3

An optical disk was obtained as in Example 11-1, except that the dielectric layer on the optically transparent layer side had the following features.

Dielectric Layer (Optically Transparent Layer Side)

Material: $In_2O_3$, thickness: 10 nm

Example 11-4

An optical disk was obtained as in Example 11-1, except that the dielectric layer on the substrate side had the following features.

Dielectric Layer (Substrate Side)

Material: $ZrO_2$, thickness: 5 nm

Example 11-5

An optical disk was obtained as in Example 11-1, except that the dielectric layer on the substrate side had the following features.

Dielectric Layer (Substrate Side)

Material: $In_2O_3$, thickness: 5 nm

Example 11-6

An optical disk was obtained as in Example 9-1, except that the dielectric layers on the substrate side and the optically transparent layer side had the following features.

Dielectric Layer (Substrate Side)

Material: $In_2O_3$—$SnO_2$ complex oxide ($In_2O_3$:$SnO_2$=90:10 (molar ratio (units: mol %))), thickness: 5 nm Dielectric Layer (Optically Transparent Layer Side)

Material: $In_2O_3$—$ZrO_2$ complex oxide ($In_2O_3$:$ZrO_2$=40:60 (molar ratio (units: mol %))), thickness: 10 nm Example 11-7

An optical disk was obtained as in Example 9-1, except that the dielectric layers on the substrate side and the optically transparent layer side had the following features.

Dielectric Layer (Substrate Side)

Material: $In_2O_3$—$ZrO_2$ complex oxide ($In_2O_3$:$ZrO_2$=40:60 (molar ratio (units: mol %))), thickness: 5 nm Dielectric Layer (Optically Transparent Layer Side)

Material: $In_2O_3$—$SnO_2$ complex oxide ($In_2O_3$:$SnO_2$=90:10 (molar ratio (units: mol %))), thickness: 10 nm (Features of Optical Disks)

Table 7 shows the features of the optical disks of Examples 11-1 to 11-7.

TABLE 7

| Sample No. | Dielectric layer on substrate side | | Recording layer | | Dielectric layer on optically transparent layer side | |
|---|---|---|---|---|---|---|
| | Component ratio [mol %] | Thickness [nm] | Composition [at %] | Thickness [nm] | Composition [mol %] | Thickness [nm] |
| Example 11-1 | $(In_2O_3)_{40}(ZrO_2)_{60}$ | 5 | Mn:W:Zn = 23:31:46 | 33 | $(In_2O_3)_{40}(ZrO_2)_{60}$ | 10 |
| Example 11-2 | $(In_2O_3)_{40}(ZrO_2)_{60}$ | 5 | Mn:W:Zn = 23:31:46 | 33 | $ZrO_2$ | 10 |
| Example 11-3 | $(In_2O_3)_{40}(ZrO_2)_{60}$ | 5 | Mn:W:Zn = 23:31:46 | 33 | $In_2O_3$ | 10 |
| Example 11-4 | $ZrO_2$ | 5 | Mn:W:Zn = 23:31:46 | 33 | $(In_2O_3)_{40}(ZrO_2)_{60}$ | 10 |
| Example 11-5 | $ZrO_3$ | 5 | Mn:W:Zn = 23:31:46 | 33 | $(In_2O_3)_{40}(ZrO_2)_{60}$ | 10 |
| Example 11-6 | $(In_2O_3)_{90}(SnO_2)_{10}$ | 5 | Mn:W:Zn = 23:31:46 | 33 | $(In_2O_3)_{40}(ZrO_2)_{60}$ | 10 |
| Example 11-7 | $(In_2O_3)_{40}(ZrO_2)_{60}$ | 5 | Mn:W:Zn = 23:31:46 | 33 | $(In_2O_3)_{90}(SnO_2)_{10}$ | 10 |

(Initial, Archival, and Shelf Characteristics)

The initial, archival, and shelf characteristics of the optical disks of Examples 11-1 to 11-7 obtained as described above were evaluated in the same way as for the optical disks of Examples 6-1 and 7-1 to 7-11. FIGS. 30A to 32B show the results.

FIGS. 30A to 32B are graphs showing the results of evaluation of the initial, archival, and shelf characteristics of the optical disks of Examples 11-1 to 11-7. The evaluation results show the following.

When $In_2O_3$—$ZrO_2$ is used to form the dielectric layer on the substrate side and $ZrO_2$ is used to form the dielectric layer on the optically transparent layer side, the archival and shelf characteristics of the resulting optical disk, namely, the storage reliability of the resulting optical disk is close to that of the optical disk prepared using $In_2O_3$—$ZrO_2$ complex oxide as the material for both dielectric layers. However, when $ZrO_2$ is used to form the dielectric layer on the substrate side and $In_2O_3$—$ZrO_2$ is used to form the dielectric layer on the optically transparent layer side, the archival and shelf characteristics of the resulting optical disk are inferior to those of the optical disk prepared using $In_2O_3$—$ZrO_2$ as the material for both dielectric layers. Particularly, the reduction in the archival characteristics is significant.

When $In_2O_3$—$ZrO_2$ is used to form one of the dielectric layers on the substrate side and the optically transparent layer side and a material other than $ZrO_2$ ($In_2O_3$ or $In_2O_3$—$SnO_2$) is used to form the other dielectric layer, at least one of the archival and shelf characteristics of the resulting optical disk significantly differ from those of the optical disk prepared using $In_2O_3$—$ZrO_2$ as the material for both dielectric layers, namely, the storage reliability of the resulting optical disk is inferior to that of the optical disk prepared using $In_2O_3$—$ZrO_2$ as the material for both dielectric layers. Also when $In_2O_3$—$ZrO_2$ complex oxide is used to form one of the dielectric layers on the substrate side and the optically transparent layer side and $In_2O_3$—$SnO_2$ complex oxide is used to form the other dielectric layer, the storage reliability of the resulting optical disk is significantly degraded.

All these results show that to improve the storage reliability, it is preferable to use $In_2O_3$—$ZrO_2$ as a material for the dielectric layer on the substrate side and to use $ZrO_2$ as a material for the dielectric layer on the optically transparent layer side, and it is more preferable to use $In_2O_3$—$ZrO_2$ as a material for both dielectric layers on the substrate side and the optically transparent layer side.

<3-4. Relationship Between Storage Reliability and Combination of Recording Material and Dielectric Material>

It was examined how optical disks prepared with a combination of a Mn-based recording material and a dielectric material ($In_2O_3$—$ZrO_2$) differ in storage reliability from optical disks prepared with a combination of a Pd-based recording material and a dielectric material ($In_2O_3$—$ZrO_2$).

Examples 12-1 to 12-5

Optical disks were obtained as in Example 1-1, except that a dielectric layer (substrate side), a Mn-based recording layer, and a dielectric layer (optically transparent layer side) having the features below were sequentially deposited on the concave-convex surface of the polycarbonate substrate.

Dielectric Layer (Substrate Side)
Material: $In_2O_3$—$ZrO_2$ complex oxide ($In_2O_3$:$ZrO_2$=0-70:30-100 (molar ratio (units: mol %))), thickness: 5 nm Mn-Based Recording Layer
Material: Mn—Mg—W—Zn—O complex oxide (Mn:Mg:W:Zn=15:32:21:33 (atomic ratio (units: at %))), thickness: 33 nm Dielectric Layer (Optically Transparent Layer Side)
Material: $In_2O_3$—$ZrO_2$ complex oxide ($In_2O_3$:$ZrO_2$=0-70:30-100 (molar ratio (units: mol %))), thickness: 10 nm Comparative Examples 2-1 to 2-5

Optical disks were obtained as in Examples 12-1 to 12-5, except that a Pd-based recording layer having the features below was formed instead.

Pd-Based Recording Layer
Material: Pd—W—Zn—O complex oxide (Pd:W:Zn=26:30:44 (atomic ratio (at %))), thickness: 33 nm Table 8 shows the features of the optical disks of Examples 12-1 to 12-5.

TABLE 8

| Sample No. | Dielectric layer on substrate side | | Recording layer | | Dielectric layer on optically transparent layer side | |
|---|---|---|---|---|---|---|
| | Component ratio [mol %] | Thickness [nm] | Composition [at %] | Thickness [nm] | Component ratio [mol %] | Thickness [nm] |
| Example 12-1 | $ZrO_2$ | 5 | Mn:Mg:W:Zn = 15:32:21:32 | 33 | $ZrO_2$ | 10 |
| Example 12-2 | $(In_2O_3)_{12}(ZrO_2)_{88}$ | 5 | Mn:Mg:W:Zn = 15:32:21:32 | 33 | $(In_2O_3)_{12}(ZrO_2)_{88}$ | 10 |

TABLE 8-continued

| Sample No. | Dielectric layer on substrate side | | Recording layer | | Dielectric layer on optically transparent layer side | |
|---|---|---|---|---|---|---|
| | Component ratio [mol %] | Thickness [nm] | Composition [at %] | | Component ratio [mol %] | Thickness [nm] |
| Example 12-3 | $(In_2O_3)_{28}(ZrO_2)_{72}$ | 5 | Mn:Mg:W:Zn = 15:32:21:32 | 33 | $(In_2O_3)_{28}(ZrO_2)_{72}$ | 10 |
| Example 12-4 | $(In_2O_3)_{46}(ZrO_2)_{54}$ | 5 | Mn:Mg:W:Zn = 15:32:21:32 | 33 | $(In_2O_3)_{46}(ZrO_2)_{54}$ | 10 |
| Example 12-5 | $(In_2O_3)_{70}(ZrO_2)_{30}$ | 5 | Mn:Mg:W:Zn = 15:32:21:32 | 33 | $(In_2O_3)_{70}(ZrO_2)_{30}$ | 10 |

Table 9 shows the features of the optical disks of Comparative Examples 2-1 to 2-5.

TABLE 9

| Sample No. | Dielectric layer on substrate side | | Recording layer | | Dielectric layer on optically transparent layer side | |
|---|---|---|---|---|---|---|
| | Component ratio [mol %] | Thickness [nm] | Composition [at %] | Thickness [nm] | Composition [mol %] | Thickness [nm] |
| Example 2-1 | $ZrO_2$ | 5 | Pb:W:Zn = 26:30:44 | 33 | $ZrO_2$ | 10 |
| Example 2-2 | $(In_2O_3)_{12}(ZrO_2)_{88}$ | 5 | Pb:W:Zn = 26:30:44 | 33 | $(In_2O_3)_{12}(ZrO_2)_{88}$ | 10 |
| Example 2-3 | $(In_2O_3)_{28}(ZrO_2)_{72}$ | 5 | Pb:W:Zn = 26:30:44 | 33 | $(In_2O_3)_{28}(ZrO_2)_{72}$ | 10 |
| Example 2-4 | $(In_2O_3)_{46}(ZrO_2)_{54}$ | 5 | Pb:W:Zn = 26:30:44 | 33 | $(In_2O_3)_{46}(ZrO_2)_{54}$ | 10 |
| Example 2-5 | $(In_2O_3)_{70}(ZrO_2)_{30}$ | 5 | Mn:W:Zn = 26:30:44 | 33 | $(In_2O_3)_{70}(ZrO_2)_{30}$ | 10 |

(Initial, Archival, and Shelf Characteristics)

The initial, archival, and shelf characteristics of the optical disks of Examples 12-1 to 12-5 and Comparative Examples 2-1 and 2-5 obtained as described above were evaluated in the same way as for the optical disks of Examples 6-1 and 7-1 to 7-11. FIGS. 33A to 36B show the results.

FIGS. 33A to 34B are graphs showing the results of evaluation of the initial, archival, and shelf characteristics of the optical disks of Examples 12-1 to 12-5. FIGS. 35A to 36B are graphs showing the results of evaluation of the initial, archival, and shelf characteristics of the optical disks of Comparative Examples 2-1 to 2-5. These evaluation results show the following.

When the Mn-based recording material is used, the addition of $In_2O_3$ to $ZrO_2$ tends to improve the archival and shelf characteristics. The degree of the improvement of the characteristics depends on the amount of added $In_2O_3$. Also when the Pd-based recording material is used, the addition of $In_2O_3$ to $ZrO_2$ is effective in improving the archival and shelf characteristics. However, when the Pd-based recording material is used, it is difficult to achieve both good archival characteristics and good shelf characteristics together in contrast to the case where the Mn-based recording material is used.

When the Mn-based recording material is used, the addition of $In_2O_3$ to $ZrO_2$ causes almost no change in the initial characteristics (see FIGS. 33A and 33B). When the Pd-based recording material is used, however, the addition of $In_2O_3$ to $ZrO_2$ tends to reduce the initial characteristics (see FIGS. 35A and 35B).

The difference in the characteristics is easy to see when the two types of optical disks prepared using the different recording materials are compared with respect to the change in the i-MLSE at or around the position Pw/Pwo=0.9 before and after the test. Regarding the optical disk to which $In_2O_3$ is added at 12 mol % or 28 mol %, the difference in the characteristics is significant and particularly easy to see (FIGS. 33B, 33C, 35B, and 35C).

All these results show that the use of a combination of the Mn-based recording material and $In_2O_3$—$ZrO_2$ makes it possible to achieve good archival characteristics and good shelf characteristics at the same time. When $In_2O_3$—$ZrO_2$ is used in combination with a material other than the Mn-based recording material, it is difficult to make both characteristic good.

In order to achieve good archival characteristics and good shelf characteristics at the same time, it is preferable to use the Mn-based recording material in combination with $In_2O_3$—$ZrO_2$.

<4-1. Addition of Ru to Recording Layer>

Examples 13-1 to 13-4

First, a 1.1-mm-thick polycarbonate substrate was formed by injection molding. A concave-convex surface having in- and on-grooves was formed on the polycarbonate substrate, in which the track pitch was set at 0.32 μm. Next, a dielectric layer (substrate side), a Mn—Ru-based recording layer, and a dielectric layer (optically transparent layer side) were sequentially deposited on the concave-convex surface of the polycarbonate substrate by sputtering. The specific features of each layer were as follows.

Dielectric Layer (Substrate Side)
Material: ITO, thickness: 15 nm
Mn-Based Recording Layer
Material: Mn—W—Zn—Ru—O, thickness: 30 nm
Dielectric Layer (Optically Transparent Layer Side)
Material: $SiO_2$—$In_2O_3$—$ZrO_2$ (SIZ), thickness: 20 nm The Mn—Ru-based recording layer was formed as follows. Under an atmosphere of a mixed gas of Ar and $O_2$, Mn, W, Zn, and Ru targets were co-sputtered to form the film. In the deposition process, the ratio between the flow rates of Ar and $O_2$ gases was controlled in such a way that the mixed gas atmosphere had a higher oxygen concentration.

Specific conditions for forming the Mn-based recording layer were as shown below.
Ar gas flow rate: 10 to 15 sccm
$O_2$ gas flow rate: 15 to 24 sccm
Applied power: 100 to 200 W In addition, the deposition conditions were controlled in such a way that A:B was 70:30, wherein A is the total content of W and Zn (A=W+Zn (at %)) in the Mn—Ru-based recording layer, and B is the total content of Mn and Ru (B=Mn+Ru) in the Mn—Ru-based recording layer.

The deposition conditions were also controlled in such a way that the ratio of the amount of Ru to the total amount of Mn and Ru (=[Ru/(Mn+Ru)]×100) was 0 at %, 32 at %, 55 at %, or 73 at % as shown in Table 10.

Next, an ultraviolet-curable resin was uniformly applied to the dielectric layer by spin coating. The resin was then cured by being irradiated with ultraviolet rays, so that a 75-μm-thick optically transparent layer was formed on the dielectric layer.

In this way, an optical disk with a recording capacity of 33.4 GB was obtained.

Examples 14-1 to 14-4

Optical disks were obtained as in Examples 13-1 to 13-4, except that ITO was used to form the dielectric layer on the optically transparent layer side.

(Features of Optical Disks)
Table 10 shows the features of the optical disks of Examples 13-1 to 13-4 and Examples 14-1 to 14-4.

(Initial Characteristics)
The initial characteristics were evaluated as in Examples 1-1 and 1-2. The results are shown in FIG. 38A (the SIZ dielectric layer on the optically transparent layer side) and FIG. 38B (the ITO dielectric layer on the optically transparent layer side).

The power margin Δ (Pw/Pwo) of the region under 13.5% i-MLSE was also determined. A graph was then prepared by plotting each resulting power margin Δ (Pw/Pwo). FIG. 38C shows the results. In the graph of FIG. 38C, the vertical axis represents the power margin Δ (Pw/Pwo), and the horizontal axis represents the Ru ratio (=[Ru/(Mn+Ru)]×100 (at %)). Note that in FIG. 38C, the power margin Δ (Pw/Pwo) is alternatively expressed in units of percentage.

FIGS. 38A to 38C show the following.
As the Ru ratio increases, the power margin tends to increase. For example, when the Ru ratio is 30 at %, the power margin is about 8% greater than that when Ru is not added.

Such a power margin-improving effect does not depend on the material of the dielectric layer provided adjacent to the Mn—Ru-based recording layer.

TABLE 10

| Sample No. | Dielectric layer on substrate side | | Recording layer | | Dielectric layer on optically transparent layer side | |
|---|---|---|---|---|---|---|
| | Component ratio [mol %] | Thickness [nm] | Composition [at %] | Thickness [nm] | Composition [mol %] | Thickness [nm] |
| Sample no. | ITO | 15 | Mn—W—Zn—O | 0 | SIZ | 20 |
| Example 13-1 | ITO | 15 | Mn—W—Zn—Ru—O | 32 | SIZ | 20 |
| Example 13-2 | ITO | 15 | Mn—W—Zn—Ru—O | 55 | SIZ | 20 |
| Example 13-3 | ITO | 15 | Mn—W—Zn—Ru—O | 73 | SIZ | 20 |
| Example 13-4 | ITO | 15 | Mn—W—Zn—O | 0 | ITO | 20 |
| Example 14-1 | ITO | 15 | Mn—W—Zn—Ru—O | 32 | ITO | 20 |
| Example 14-2 | ITO | 15 | Mn—W—Zn—Ru—O | 55 | ITO | 20 |
| Example 14-3 | ITO | 15 | Mn—W—Zn—Ru—O | 73 | ITO | 20 |

Figure 37:
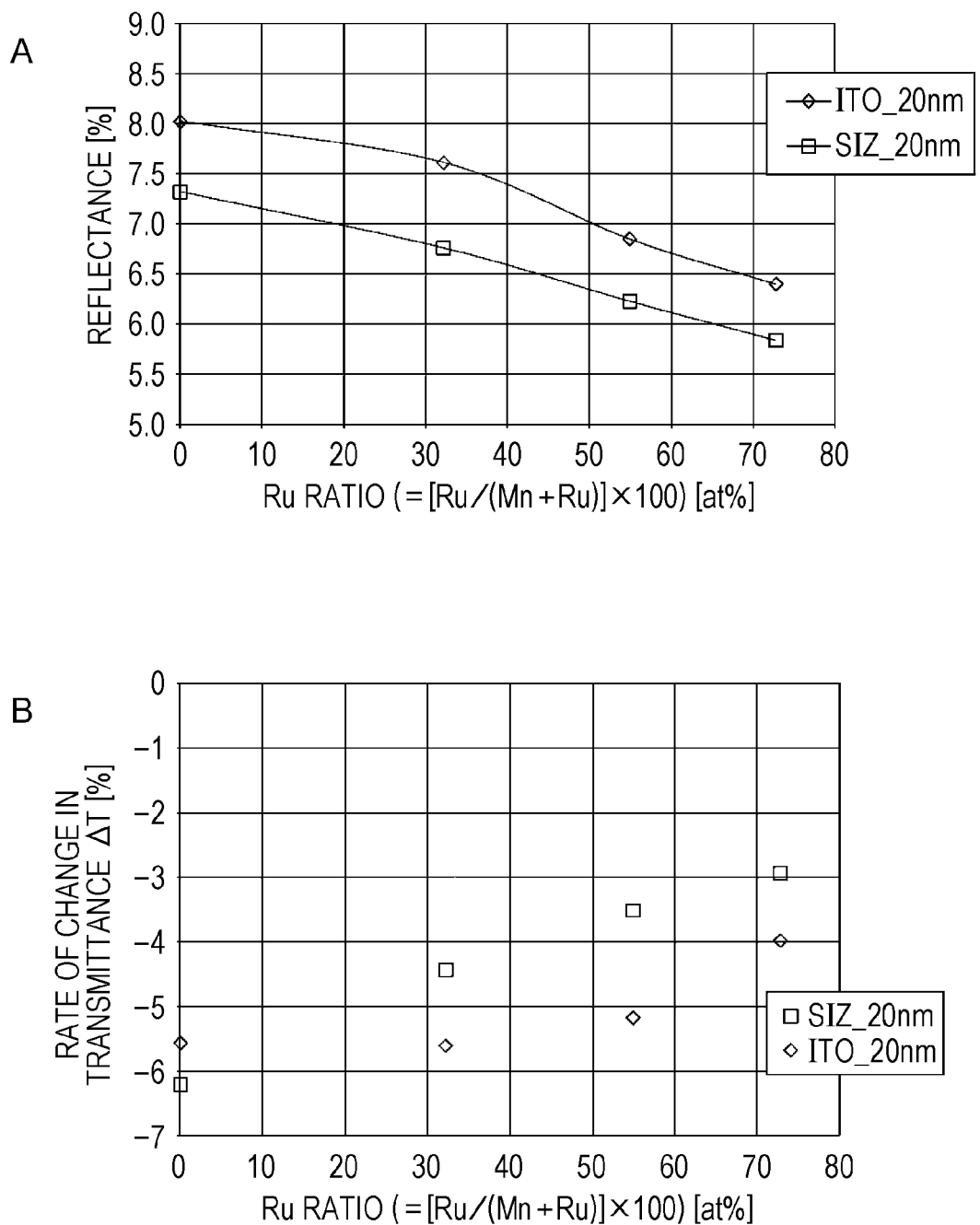
FIG. 37A is a graph showing the results of evaluation of the reflectance of optical disks of Examples 13-1 to 13-4 and 14-1 to 14-4.
FIG. 37B is a graph showing the results of evaluation of the rate of change in the transmittance of optical disks of Examples 13-1 to 13-4 and 14-1 to 14-4.

(Evaluation of Optical Disks)
The optical disks of Examples 13-1 to 13-4 and 14-1 to 14-4 obtained as described above were evaluated as described below. The evaluation conditions were as follows.
Signal processing method: PR12221ML
Disk rotation speed (linear velocity): 7.38 m/sec (double speed)
Read power (Read Pw): 1.0 mW
(Reflectance)
The reflectance was evaluated as described below. First, RF signals from the optical disk in the initial state (unrecorded state) were measured using a BD evaluation system. Next, the RF signals were compared with the RF signals from a known optical disk with a known reflectance when the reflectance of the optical disk was determined. FIG. 37A shows the results. It is apparent from FIG. 37A that as the Ru ratio increases, the reflectance tends to decrease.

(Rate of Change in Reflectance)
First, the transmittance $T_{ini}$ of the optical disk in the initial state (unrecorded state) was determined using a spectroscopic ellipsometer. Subsequently, after information signals were recorded on the optical disk, the transmittance $T_{rec}$ of the optical disk in the recorded state was determined using the spectroscopic ellipsometer. The rate ΔT of change in the transmittance was then calculated from the formula below. FIG. 37B shows the results.

$\Delta T = \{(T_{ini}-T_{rec})/T_{ini}\} \times 100(\%)$

FIG. 37B shows that as the Ru ratio increases, the change in the transmittance before and after the information signal recording tends to decrease.

(Initial Modulation)
The modulation $Mod_{ini}$ of the optical disks (Examples 14-1 to 14-3) in the initial state was determined using a BD evaluation system. FIG. 39A shows the results.

It is apparent from FIG. 39A that if the Ru ratio is 70 at % or less, the modulation $Mod_{ini}$ can be at least 40% of the standard value. The BD-XL standard requires the value to be 40% or more of the standard value.

(Rate of Change in Modulation)
An acceleration test (shelf test) was performed in which the optical disks (Examples 14-1 to 14-4) in the initial state (unrecorded state) were stored in a hot environment at 80° C. and 85% for 120 hours. Subsequently, the modulation $Mod_{shelf}$ of the optical disks after the acceleration test was determined using the BD evaluation system. The rate Δ Mod of change in the modulation wad calculated from the formula below. FIG. 39B shows the results.

$\Delta Mod = [(Mod_{ini}-Mod_{shelf})/Mod_{ini}] \times 100(\%)$

It is apparent from FIG. 39B that if the Ru ratio is 60 at % or less, the rate Δ Mod of change in the modulation can be reduced to 10% or less. It is generally known that a rate Δ Mod of change in modulation of up to 10% is acceptable on the drive side.

Therefore, the rate of the amount of Ru to the total amount of Mn and Ru (=[Ru/(Mn+Ru)]×100) is preferably 70 at % or less, more preferably 60 at % or less.

The present technique has been described specifically with reference to embodiments. It will be understood that the above embodiments are not intended to limit the present technique and that various modifications thereof may be made based on the present technical idea.

For example, the structures, methods, steps, shapes, materials, numerical values, and other features described in connection with the above embodiments are by way of example only, and may be changed or modified as needed.

In addition, any combination of the structures, methods, steps, shapes, materials, numerical values, and other features described in connection with the above embodiments is also possible within the spirit and scope of the present technique.

In the above embodiments, the present technique is used for optical information recording media that include a substrate, and one or more information signal layers and an optically transparent layer stacked in this order on the substrate so that a laser beam can be applied from the optically transparent layer side to the information signal layer or layers to record or reproduce information signals. Such embodiments are not intended to limit the present technique. Alternatively, for example, the present technique may be used for optical information recording media that include a substrate, and one or more information signal layers and a protective layer stacked in this order on the substrate so that a laser beam can be applied from the substrate side to the information signal layer or layers to record or reproduce information signals, and the present technique may also be used for optical information recording media that include two substrates and one or more information signal layers provided between the substrates so that a laser beam can be applied from at least one of the two substrate sides to the information signal layer or layers to record or reproduce information signals.

When a recording layer having a multilayer structure is formed, the recording layer according to the present technique may be used in combination with a recording layer of a type other than the write-once type. The present technique may also be used for optical information recording media having, in their partial area, a recording region including reproduction-only pits or the like.

The present technique may have the following features.

(1)

An information recording medium including: a recording layer including an oxide of Mn, wherein Mn atoms in the oxide of Mn are partially or fully present as Mn with a valence of +4.

(2)

The information recording medium according to (1), wherein the recording layer further includes an oxide of a metal other than Mn, and the metal is at least one selected from the group consisting of Sn, Zn, Bi, Ge, Co, W, Cu, and Al.

(3)

The information recording medium according to (1) or (2), wherein the recording layer includes a first recording layer and a second recording layer, and the first and second recording layers have different material compositions.

(4)

The information recording medium according to any of (1) to (3) further including a dielectric layer provided on at least one surface of the recording layer.

(5)

The information recording medium according to (4), wherein the dielectric layer includes at least one selected from the group consisting of an oxide, a nitride, a sulfide, a carbide, and a fluoride.

(6)

The information recording medium according to any of (1) to (5), wherein the recording layer includes $MnO_2$ as a main component.

(7)

The information recording medium according to any of (1) to (5), wherein the recording layer includes, as main components, $MnO_2$ and an oxide of at least one metal element selected from the group consisting of Sn, Zn, Bi, Ge, Co, W, Cu, and Al.

(8)

The information recording medium according to any of (1) to (7), wherein the recording layer further includes an oxide of Mg.

(9)

The information recording medium according to (8), wherein the recording layer includes 5 mol % to 50 mol % of the oxide of Mg.

(10)

The information recording medium according to any of (1) to (7), wherein the recording layer further includes an oxide of at least one metal element selected from the group consisting of Mg, Mo, Si, and Te.

(11)

The information recording medium according to (10), wherein the recording layer includes 5 mol % to 50 mol % of the oxide of the metal element.

(12)

The information recording medium according to any of (1) to (7), wherein the recording layer further includes Ru.

(13)

The information recording medium according to (12), wherein the ratio of the amount of Ru to the total amount of Mn and Ru is at most 70 at %.

(14)

The information recording medium according to any of (1) to (3) and (6) to (13), further including: a first dielectric layer provided on one surface of the recording layer; and a second dielectric layer provided on another surface of the recording layer, wherein the first and second dielectric layers include an oxide of In and an oxide of Zr.

(15)

The information recording medium according to (14), wherein the first and second dielectric layers consist essentially of an oxide of In and an oxide of Zr.

(16)

The information recording medium according to (14), wherein the molar ratio of the amount B of the oxide of Zr to the total amount A of the oxide of In and the oxide of Zr ((B/A)×100) is in the range of 52 mol % to 76 mol %.

(17)

The information recording medium according to any of (1) to (3) and (6) to (13), further including: a first dielectric layer provided on a light-receiving surface of the recording layer; and a second dielectric layer provided on another surface opposite to the light-receiving surface, wherein the first dielectric layer includes an oxide of Zr, and the second dielectric layer includes an oxide of In and an oxide of Zr.

(18)

An information recording medium including: a plurality of recording layers, wherein at least one of the plurality of recording layers includes an oxide of Mn, and Mn atoms in the oxide of Mn are partially or fully present as Mn with a valence of +4.

(19)

A recording layer including: an oxide of Mn, wherein Mn atoms in the oxide of Mn are partially or fully present as Mn with a valence of +4.

(20)

A target for use in manufacturing an information recording medium, the target including: an oxide of Mn, wherein the oxide of Mn is partially or fully present as an oxide of Mn with a valence of less than +4.

(21)

The target for use in manufacturing the information recording medium according to (20), wherein the oxide of Mn with a valence of less than +4 is $Mn_3O_4$.

(22)

The target for use in manufacturing the information recording medium according to (20) further including Mg or an oxide of Mg.

(23)

The target for use in manufacturing the information recording medium according to (20) further including at least one metal element selected from the group consisting of Mg, Mo, Si, and Te, or an oxide of the metal element.

(24)

The target for use in manufacturing the information recording medium according to (20) further including a metal other than Mn or an oxide of the metal, wherein the metal is at least one selected from the group consisting of Sn, Zn, Bi, Ge, Co, W, Cu, and Al.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

REFERENCE SIGNS LIST

11 Substrate
12 Optically transparent layer
10, 20 Optical information recording medium
21 Recording layer
22, 23 Dielectric layer
L, L0 to Ln Information signal layer
S1 to Sn Intermediate layer
Gin In-groove
Gon On-groove
C Light-receiving surface

The invention claimed is:

1. An information recording medium comprising: a recording layer comprising an oxide of Mn, wherein Mn atoms in the oxide of Mn are partially or fully present as Mn with a valence of +4,
wherein the recording layer further includes an oxide of Mg.

2. The information recording medium according to claim 1, wherein the recording layer further comprises an oxide of a metal, and the metal is at least one selected from the group consisting of Sn, Zn, Bi, Ge, Co, W, Cu, and Al.

3. The information recording medium according to claim 1, wherein the recording layer comprises a first recording layer and a second recording layer, and the first and second recording layers have different material compositions.

4. The information recording medium according to claim 1 further comprising a dielectric layer provided on at least one surface of the recording layer.

5. The information recording medium according to claim 4, wherein the dielectric layer comprises at least one selected from the group consisting of an oxide, a nitride, a sulfide, a carbide, and a fluoride.

6. The information recording medium according to claim 1, wherein the recording layer comprises $MnO_2$ as a main component.

7. The information recording medium according to claim 1, wherein the recording layer comprises, as main components, $MnO_2$ and an oxide of at least one metal element selected from the group consisting of Sn, Zn, Bi, Ge, Co, W, Cu, and Al.

8. The information recording medium according to claim 1, wherein the recording layer comprises 5 mol % to 50 mol % of the oxide of Mg.

9. The information recording medium according to claim 1, wherein the recording layer further comprises an oxide of at least one metal element selected from the group consisting of Mg, Mo, Si, and Te.

10. The information recording medium according to claim 1, wherein the recording layer further comprises Ru.

11. The information recording medium according to claim 10, wherein the ratio of the amount of Ru to the total amount of Mn and Ru is at most 70 at %.

12. The information recording medium according to claim 1 further comprising: a first dielectric layer provided on a first surface of the recording layer; and a second dielectric layer provided on a second surface of the recording layer, wherein the first and second dielectric layers comprise an oxide of In and an oxide of Zr.

13. The information recording medium according to claim 12, wherein the molar ratio of the amount B of the oxide of Zr to the total amount A of the oxide of In and the oxide of Zr ((B/A)×100) is in the range of 52 mol % to 76 mol %.

14. The information recording medium according to claim 1 further comprising: a first dielectric layer provided on a light-receiving surface of the recording layer; and a second dielectric layer provided on another surface opposite to the light-receiving surface, wherein the first dielectric layer comprises an oxide of Zr, and the second dielectric layer comprises an oxide of In and an oxide of Zr.

15. An information recording medium comprising: a plurality of recording layers, wherein at least one of the plurality of recording layers comprises an oxide of Mn, and Mn atoms in the oxide of Mn are partially or fully present as Mn with a valence of +4,
wherein at least one of the recording layers further includes an oxide of Mg.

16. A recording layer comprising: an oxide of Mn, wherein Mn atoms in the oxide of Mn are partially or fully present as Mn with a valence of +4,
wherein the recording layer further includes an oxide of Mg.

17. A target for use in manufacturing an information recording medium, the target comprising: an oxide of Mn, wherein the oxide of Mn is partially or fully present as an oxide of Mn with a valence of less than +4,
wherein the target further includes Mg or an oxide of Mg.

18. The target for use in manufacturing the information recording medium according to claim 17, wherein the oxide of Mn with a valence of less than +4 is $Mn_3O_4$.

19. The target for use in manufacturing the information recording medium according to claim 17 further comprising at least one metal element selected from the group consisting of Mg, Mo, Si, and Te, or an oxide of the metal element.

20. The target for use in manufacturing the information recording medium according to claim 17 further comprising a metal other than Mn or an oxide of the metal, wherein the metal is at least one selected from the group consisting of Sn, Zn, Bi, Ge, Co, W, Cu, and Al.

21. An information recording medium comprising: a recording layer comprising an oxide of Mn, wherein Mn atoms in the oxide of Mn are partially or fully present as Mn with a valence of +4,
   wherein the recording layer further comprises an oxide of at least one metal element selected from the group consisting of Mg, Mo, Si, and Te.

22. An information recording medium comprising: a recording layer comprising an oxide of Mn, wherein Mn atoms in the oxide of Mn are partially or fully present as Mn with a valence of +4,
   wherein the recording layer further comprises Ru.

23. The information recording medium according to claim 22, wherein the ratio of the amount of Ru to the total amount of Mn and Ru is at most 70 at %.

24. An information recording medium comprising: a recording layer comprising an oxide of Mn, wherein Mn atoms in the oxide of Mn are partially or fully present as Mn with a valence of +4,
   wherein the information recording medium further comprising a first dielectric layer provided on a first surface of the recording layer and a second dielectric layer provided on a second surface of the recording layer, wherein the first and second dielectric layers comprise an oxide of In and an oxide of Zr.

25. The information recording medium according to claim 24, wherein the molar ratio of the amount B of the oxide of Zr to the total amount A of the oxide of In and the oxide of Zr ((B/A)×100) is in the range of 52 mol % to 76 mol %.

26. An information recording medium comprising: a recording layer comprising an oxide of Mn, wherein Mn atoms in the oxide of Mn are partially or fully present as Mn with a valence of +4,
   wherein the information recording medium further comprising a first dielectric layer provided on a light-receiving surface of the recording layer; and a second dielectric layer provided on another surface opposite to the light-receiving surface, wherein the first dielectric layer comprises an oxide of Zr, and the second dielectric layer comprises an oxide of In and an oxide of Zr.

27. A target for use in manufacturing an information recording medium, the target comprising: an oxide of Mn, wherein the oxide of Mn is partially or fully present as an oxide of Mn with a valence of less than +4,
   wherein the target further includes a metal or an oxide of the metal, and wherein the metal is at least one selected from the group consisting of Sn, Zn, Bi, Ge, Co, W, Cu, and Al.

* * * * *